(12) United States Patent
Kuwajima

(10) Patent No.: US 7,973,246 B2
(45) Date of Patent: Jul. 5, 2011

(54) ELECTRONIC COMPONENT

(75) Inventor: Hajime Kuwajima, Tokyo (JP)

(73) Assignee: TDK Corporation, Tokyo (JP)

( * ) Notice: Subject to any disclaimer, the term of this patent is extended or adjusted under 35 U.S.C. 154(b) by 1062 days.

(21) Appl. No.: 11/790,232

(22) Filed: Apr. 24, 2007

(65) Prior Publication Data

US 2007/0253144 A1 Nov. 1, 2007

(30) Foreign Application Priority Data

May 1, 2006 (JP) ................................ 2006-127842

(51) Int. Cl.
*H05K 1/11* (2006.01)
*H05K 3/02* (2006.01)
*H05K 3/10* (2006.01)

(52) U.S. Cl. ........................ 174/261; 29/846; 361/765

(58) Field of Classification Search ................ 361/761, 361/763, 765; 174/261; 29/846
See application file for complete search history.

(56) References Cited

U.S. PATENT DOCUMENTS

| | | | |
|---|---|---|---|
| 6,166,424 A | 12/2000 | Mikawa et al. | |
| 6,239,460 B1 | 5/2001 | Kuroiwa et al. | |
| 6,278,153 B1 | 8/2001 | Kikuchi et al. | |
| 6,552,384 B2 | 4/2003 | Murata et al. | |
| 6,562,677 B1 | 5/2003 | Mikawa et al. | |
| 6,818,469 B2 * | 11/2004 | Mori et al. | 438/52 |
| 6,818,498 B2 | 11/2004 | Mikawa et al. | |

FOREIGN PATENT DOCUMENTS

| | | |
|---|---|---|
| JP | A 06-089831 | 3/1994 |
| JP | A-06-181119 | 6/1994 |
| JP | A 09-017973 | 1/1997 |
| JP | A 10-135077 | 5/1998 |
| JP | A 11-097635 | 4/1999 |
| JP | A 2000-223362 | 8/2000 |
| JP | A-2000-323345 | 11/2000 |
| JP | B2 3193973 | 6/2001 |
| JP | A 2002-25854 | 1/2002 |
| JP | A 2002-33559 | 1/2002 |
| JP | A 2003-17366 | 1/2003 |
| JP | A 2004-56097 | 2/2004 |
| JP | A 2005-033103 | 2/2005 |
| JP | A 2005-136074 | 5/2005 |

* cited by examiner

*Primary Examiner* — Jeremy C Norris
(74) *Attorney, Agent, or Firm* — Oliff & Berridge, PLC

(57) ABSTRACT

The invention is to provide an electronic component which can obtain the capacitance value of a capacitor element highly precisely. An electronic component has a lower conductor (first conductor) which is formed on a planarized layer of a substrate, a dielectric film which is formed on the lower conductor, and an upper conductor (second conductor) which is formed on the dielectric film and thinner than the lower conductor. A capacitor element (capacitative element) is configured of the lower conductor, the dielectric film and the upper conductor.

16 Claims, 36 Drawing Sheets

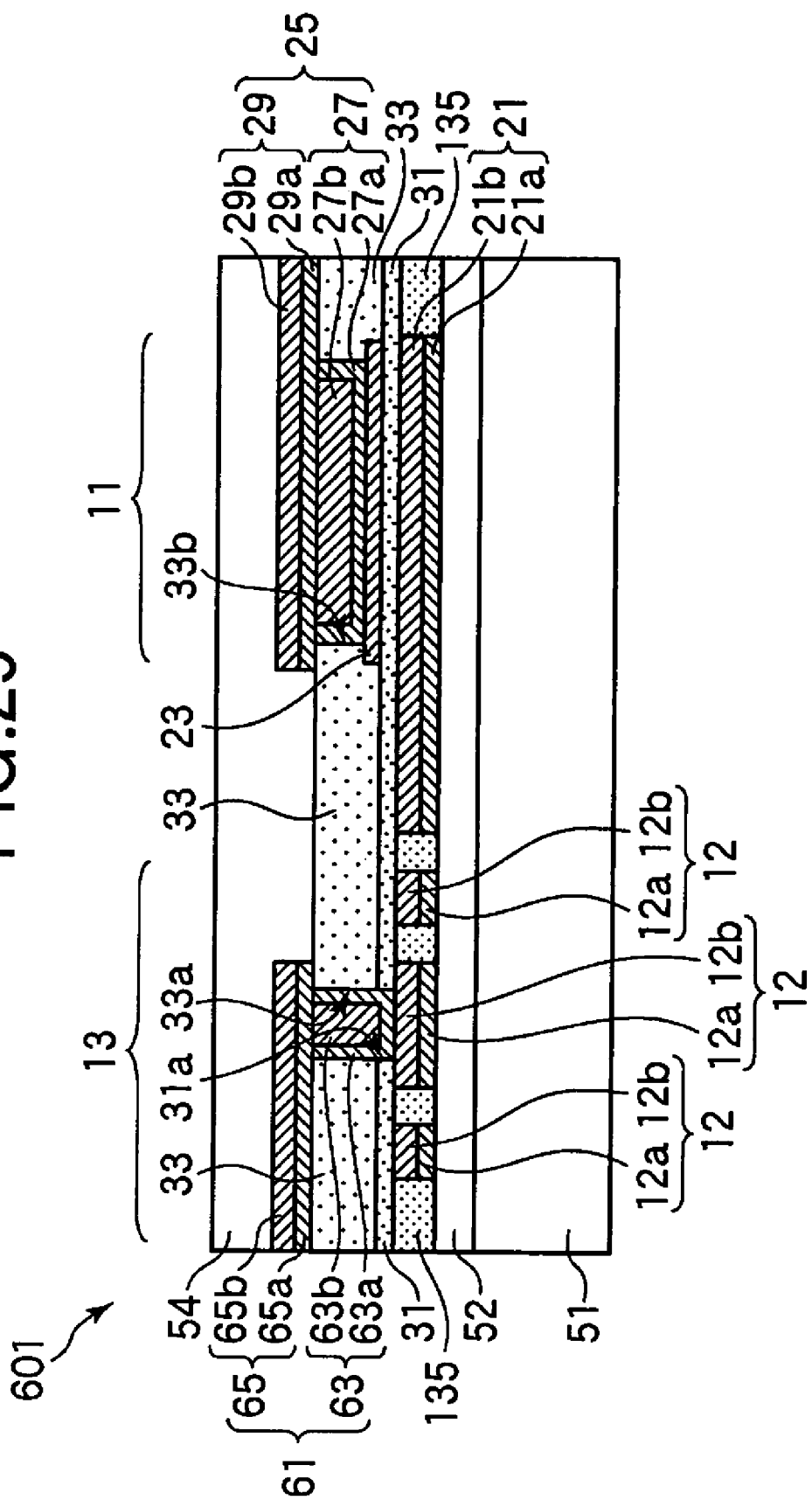

ELECTRONIC COMPONENT

BACKGROUND OF THE INVENTION

1. Field of the Invention

The present invention relates to an electronic component having a capacitor element.

2. Description of the Related Art

On an internal circuit of electronic appliances such as a personal computer and a cellular telephone, various surface mount electronic components are mounted. For the surface mount electronic component, thin film electronic components are known that are formed using thin film formation technique.

For thin film electronic components, a thin film capacitor, a thin film inductor, a thin film LC composite component, a thin film lumped constant device, a thin film distributed constant device and a thin film multilayer composite component are named. In addition, for composite components having a capacitor, a low pass filter (LPF), a high pass filter (HPF), a bandpass filter (BPF) which passes only signals in a predetermined frequency range and attenuates signals in the other frequency ranges, a trap filter which removes signals in a predetermined frequency range, and so on are named. In addition, for the other electronic components that combine them, a diplexer, a duplexer, an antenna switch module, an RF module and so on are named.

For electronic components for use in frequencies of 500 MHz or above, particularly for high frequencies of microwave frequency bands (GHz bands), it is demanded to realize reductions in size, thickness and costs. With regard to the thin film electronic components having a capacitor element, reductions in the electrode area and the number of layers of dielectric films of the capacitor element greatly affect reductions in size, thickness, and costs and the realization of high frequency of the electronic component. In the capacitor element for use in high frequencies, a dielectric film of a high dielectric material is used, or the film thickness of the dielectric film is decreased to intend the reduction in the electrode area of the capacitor element and to intend reductions in size, thickness, and costs and the realization of high capacitance. Moreover, the dielectric film is multilayered to intend the realization of high capacitance of the capacitor element.

FIGS. 35A and 35B show the schematic configuration of a conventional thin film capacitor element 411. FIG. 35A shows a plan view depicting the capacitor element 411, and FIG. 35B shows a diagram depicting a cross section cut at line A-A shown in FIG. 35A. As shown in FIGS. 35A and 35B, the capacitor element 411 has a lower conductor 421 which is formed on a substrate 51, a dielectric film 431 which is formed on the lower conductor 421, and an upper conductor 423 which is formed on the dielectric film 431. Portions of the lower conductor 421 and the upper conductor 423 function as the electrodes of the capacitor element 411.

The capacitance value of the capacitor element 411 is defined by an area (electrode area) that the upper conductor 423 and the lower conductor 421 are faced to each other, and a film thickness d and the dielectric constant of the dielectric film 431. The electrode area that is one factor defining the capacitance value of the capacitor element 411 is defined by an area $l_1 \times l_2$ of the dielectric film 431, the area is sandwiched between the lower conductor 421 and the upper conductor 423.

The dielectric film 431 covers the top and the end part of the lower conductor 421. The film thickness of the dielectric film 431 tends to be thinner at the end part of the lower conductor 421 (in FIG. 35B, the film thickness f) than the top of the lower conductor 421 (in FIG. 35B, the film thickness d). When the dielectric film 431 is formed in a thin film, at the end part of the lower conductor 421, the dielectric film 431 might not be formed on the lower conductor 421. Thus, the insulating properties between the lower conductor 421 and the upper conductor 423 are not sufficiently obtained at the end part of the lower conductor 421, and short circuit defects tend to occur. Therefore, a problem arises that the breakdown limit of the withstand voltage of the capacitor element 411 drops to cause the unstable quality between products against electric power. Short circuit defects and a reduction in the breakdown limit of the withstand voltage tend to occur when the film thickness d of the dielectric film 431 is thinner than the thickness of the lower conductor 421 and the upper conductor 423, and when the end part shape of the lower conductor 421 is in a reverse taper.

Therefore, in the capacitor element 411, a material of high insulating properties is used for the dielectric film 431, or the film thickness d of the dielectric film 431 is thickened to intend the improvement of dielectric voltage. However, when the film thickness d of the dielectric film 431 is thickened, it is necessary to increase the electrode area $l_1 \times l_2$ of the capacitor element 411 in order to obtain high capacitance, causing another problem that it is difficult to reduce the size of the electronic component having the capacitor element 411.

In addition, the accuracy of the capacitance value of the capacitor element 411 is affected by the accuracy of the relative positions between the lower conductor 421 and the upper conductor 423, the accuracy of the shape of the lower conductor 421 or the upper conductor 423, the accuracy of the film thickness and the dielectric constant of the dielectric film 431, the surface roughness of the lower conductor 421 and the upper conductor 423, etc.

However, the capacitor element 411 has a problem that when it is reduced in size, the accuracy of the relative positions between the lower conductor 421 and the upper conductor 423 drops, and it is difficult to obtain the capacitance value highly accurately. Moreover, in order to consider equivalent series resistance (ESR) and parasitic inductance, in the cases in which the set film thickness of the lower conductor 421 is thick, and in which the wiring length of the lower conductor 421 is long, the capacitance value of the capacitance formed between the end part of the lower conductor 421 and the upper conductor 423 becomes large, and the unevenness of the film thickness f of the dielectric film 431 covering the end part of the lower conductor 421 adversely affects a desired capacitance value.

In addition, in the electronic component having the capacitor, the circuit layout is adjusted so that the distance between the conductor of the capacitor element 411 and the terminal is reduced and a lead conductor that connects the capacitor element 411 to the circuit device adjacent to the capacitor element 411 is shortened, whereby it is intended to reduce parasitic inductance and stray capacitance.

However, since a part of the lead conductor contacts with the dielectric film 431, the capacitance value of the capacitor element 411 is different from the design value when the positions of forming the lower conductor 421 and the upper conductor 423 are shifted. In order to reduce a shift of the capacitance value of the capacitor from the design value, for example, the width of the lead conductor is formed narrow. Since the width of the lead conductor is formed narrow to increase parasitic inductance, problems arise that the high frequency characteristics of the electronic component are degraded, and that the transmission loss becomes large.

FIG. 36 shows a cross section depicting a thin film capacitor element 1011 disclosed in Patent Reference 1. As shown in FIG. 36, the thin film capacitor element 1011 has a lower electrode 1021 and a dielectric layer 1031 in turn laminated on a substrate 51 in which the rim part of the dielectric layer 1031 is covered with an insulating layer 1033 having an aperture 1033a, and an upper electrode 1023 formed on the insulating layer 1033 is laminated on the dielectric layer 1031 in the aperture 1033a. With this configuration, since the insulating layer 1033 covering the rim part of the dielectric layer 1031 surely insulates the lower electrode 1021 from the upper electrode 1023, drops and fluctuations in the breakdown voltage caused by the coverage defect of the dielectric layer 1031 can be surely prevented. In addition, since the aperture of the insulating layer 1033 defines the capacitance value of the capacitor, the variations in the capacitance value can be decreased regardless of the accuracy of the size and alignment of the lower electrode 1021 with the upper electrode 1023.

However, in the thin film capacitor element 1011 disclosed in Patent Reference 1, since the upper electrode 1023 is also formed in the same layer as the lower electrode 1021 and faced thereto through the insulating layer 1033, parasitic capacitance (stray capacitance) occurs between the side part of the lower electrode 1021 and the upper electrode 1023. Since the insulating layer 1033 becomes thinner as the thin film capacitor element 1011 is reduced in size, the ratio of the parasitic capacitance to the capacitance value of the thin film capacitor element 1011 becomes large. In addition, since the insulating layer 1033 has a shape that protrudes toward the surface of the substrate 51, it is difficult to form the thin film capacitor element 1011 in the layered structure. Moreover, since the circuit device such as an inductor element cannot be formed near the thin film capacitor element 1011, it is difficult to intend to reduce the size of a composite component having a plurality of circuit devices.

A capacitor element which solves the problems described above is proposed by the inventors (Japanese Patent Application No. 2005-333108). FIG. 37 shows a cross section depicting a capacitor element 611 proposed by the inventors. The capacitor element 611 has a lower conductor 21 which is formed on a substrate 51, a dielectric film 31 which is formed to cover the substrate 51 and the lower conductor 21, an insulating film 33 which is formed on the dielectric film 31, and an upper conductor 623 which is formed over an opening 33b that is formed in the insulating film 33 on the lower conductor 21 and which configures a capacitor element 611 with the lower conductor 21 and the dielectric film 31. The opening 33b has such a square shape that for example, the length of one side is l when the substrate 51 is seen in the normal direction of the substrate surface. The upper conductor 623 has a column shaped conductor part which is formed in the opening 33b, and a lead conductor part which is formed on the insulating film 33 to connect the upper conductor 623 to the other circuit devices such as an inductor element or an external electrode (not shown).

The upper conductor 623 is extended over from the opening 33b to the insulating film 33, which is not formed in the same layer as the lower conductor 21. Thus, even though the film thickness of the dielectric film 31 is thin at the end part of the lower conductor 21 or it is not formed at the end part thereof, the lower conductor 21 is not short circuited with the upper conductor 623. Therefore, the breakdown limit of the withstand voltage value and the insulating properties of the capacitor element 611 are improved, and the quality variations in electronic components having the fabricated capacitor element 611 are suppressed.

In addition, in the capacitor element 611, since the area (the opening diameter) 12 of the opening 33b defines the electrode area of the capacitor element 611, the capacitance value is not varied even though the position of forming the upper conductor 623 is shifted. Therefore, the capacitance value of the capacitor element 611 can be obtained highly accurately. In addition, when the insulating film 33 is thickened, the parasitic inductance and the stray capacitance generated between the lead conductors of the upper conductor 623 and the lower conductor 21 are decreased. Therefore, the capacitance value of the capacitor element 11 can be made more accurately.

In addition, since it is unnecessary to thicken the film thickness of the dielectric film 31 in order to prevent a short circuit between the lower conductor 21 and the upper conductor 623, the film thickness of the dielectric film 31 can be made one tenth of the film thickness before (2 to 3 ($\mu$m)) or below, and the capacitor element 611 of high capacitance can be obtained. In addition, since the sufficient capacitance can be obtained even though the size of the electrode area of the capacitor element 611 is reduced, a reduction in size of the electronic component having the capacitor element 611 can be realized.

In addition, different from the thin film capacitor element 1011 disclosed in Patent Reference 1, since the capacitor element 611 has the structure in which the upper conductor 623 is not faced to the side surface of the lower conductor 21, the parasitic capacitance generated between the side part of the lower conductor 21 and the upper conductor 623 is little varied even though the electronic component 1 is reduced in size. In addition, the insulating film 33 is thickened to a few $\mu$m, whereby the parasitic capacitance can be suppressed.

Moreover, different from the thin film capacitor element 1011 disclosed in Patent Reference 1, in the capacitor element 611, since the insulating layer 1033 in a protruded shape toward the substrate surface is not formed and the insulating film 33 is formed almost throughout the surface of the substrate 51, the electronic component having the capacitor element 611 can be easily formed in a super multilayer form. Moreover, since the protruded insulating layer 1033 is not formed in the rim part of the capacitor element 11, the other circuit devices such as an inductor element can be formed near the capacitor element 11. Accordingly, a reduction in size of the electronic component having the capacitor element 611 can be realized.

However, the capacitor element 611 has a problem that when it is further reduced in size where the length 1 of one side of the opening 33b is l=5 ($\mu$m), for example, the electrode area cannot be formed highly precisely, and the capacitance value cannot be obtained highly accurately.

For example, the insulating film 33 is formed of a photosensitive resin (photoresist). When a photosensitive resin is used for a material for the insulating film 33, the insulating film 33 is formed and then the insulating film 33 is exposed and developed to form the opening 33b. In addition, after the opening 33b is formed, the insulating film 33 is post baked to remove a photosensitive group and an organic solvent in the insulating film 33. Accordingly, the insulating film 33 excellent in environmental resistance can be formed.

Post bake causes the insulating film 33 to cure and shrink. The insulating film 33 is contracted by cure and shrinkage, and the area of the opening 33b is increased. However, an increase in the area of the opening 33b caused by cure and shrinkage is varied for every product. Thus, variations occur in the area of the upper conductor 623 formed in the opening 33b. On the other hand, in order to suppress the parasitic capacitance generated between the side part of the lower conductor 21 and the upper conductor 623, it is necessary to thicken the insulating film 33 to a few $\mu$m. The amount of cure and shrinkage of the insulating film 33 is more increased as the insulating film 33 is thicker. In addition, the area of the opening 33b is more decreased as the capacitor element 611 is more reduced in size. Therefore, when the capacitor element 611 is reduced in size, the variations in the area of the opening 33b caused by cure and shrinkage greatly affect the accuracy of the area of the opening 33b. Thus, the capacitor element 611 has problems that when it is reduced in size, the electrode area cannot be formed highly precisely and the capacitance value cannot be obtained highly accurately.

As the properties of the material for forming the insulating film 33 which affects the accuracy of the capacitance value of the capacitor element 611, there are hygroscopic properties and workability in addition to cure and shrinkage. In addition, methods of forming the opening 33b, such as photolithography, laser and plasma, also affect the accuracy of the capacitance value of the capacitor element 611. The same problem arises when photosensitive polyimides, photosensitive epoxy resins and photosensitive benzcyclobutene are used for the material of forming the insulating film 33.

It is possible to use inorganic materials for the material of forming the insulating film 33. When an inorganic material is used, the accuracy of the area of the opening 33b is relatively highly accurate as compared with the case in which a photosensitive resin is used. However, a quite long deposition time is required for forming an inorganic insulating film having a thickness of a few μm using a vapor phase process such as sputtering, and etching for forming the opening 33b takes a long time as well. Therefore, using an inorganic material for the material of forming the insulating film 33 arises another problem that the electronic component having the capacitor element 611 needs more costs than the case of using an organic material.

There is also a method of forming the column shaped conductor part of the upper conductor 623 by etching (subtractive process). However, generally, the accuracy of the shape of the conductor is more dropped as the conductor is formed thicker. Since it is necessary to thicken the insulating film 33 to a few μm, it is also necessary to thicken the column shaped conductor part of the upper conductor 623. Therefore, even though the column shaped conductor part of the upper conductor 623 is formed by etching, the capacitor element 611 has problems that the electrode area cannot be formed highly precisely and the capacitance value cannot be obtained highly accurately.

In addition, as shown in FIG. 37, the insulating film 33 around the opening 33b has a tapered shape. The insulating film 33 at the tip end part in a tapered shape indicated by circle A in FIG. 37 is thin, and functions as the dielectric film of the capacitor element 611 along with the dielectric film 31 directly formed thereunder. However, since the area of the opening 33b as well as the tapered shape of the insulating film 33 have variations, the film thickness of the tip end part in a tapered shape and the area of the opening 33b are varied. Therefore, a problem arises that the variations in tapered shape also affects the capacitance value of the capacitor element 611.

In addition, the insulating film 33 at the tip end part in a tapered shape is thin, and hardly has the insulating properties. Moreover, the dielectric film 31 on the end part of the lower conductor 21 indicated by B in FIG. 37 might be partially broken. This might cause leakage current to be carried through the insulating film 33 at the tip end part in a tapered shape and the broken portion of the dielectric film 31. When leakage current is carried, the insulating film 33 is damaged to cause a problem that the capacitor element 611 does not function as a capacitor.

FIG. 38 shows a thin film capacitor 811 disclosed in Patent Reference 2. As shown in FIG. 38, the thin film capacitor 811 is configured to in turn form a lower electrode layer 821, a dielectric layer 831, a first upper electrode layer 823, and a second upper electrode layer 825 on an insulating substrate 851, having a thickness of 0.005 (μm)≦t1'≦1 (μm), 2×t1'≦t2≦10 (μm) where the thickness of the first upper electrode layer 823 is t1', and the thickness of the second upper electrode layer 825 is t2'.

The first upper electrode layer 823 serves as a contact layer to obtain sufficient adhesion properties with the dielectric layer 831 working as the upper electrode layer as well as serves as a role to decide the thin film capacitance value of the capacitor by the dimensions (area) of this layer. The second upper electrode layer 825 reduces the conduction resistance of the upper electrode as the main conductor of the upper electrode of the thin film capacitor 811, which has excellent bonding properties for wire bonding and ribbon bonding and soldering properties for a solder.

The thin film capacitor 811 has the upper electrode layer in the layered structure of the first upper electrode layer 823 on the dielectric layer 831 side and the second upper electrode layer 825 formed thereon, in which the thickness t1' of the first upper electrode layer 823 is reduced to 0.005 to 1 (μm) and the thickness t2' of the second upper electrode layer 825 is thickened to 2×t1' to 10 (μm). Thus, since side etching does not occur in the first upper electrode layer 823 as before, the variations in the dimensions can be eliminated, and the counter electrode area can be controlled accurately, whereby the occurrence of variations in the capacitance value can be removed. In addition, since the second upper electrode layer 825 has sufficient thickness, it can be provided with excellent wire bonding properties and low conduction resistance which are considered to be necessary for the upper electrode layer. Consequently, a small sized, highly accurate thin film capacitor 811 can be provided which has very small variations in the capacitance value.

For methods of forming the second upper electrode layer 825, for example, such a method that a metal film such as titanium, tantalum, or nickel-chrome to be the first upper electrode layer 823 and a metal film such as copper, gold, or aluminum to be the second upper electrode layer 825 are deposited on the substrate having layers up to the dielectric layer 831 formed in a predetermined thickness by vapor deposition and sputtering.

Subsequently, a photoresist is formed in a desired pattern shape corresponding to the second upper metal film 825 on the surface of the metal film to be the second upper metal film 825 by photolithographic technique, the photoresist is used as a mask for pattern etching using an etching solution matched with the second upper metal film 825 (for example, ammonium persulfate aqueous solution for copper), and the second upper electrode layer 825 in a predetermined shape and dimensions is formed.

However, the thin film capacitor 811 disclosed in Patent Reference 2 has a problem that it cannot be formed in one piece with the other circuit devices such as an inductor element and a resistance element and it cannot be adapted to a composite component. In addition, the thin film capacitor 811 has a problem that it is difficult to form the thin film capacitor 811 to have a super multilayer form by laminating the dielectric layer 831, the first upper electrode layer 823 and the second upper electrode layer 825 on the second upper electrode layer 825.

In addition, in the thin film capacitor 811, it is likely to etch the first upper electrode layer 823 as well in pattern etching the second upper metal film 825. Therefore, the thin film capacitor 811 has problems that the first upper electrode layer 823 cannot be formed in a desired shape and dimensions and that the accuracy of the counter area is not highly accurate.

Patent Reference 1: JP-A-2002-25854
Patent Reference 2: JP-A-10-135077
Patent Reference 3: JP-A-2002-33559
Patent Reference 4: JP-A-2003-17366
Patent Reference 5: Japanese Patent No. 3193973

SUMMARY OF THE INVENTION

An object of the invention is to provide an electronic component which can obtain the capacitance value of a capacitor element highly accurately.

The object is achieved by an electronic component including: a first conductor which is formed on a substrate; a dielectric film which is formed on the first conductor; and a second conductor which is formed on the dielectric film and thinner than the first conductor, wherein a capacitative element is configured of the first conductor, the second conductor and the dielectric film.

In the electronic component according to the invention, an electrode area of the capacitative element is defined by an area of the second conductor.

In the electronic component according to the invention, $t1 > t2$ and $x \leq t2$, where a thickness of the first conductor is $t1$, a thickness of the second conductor is $t2$, and a particle diameter of the second conductor is $x$.

In the electronic component according to the invention, an entire surface of the second conductor is flat.

In the electronic component according to the invention, it further includes an insulating film which is formed on the second conductor.

In the electronic component according to the invention, an opening is formed in a part of the insulating film on the second conductor in which a surface of the second conductor is exposed.

In the electronic component according to the invention, it further includes a third conductor which is formed in the opening and is thicker than the second conductor.

In the electronic component according to the invention, the third conductor is extended over the insulating film.

In the electronic component according to the invention, the first conductor and the third conductor are formed in different layers.

In the electronic component according to the invention, a surface of the insulating film is flat.

In the electronic component according to the invention, the insulating film is formed on almost throughout a surface of the substrate.

In the electronic component according to the invention, it further includes: a fourth conductor which is formed in a same layer as the first conductor; and a fifth conductor which is faced to the fourth conductor through the insulating film.

In the electronic component according to the invention, a film thickness of the dielectric film is thinner than a film thickness of the insulating film.

In the electronic component according to the invention, a dielectric constant of the dielectric film is higher or equal to a dielectric constant of the insulating film.

In the electronic component according to the invention, the dielectric film is formed only on the first conductor.

In addition, the object is achieved by a method of fabricating an electronic component including the steps of: forming a first conductor on a substrate; forming a dielectric film on the first conductor; forming a second conductor which is thinner than the first conductor on the dielectric film, wherein a capacitative element is configured of the first conductor, the second conductor and the dielectric film; forming an insulating film on the second conductor; forming an opening in the insulating film in which a surface of the second conductor is exposed; and forming a third conductor which is thicker than the second conductor in the opening.

According to the invention, the electronic component which can obtain the capacitance value of the capacitor element highly accurately can be realized.

BRIEF DESCRIPTION OF THE DRAWINGS

FIG. 29 shows a cross section depicting an electronic component 601 according to a seventh embodiment of the invention;

DETAILED DESCRIPTION OF THE INVENTION

First Embodiment

Figure 1A:
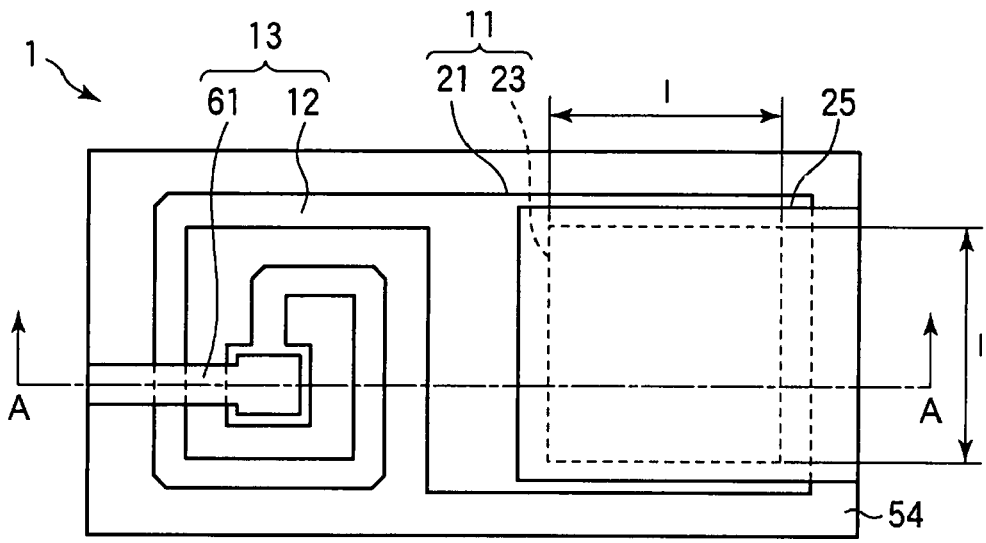
FIGS. 1A to 1C show diagrams depicting an electronic component 1 according to a first embodiment of the invention.
Figure 1B:
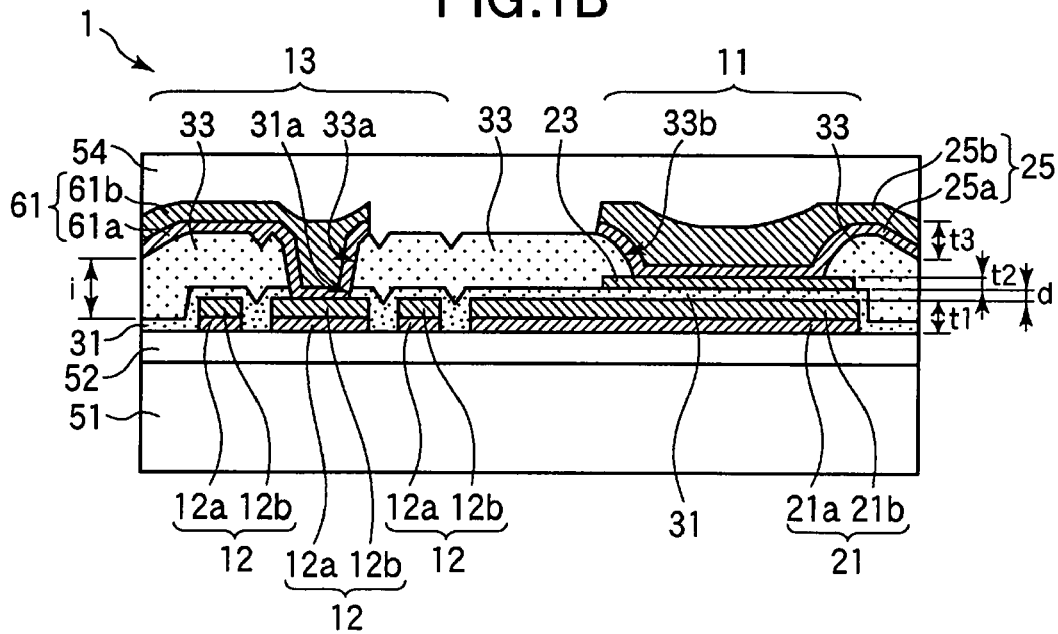
Figure 1C:
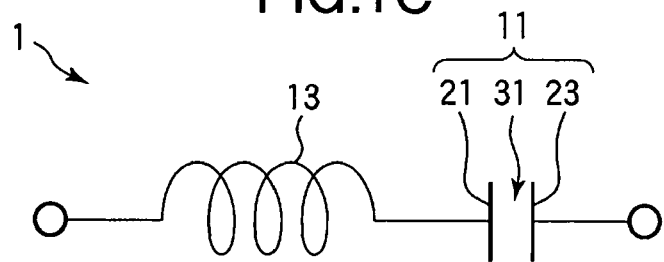

An electronic component according to a first embodiment of the invention will be described with reference to FIGS. 1A to 11B. First, an electronic component 1 according to the embodiment will be described with reference to FIGS. 1A to 1C. FIG. 1A shows a plan view depicting the electronic component 1, and FIG. 1B shows a cross section cut at line A-A shown in FIG. 1A. In addition, FIG. 1C shows an equivalent circuit diagram depicting the electronic component 1. In FIG. 1A, a hidden line is depicted by a dotted line.

As shown in FIGS. 1A and 1B, the electronic component 1 has a capacitor element (capacitive element) 11 formed by thin film formation technique and an inductor element 13 which is electrically connected to the capacitor element 11, having an overall outer appearance of a rectangular parallelepiped shape. In FIG. 1A, the ratio between the length of the long side of the electronic component 1 laterally extended and the length of the short side vertically extended is about 2:1. As shown in FIG. 1C, the capacitor element 11 is serially connected to the inductor element 13 to configure a series resonant circuit.

As shown in FIG. 1B, in the electronic component 1 according to the embodiment, for a substrate, a smooth substrate 51 is used on the surface of which a planarized layer 52 is formed. For example, the substrate 51 is formed of alumina ($Al_2O_3$). The planarized layer 52 is formed of alumina, and the surface of the planarized layer 52 is polished and made flat by CMP (chemical-mechanical polishing).

The electronic component 1 has a coil conductor 12 which is formed on the planarized layer 52 of the substrate 51 in a spiral shape when the substrate 51 is seen in the normal direction of the substrate surface, and via openings 31a and 33a which are formed in a dielectric film 31 and an insulating film 33 on the end part on the inner radius side of the coil conductor 12.

In the via openings 31a and 33a and on the insulating film 33, a conductor 61 is formed which contacts with the end part on the inner radius side of the coil conductor 12 at the via opening 31a. The inductor element 13 is formed of the coil conductor 12 and the conductor 61. The end part on the outer radius side of the coil conductor 12 is electrically connected to a lower conductor 21. The coil conductor 12 and the lower conductor 21 are formed in one piece in the same layer. The conductor 61 and the conductor 25 are current carrying terminals for the electronic component 1.

The coil conductor 12 is configured of an underlying conductor 12a of titanium (Ti)/copper (Cu) or chromium (Cr)/Cu which is formed on the planarized layer 52 of the substrate 51, and a conductor 12b of Cu which is formed on the underlying conductor 12a. As shown in FIG. 1A, the coil conductor 12 is formed of a single wound coil.

To the coil conductor 12, the conductor 61 is electrically connected. The conductor 61 is extended over from the via opening 33a to the insulating film 33, and is formed in a slim rectangular shape from the via opening 33a to the rim part on the short side of the electronic component 1. The conductor 61 is configured of an underlying conductor 61a of Ti/Cu which is formed on the coil conductor 12, the dielectric film 31 and the insulating film 33, and a conductor 61b of Cu which is formed on the underlying conductor 61a. The coil conductor 12 is faced to the conductor 61 formed on the insulating film 33 through the insulating film 33.

The via part of the conductor 61 is formed in the via openings 31a and 33a formed in the dielectric film 31 and the insulating film 33, and the side part of which is covered with the dielectric film 31 and the insulating film 33. Therefore, the via part can secure reliable connection and insulating properties, and can improve the reliability of connection of the via part. Accordingly, the reliability of the electronic component 1 is enhanced.

In addition, as shown in FIG. 1B, the electronic component 1 has a lower conductor (first conductor) 21 which is formed on the planarized layer 52 of the substrate 51, a dielectric film 31 which is formed on the lower conductor 21, and an upper conductor (second conductor) 23 which is formed on the dielectric film 31 and is thinner than the lower conductor 21. The capacitor element (capacitative element) 11 is configured of the lower conductor 21, the dielectric film 31 and the upper conductor 23.

The capacitor element 11 is configured of the lower conductor 21, the dielectric film 31 and the upper conductor 23 which are in turn laminated and formed on the planarized layer 52 of the substrate 51. As shown in FIG. 1A, the lower conductor 21 has a rectangular shape when the substrate 51 is seen in the normal direction of the substrate surface. The lower conductor 21 is formed of the same material as the coil conductor 12 at the same time in the same layer.

The coil conductor 12 and the lower conductor 21 are relatively thicker with respect to the upper conductor 23. Therefore, the equivalent series resistance (ESR) of the capacitor element 11 is reduced to decrease the transmission loss. The desired thickness of the coil conductor 12 and the lower conductor 21 is varied depending on the frequency characteristics that are desired by the electronic component 1. For example, when the electronic component 1 is used for a bandpass filter in a 2.4 GHz band, preferably, the thickness t1 of the coil conductor 12 and the lower conductor 21 is $t1 \geqq 5$ (μm). In the embodiment, since the electronic component 1 is a bandpass filter in a 2.4 GHz band, it is required for high attenuation characteristics in order to remove noise in frequency bands other than this frequency band. Depending on the frequency bands to process, considerations are required for setting the thickness of the conductor. In the tendency, when the frequency band to process is high, the thickness of setting the conductor can be made thin, and the attenuation characteristics necessary as the bandpass filter can be obtained. Thus, in order to take account of the attenuation characteristics in low frequency domain, it is necessary to thicken the thickness of setting the conductor. Particularly, frequency bands for systems such as cellular telephones are set in the frequency domain lower than 2.4 GHz, and it is important to take account of setting the thickness of the conductor for these frequency bands of 800 MHz, 900 MHz, 1500 MHz, 1700 MHz, 1900 MHz, and 2100 MHz. In addition, in consideration of the variations in the thickness in fabrication, for example, the thickness t1 of the coil conductor 12 and the lower conductor 21 is t1=8 (μm).

The lower conductor 21 is configured of an underlying conductor 21a of titanium (Ti)/copper (Cu) which is formed on the planarized layer 52 of the substrate 51, and a conductor 21b of Cu which is formed on the underlying conductor 21a. Since the lower conductor 21 is formed of a conductor material of low resistance such as Cu, the ESR of the capacitor element 11 can be decreased. The lower conductor 21 has an electrode part which is faced to the upper conductor 23 as it sandwiches the dielectric film 31 therewith and functions as the electrode of the capacitor element 11, and a lead conductor part which is lead to connect the electrode part to the coil conductor 12. The electrode part is a square area which occupies almost the center part of the lower conductor 21 and the length of one side is l indicated by a broken line in FIG. 1A. The lead conductor part is a rectangular area sandwiched by the electrode part and the coil conductor 12. The lead conductor part has a wire shape of wide width, and it is relatively short. Thus, the ESR and equivalent series inductance (ESL) of the capacitor element 11 can be decreased.

As shown in FIG. 1B, the dielectric film 31 is formed on the coil conductor 12, the lower conductor 21 and the planarized layer 52 of the substrate 51. The dielectric film 31 is formed over almost throughout the surface of the substrate 51 except the via opening 31a, and covers almost throughout the top and the side surface of the coil conductor 12 and the lower conductor 21. For example, the film thickness d of the dielectric film 31 is 0.1 (μm), which is formed thinner than that of the lower conductor 21. For the material of the dielectric film 31, for example, alumina, silicon nitride ($Si_4N_3$), silicon dioxide ($SiO_2$), tantalum oxide ($Ta_2O_5$), or aluminium nitride (AlN) is used. The film thickness d of the dielectric film 31 is made uniform.

As shown in FIG. 1B, the upper conductor 23 is formed on the dielectric film 31 on the electrode part of the lower conductor 21. The upper conductor 23 is a square area which the length of one side is l indicated by a broken line in FIG. 1A. For example, the length l is 100 (μm). The accuracy of the position of forming the upper conductor 23 depends on the positioning accuracy of the substrate in photolithographic process steps. As shown in FIG. 1A, the upper conductor 23 is formed more inside by the amount of the accuracy of the formed position than the lower conductor 21 when the substrate surface of the substrate 51 is seen in the normal direction. Thus, the influence of the variations in the position of forming the upper conductor 23 upon the capacitance value of the capacitor element 11 can be eliminated. The electrode area of the capacitor element 11 is defined by the area $l^2$ of the upper conductor 23. The capacitance value of the capacitor element 11 is defined by the area $l^2$ of the upper conductor 23, and the film thickness d and the dielectric constant of the dielectric film 31 sandwiched between the upper conductor 23 and the lower conductor 21. The surface of the upper conductor 23 is flat throughout the surface.

The upper conductor 23 is formed thinner than the lower conductor 21. Generally, the accuracy of the shape of the conductor is more dropped as the conductor is formed thicker. Since the upper conductor 23 is formed thinner, the upper conductor 23 in a highly accurate shape can be obtained. Therefore, the area accuracy of the upper conductor 23 faced to the lower conductor 21 is highly accurate, and the electrode area of the capacitor element 11 can be formed highly precisely.

In addition, the upper conductor 23 is formed by a film deposition process such as sputtering and vapor deposition with a vacuum deposition apparatus. Therefore, since the upper conductor 23 with uniform thickness distribution and small particle diameter can be formed, the etched amount of side etching can de decreased even though side etching occurs in patterning the upper conductor 23 into a desired shape. Accordingly, the influence of side etching upon the accuracy of the shape of the upper conductor 23 can be made small, and the accuracy of the shape of the upper conductor 23 can be made more highly accurately. Therefore, the area accuracy of the upper conductor 23 is made more highly accurately, and the electrode area of the capacitor element 11 can be formed more highly precisely.

Preferably, the thickness t2 of the upper conductor 23 is $x \leqq t2$, where the particle diameter of the upper conductor 23 is x (x<1 (μm)). The thickness t2 of the upper conductor 23 is set within that range, whereby the upper conductor 23 in a highly accurate shape can be obtained. The particle diameter x of the upper conductor 23 is varied depending on film deposition processes. For example, when the upper conductor 23 is deposited by sputtering, the particle diameter x of the upper conductor 23 is about 3 to 5 (nm). When the thickness t2 is thicker than 1 (μm), the surface shape of the upper conductor 23 is roughened, the accuracy of the shape of the upper conductor 23 cannot be highly accurate, and the electrode area of the capacitor element 11 cannot be formed highly precisely. In the embodiment, the thickness t2 of the upper conductor 23 is 130 (nm). The upper conductor 23 is configured of the conductor of Ti having a thickness of 30

(nm) which is formed on the dielectric film 31 and the conductor of Cu having a thickness of 100 (nm) which is formed on the conductor of Ti.

The method of forming the upper conductor 23 may be any one of etching (subtractive process) and deposition (additive process). In addition, the method may be ink jet printing or screen printing using conductive materials.

The upper conductor 23 is formed on the flat part other than the end part of the lower conductor 21 as it avoids the end part. Thus, even though the film thickness of the dielectric film 31 is made thin or not formed at the end part of the lower conductor 21, the lower conductor 21 is not short circuited with the upper conductor 23. Therefore, the breakdown limit of the withstand voltage value and the insulating properties of the electronic component 1 are improved, and the quality variations in the fabricated electronic component 1 are suppressed.

In addition, since it is unnecessary to thicken the film thickness of the dielectric film 31 in order to prevent a short circuit between the lower conductor 21 and the upper conductor 23, the film thickness d of the dielectric film 31 can be formed one tenth of the film thickness before (2 to 3 ($\mu$m)), and the capacitor element 11 of high capacitance can be obtained. In addition, even though the electrode area 12 of the capacitor element 11 is made small, the sufficient capacitance can be obtained, and thus a reduction in size of the electronic component 1 can be realized. For example, it is possible to intend a reduction in size of the electronic component 1 where the length l of one side of the upper conductor 23 is set to the length shorter than 100 ($\mu$m) such as 50 ($\mu$m) or 30 ($\mu$m) or 5 ($\mu$m). Therefore, the electronic component 1 can be adapted to a 1608 type component (the length of the long side is 1.6 mm and the length of the short side is 0.8 mm), a 1005 type component (the length of the long side is 1.0 mm and the length of the short side is 0.5 mm) or smaller chip components. In addition, since the sufficient capacitance can be obtained without forming the capacitor element 11 in multilayer, the electronic component 1 can be reduced in thickness.

As shown in FIG. 1B, the insulating film 33 is formed on the end part of the upper conductor 23 and the dielectric film 31. For example, the film thickness i of the insulating film 33 is 5 ($\mu$m). For example, the insulating film 33 is formed of a photosensitive resin for semiconductors (photoresist for semiconductors). A photosensitive resin for semiconductors is used for the material of forming the insulating film 33, whereby the insulating film 33 can be obtained which is excellent in the insulating properties, environmental resistance, costs, and the accuracy of the thickness and flatness. For the material of forming the insulating film 33, photosensitive polyimides or photosensitive epoxy materials may be used. In addition, inorganic materials such as alumina may be used. The material for the insulating film 33 is demanded for heat resistance properties. The insulating film 33 is formed as isolated from the lower conductor 21 and the coil conductor 12 by the dielectric film 31, and does not directly contact with the lower conductor 21 and the coil conductor 12. For the dielectric film 31, a material having a higher dielectric constant than that of the insulating film 33. The film thickness d of the dielectric film 31 is thinner than the film thickness i of the insulating film 33.

In the insulating film 33, an opening 33b is formed which is formed on the upper conductor 23 through which the surface of the upper conductor 23 is exposed. The opening 33b has a square shape, for example, when the substrate 51 is seen in the normal direction of the substrate surface. In addition, as shown in FIG. 1B, the insulating film 33 around the opening 33b has a tapered shape. The insulating film 33 is formed almost throughout the surface of the substrate 51 except the via opening 33a and the opening 33b. The insulating film 33 near the outer rim of the electronic component 1 (near a cutting line of a product) may be removed.

Different from the thin film capacitor element 1011 disclosed in Patent Reference 1, the electronic component 1 does not have the insulating layer 1033 in a shape protruded toward the substrate surface, and the insulating film 33 is formed almost throughout the surface of the substrate 51. Therefore, the electronic component 1 can be easily formed in a super multilayer form. For example, the dielectric film 31, the upper conductor 23 and the conductor 25 are alternately laminated on the conductor 25, whereby the capacitor element 11 of high capacitance can be obtained. Moreover, since the protruded insulating layer 1033 is not formed in the rim part of the capacitor element 11, the inductor element 13 can be formed near the capacitor element 11. Accordingly, a reduction in size of the electronic component 1 can be realized.

In addition, different from the thin film capacitor 811 disclosed in Patent Reference 2, since the electronic component 1 has the insulating film 33 almost throughout the surface of the substrate 51, the other circuit devices such as the inductor element 13 can be formed in one piece with the capacitor element 11, and the electronic component 1 can be adapted to a composite component. In addition, different from the thin film capacitor 811 disclosed in Patent Reference 2, since the insulating film 33 is formed, the electronic component 1 can be easily formed in a super multilayer form.

As shown in FIG. 1B, the conductor (third conductor) 25 is formed on the upper conductor 23 in the opening 33b. In addition, the conductor 25 is extended over the insulating film 33 from the opening 33b to the rim part on the short side of the electronic component 1. The conductor 25 is not formed in the same layer as the lower conductor 21. As shown in FIG. 1A, the conductor 25 has a rectangular shape when the substrate surface of the substrate 51 is seen in the normal direction.

As shown in FIG. 1B, for example, a protective film 54 having a film thickness of 30 ($\mu$m) is formed throughout the surface of the conductor 25, the insulating film 33 and the conductor 61. For example, the protective film 54 is formed of alumina.

The thickness t3 of the conductor 25 is formed thicker than the upper conductor 23. Thus, even though the upper conductor 23 is formed thin, the ESR and ESL of the capacitor element 11 can be decreased. Therefore, the high frequency characteristics such as the Q characteristics and the self resonant frequency (SRF) of the capacitor element 11 are improved to decrease the transmission loss. Accordingly, the capacitor element 11 with small transmission loss can be realized which can be used for high frequencies as well. For example, the thickness t3 of the conductor 25 is 8 ($\mu$m) that is equal to the thickness t1 of the coil conductor 12 and the lower conductor 21.

The conductor 25 is formed of the same material as that of the conductor 61 at the same time in the same layer. The conductor 25 is configured of an underlying conductor 25a of Ti/Cu which is formed on the upper conductor 23 and the insulating film 33, and a conductor 25b of Cu which is formed on the underlying conductor 25a. The conductor 25 has a column shaped conductor part which is formed in the opening 33b, and a lead conductor part which is formed over the insulating film 33 from the upper part of the opening 33b to the rim part on the short side of the electronic component 1 in order to connect the upper conductor 23 to an external electrode (not shown) formed on the side surface of the electronic component 1. The lead conductor part has a wire shape of wide width, and it is relatively short. Therefore, the ESR and equivalent series inductance (ESL) of the capacitor element 11 can be decreased.

It is necessary to form the conductor 25 which contacts with the upper conductor 23 so as not to extend off the upper conductor 23 when the substrate surface of the substrate 51 is seen in the normal direction. When the conductor 25 which contacts with the upper conductor 23 is formed to extend off the upper conductor 23, parasitic capacitance is formed between the lower conductor 21 and the extended portion, and the capacitance value of the capacitor element 11 cannot be obtained highly accurately. In consideration of the accuracy of the formed position and shape of the opening 33b, the conductor 25 which contacts with the upper conductor 23 is formed inside the upper conductor 23 when the substrate 51 is seen in the normal direction of the substrate surface. Thus, the influence of the variations in the position and shape of the opening 33b upon the accuracy of the capacitance value of the capacitor element 11 can be eliminated. In addition, preferably, the area (the area of the opening 33b) of the conductor 25 which contacts with the upper conductor 23 is almost equal to the area of the upper conductor 23. Therefore, the contact area of the upper conductor 23 to the conductor 25 is increased to decrease the ESR of the capacitor element 11, and the reliability of connection can be obtained.

In addition, the conductor 25 is extended over from the opening 33b to the insulating film 33, and is not formed in the same layer as the lower conductor 21. Thus, even though the film thickness of the dielectric film 31 is thin or not formed at the end part of the lower conductor 21, the lower conductor 21 is not short circuited with the conductor 25. Therefore, the breakdown limit of the withstand voltage value and the insulating properties of the electronic component 1 are improved, and the quality variations in the fabricated electronic component 1 are suppressed.

Figure 37:
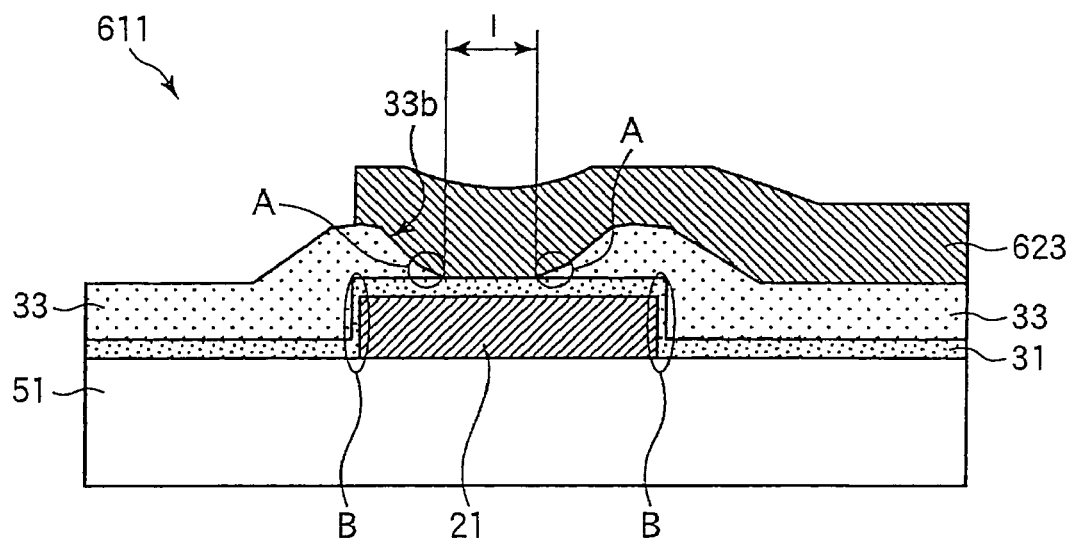
FIG. 37 shows a cross section depicting the capacitor element 611 proposed by the inventors.
Figure 38:
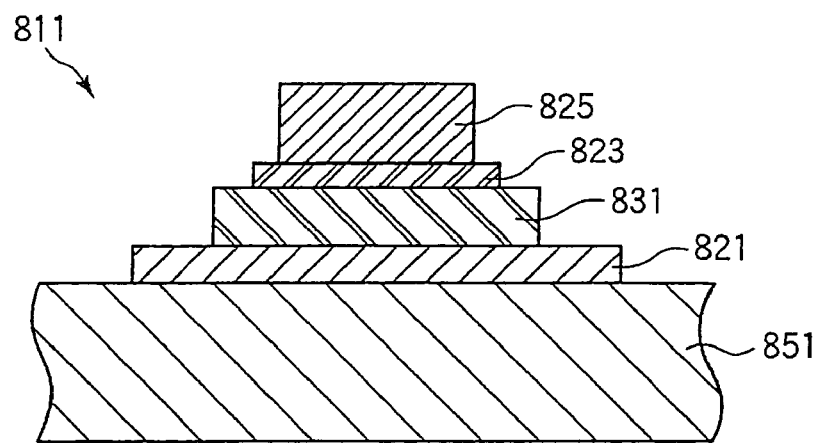
FIG. 38 shows a cross section depicting the thin film capacitor 811 disclosed in Patent Reference 2.

In addition, different from the capacitor element 611 shown in FIG. 37, the upper conductor 23 is formed between the insulating film 33 at the tip end part in a tapered shape and the dielectric film 31 on the end part of the lower conductor 21. Thus, even though the dielectric film 31 on the end part of the lower conductor 21 is not partially formed, the leakage current carried between the insulating film 33 at the tip end part in a tapered shape and the dielectric film 31 on the end part of the lower conductor 21 can be prevented. Therefore, the breakdown limit of the withstand voltage value and the insulating properties of the electronic component 1 are improved, and the quality variations in the fabricated electronic component 1 are suppressed.

The thin film capacitor element 1011 disclosed in Patent Reference 1 has the structure in which the side surface of the lower electrode 1021 is faced to the upper electrode 1023 through the insulating layer 1033. Since the insulating layer 1033 becomes thinner as the thin film capacitor element 1011 is reduced in size, the ratio of parasitic capacitance to the capacitance value of the thin film capacitor element 1011 becomes large.

On the other hand, the electronic component 1 according to the embodiment has the structure in which the conductor 25 is not faced to the side surface of the lower conductor 21. Thus, regardless of the size of the electronic component 1, the parasitic capacitance that occurs between the side surface of the lower conductor 21 and the conductor 25 is hardly changed. Therefore, even though the electronic component 1 is reduced in size, the ratio of the parasitic capacitance to the capacitance value of the capacitor element 11 is not increased. Therefore, the electronic component 1 in small size can be realized which can obtain the capacitance value of the capacitor element 11 highly accurately.

Generally, since the capacitance value of the capacitor is inversely proportional to the distance between electrodes, the parasitic capacitance that occurs between the lower conductor 21 and the lead conductor part of the conductor 25 becomes small when the film thickness i of the insulating film 33 is thickened. On this account, the parasitic capacitance (the amount of deviation in the capacitance value) of the capacitor element 11 is almost inversely proportional to the film thickness i of the insulating film 33.

Therefore, when the insulating film 33 is thickened, the parasitic inductance and the parasitic capacitance that occur between the lower conductor 21 and the conductor 25 are decreased. Accordingly, the accuracy of the capacitance value of the capacitor element 11 can be enhanced. In addition, the degradation of the transmission characteristics in the high frequency domain can be suppressed. Moreover, a desired circuit constant can be obtained, and the high frequency circuit design is facilitated.

In the thin film capacitor element, in the case in which higher capacitance is obtained in a smaller counter area, capacitive coupling to surrounding wirings affects more greatly on the capacitance value. Thickening the film thickness i of the insulating film 33 is effective when a desired capacitance value of the capacitor element 11 is obtained in order to intend a reduction in the size of the capacitor element 11. In addition, the unevenness of the film thickness i of the insulating film 33 is decreased to suppress the fluctuations in the capacitance value for every product.

In addition, when the insulating film 33 is thickened, the stray capacitance between the coil conductor 12 and the conductor 61 are decreased. Thus, it is intended that the self resonant frequency and the antiresonance frequency of the inductor element 13 are adapted to high frequencies and the Q characteristics are improved. For example, when the electronic component is used for a filter circuit in accordance with an LC resonant circuit having the same structure as that of the capacitor element 11 and the inductor element 13, insertion loss is reduced, the suppression of the amount of attenuation of the out-of-band characteristics is improved, or the steepness of cut off domains is improved. In the case in which the insulating film 33 is formed thinner to intend a thin capacitor element 11, the distance between the lower conductor 21 and the conductor 25 is actively changed to reduce the film thickness of the insulating film 33 and the height of the opening 33b, whereby capacitive coupling that occurs between the lower conductor 21 and the lead conductor part of the conductor 25 can be actively used as the capacitance of the capacitor element 11 and the parasitic capacitance of the inductor element 13.

In addition, the film thickness i of the insulating film 33 is thickened to decrease magnetic coupling and capacitive coupling to the wirings faced to the wirings of the coil conductor 12 and the coil conductor 12 can be decreased (for example, the conductor 61, and wirings for ground, power supply, shield, the inductor element and the capacitor element 11 and so on).

In addition, the film thickness i or the dielectric constant of the insulating film 33 is adjusted to intentionally generate electromagnetic coupling and capacitive coupling, and the performance of the transmission characteristics is exploited in a desired frequency band, whereby the characteristics of the electronic component 1 can be improved. The film thickness i or the dielectric constant of the insulating film 33 is adjusted to actively utilize parasitic components, whereby magnetic coupling is performed efficiently, alternate current components are effectively exploited, and direct current components are decreased, for example, to reduce the transmission loss of the electronic component 1.

As described above, in the electronic component 1 according to the embodiment, the electrode area of the capacitor element 11 is defined by the area 12 of the upper conductor 23, not by the area of the opening 33b. The accuracy of the electrode area is not affected by variations in the area of the opening 33b caused by the cure and shrinkage of the insulating film 33, the variations in the tapered shape of the insulating film 33, and the methods of forming the opening 33b. In addition, since the upper conductor 23 is formed thinner than the lower conductor 21, the upper conductor 23 in a highly accurate shape can be obtained. Therefore, the area accuracy of the upper conductor 23 is highly accurate, and the capacitor element 11 can be obtained which can obtain the capacitance value highly accurately.

A method of fabricating the electronic component 1 according to the embodiment will be described with reference to FIGS. 2A to 7. Although a large number of the electronic components 1 are formed on a wafer at the same time, FIGS. 2A to 7 show a device forming area for a single electronic component 1. FIGS. 2A to 7 show cross sections depicting the fabrication process steps of the electronic component 1 according to the embodiment.

In the embodiment, for a substrate, the substrate 51 with a planarized surface is used. First, the surface of alumina formed on throughout the surface of the substrate 51 formed of alumina ($Al_2O_3$) is polished by CMP (chemical-mechanical polishing) to form the planarized layer 52.

Figure 2A:
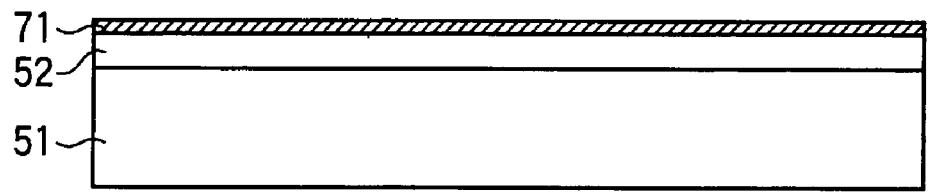
FIGS. 2A to 2C show cross sections depicting a method of fabricating the electronic component 1 according to the first embodiment of the invention (first one)
Figure 2B:
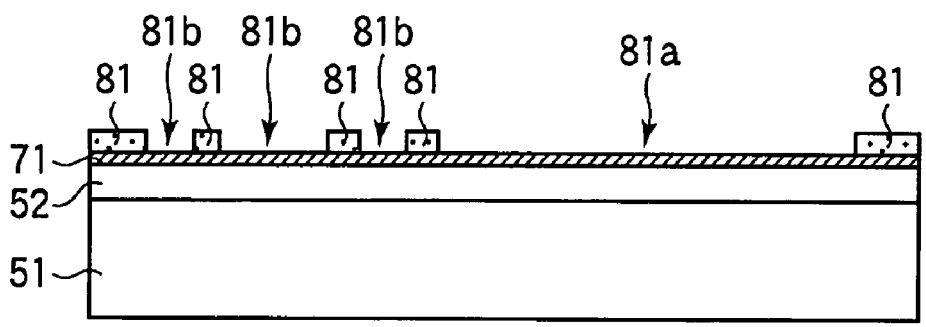

Subsequently, as shown in FIG. 2A, for example, titanium (Ti) having a film thickness of about 30 (nm) and copper (Cu) having a film thickness of about 100 (nm) are in turn laminated on the planarized layer 52 of the substrate 51 by sputtering to form an underlying conductor 71. Then, for example, a photosensitive resin having a thickness of about 8 (μm) is applied to throughout the surface of the underlying conductor 71 by spin coating to form a photosensitive resin layer 81. Subsequently, as shown in FIG. 2B, the photosensitive resin layer 81 is exposed and developed, and an opening 81a in a rectangular shape and an opening 81b in a spiral shape are formed in the photosensitive resin layer 81 when the substrate 51 is seen in the normal direction of the substrate surface. The end part on the outer radius side of the opening 81b is connected to the opening 81a.

Figure 2C:
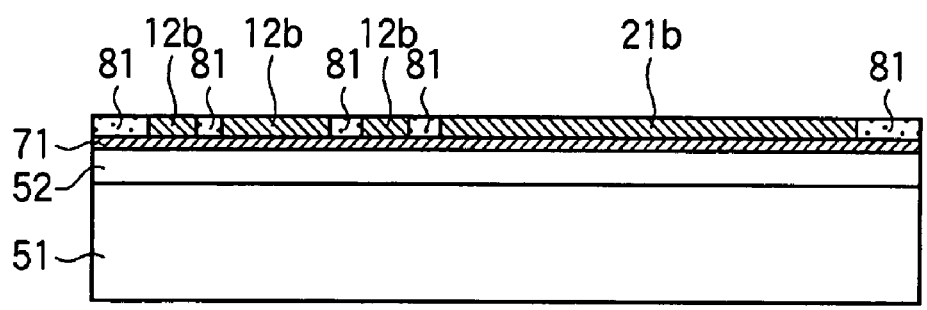
Figure 3A:
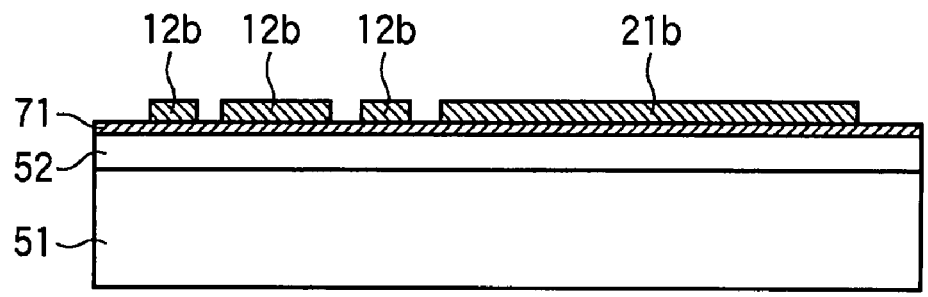
FIGS. 3A to 3C show cross sections depicting a method of fabricating the electronic component 1 according to the first embodiment of the invention (second one)

Then, as shown in FIG. 2C, a conductor of Cu having a thickness of 9 to 10 (μm) is formed on the underlying conductor 71 in the openings 81a and 81b by electrolytic plating, and the surface of the conductor is polished by CMP to form the conductors 12b and 21b having a thickness of about 8 (μm). Subsequently, as shown in FIG. 3A, the photosensitive resin layer 81 is removed.

Figure 3B:
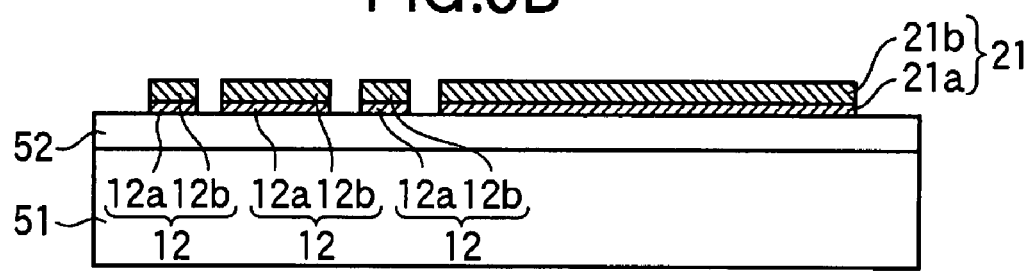

Then, as shown in FIG. 3B, the underlying conductor 71 exposed between the conductors 12b and 21b is removed by dry etching or wet etching to form the underlying conductor 21a configured of the underlying conductor 71 under the conductor 21b and the underlying conductor 12a configured of the underlying conductor 71 under the conductor 12b. By the process steps described above, the lower conductor (first conductor) 21 is formed in the layered structure in which the underlying conductor 21a and the conductor 21b are laminated with each other, and the coil conductor 12 is formed in the layered structure in which the underlying conductor 12a and the conductor 12b are laminated with each other.

In the embodiment, although semi-additive process (deposition) is used for the method of forming the lower conductor 21 and the coil conductor 12, subtractive process (etching), damascene, paste, or lift-off may be used for methods of forming the conductor. The conductor 25 and the conductor 61 described later are formed by the same method as that of the lower conductor 21 and the coil conductor 12. In addition, the wiring layers for the coil conductor 12 and the conductor 61 described later may be any one of the wiring layer of the lower conductor 21 and the wiring layer of the conductor 25, which can be freely arranged in consideration of the ease of the wiring design and the electric characteristics and shape of the inductor element 13.

In the process steps forming the coil conductor 12 and the lower conductor 21, the material for forming the photosensitive resin layer 83 and the photolithographic condition therefor are properly selected to make the accuracy of the formed position and shape of the coil conductor 12 and the lower conductor 21 highly precisely. In addition, the coil conductor 12 and the lower conductor 21 are configured of a plurality of conductive materials so as to perform selective etching, and a chemical solution for selective etching is used to etch the coil conductor 12 and the lower conductor 21, whereby the accuracy of the formed position and shape of the coil conductor 12 and the lower conductor 21 can be made highly precisely as well. It is also the same as the process steps of forming the upper conductor 23, the conductors 25 and 61, described later.

Figure 3C:
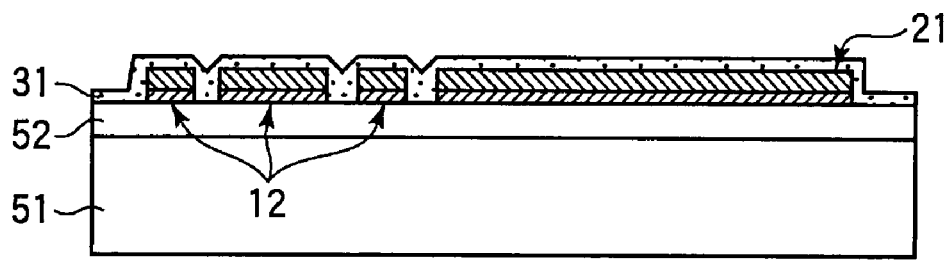

Subsequently, as shown in FIG. 3C, the dielectric film 31 having a thickness of about 0.1 (μm) is formed throughout the surface. For example, for the material for forming the dielectric film 31, alumina, silicon nitride ($Si_4N_3$), silicon dioxide ($SiO_2$), tantalum oxide ($Ta_2O_5$), aluminium nitride (AlN) or magnesium oxide (MgO) are used. The dielectric film 31 is formed to cover throughout the top and the side surface of the lower conductor 21 and the coil conductor 12. The amount of deposition of the dielectric film 31 per time (deposition rate) is reduced or the apparatus configuration is considered, whereby the accuracy of the surface thickness of the dielectric film 31 can be made highly precisely.

Figure 4A:
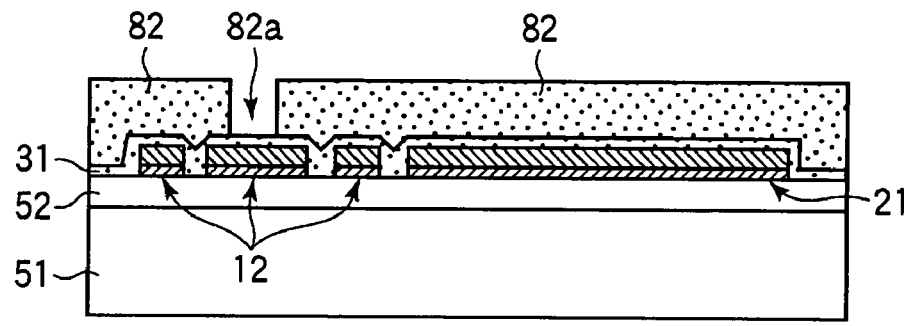
FIGS. 4A to 4C show cross sections depicting a method of fabricating the electronic component 1 according to the first embodiment of the invention (third one)

Then, a photosensitive resin is applied to throughout the surface of the dielectric film 31 to form a photosensitive resin layer 82. Subsequently, as shown in FIG. 4A, the photosensitive resin layer 82 is exposed and developed, and an opening 82a is formed in the photosensitive resin layer 82 on the end part on the inner radius side of the coil conductor 12. Then, the photosensitive resin layer 82 is post baked (heat treated).

Figure 4B:
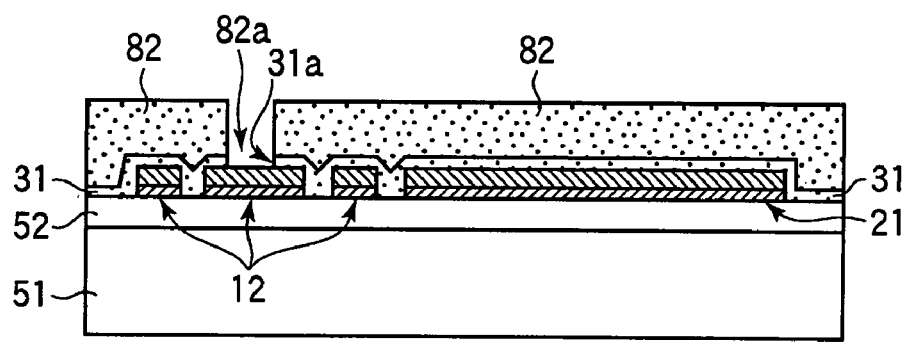
Figure 4C:
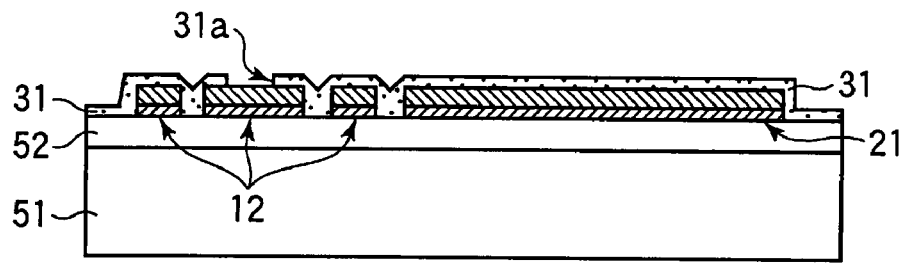

Subsequently, as shown in FIG. 4B, the dielectric film 31 exposed in the opening 82a is removed by ashing to form the via opening 31a in the dielectric film 31 in which the coil conductor 12 is exposed. At this time, as necessary, the dielectric film 31 on the wafer cutting line (chip cutting surface), described later, may be removed at the same time. When the dielectric film 31 is separated into pieces, the film stress of the dielectric film 31 can be spread. Then, as shown in FIG. 4C, the photosensitive resin layer 82 is removed.

Figure 5A:
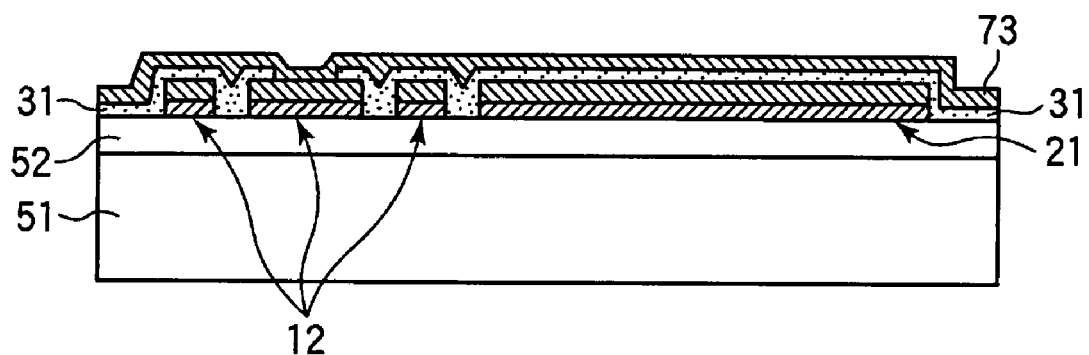
FIGS. 5A to 5C show cross sections depicting a method of fabricating the electronic component 1 according to the first embodiment of the invention (fourth one)

Subsequently, as shown in FIG. 5A, for example, titanium (Ti) having a film thickness of about 30 (nm) and copper (Cu) having a film thickness of about 100 (nm) are in turn laminated on throughout the surface by sputtering to form a conductor 73 for forming the upper conductor. The conductor 73 for forming the upper conductor may be formed by a film deposition process such as vapor deposition using a vacuum deposition apparatus.

Figure 5B:
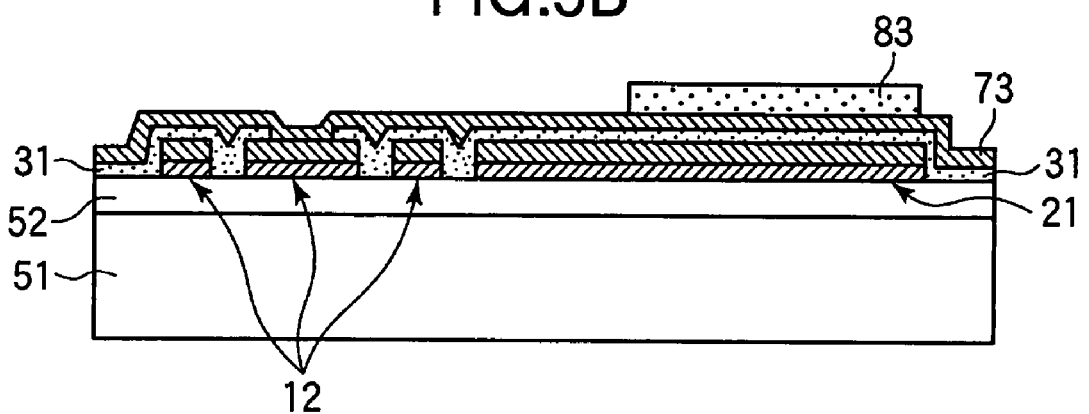

Then, for example, a photosensitive resin having a thickness of about 3 (μm) is applied to throughout the surface of the conductor 73 for forming the upper conductor by spin coating to form the photosensitive resin layer 83. Subsequently, as shown in FIG. 5B, the photosensitive resin layer 83 is exposed and developed, and the photosensitive resin layer 83 is left only on the portion for the upper conductor 23 of the conductor 73 for forming the upper conductor.

Figure 5C:
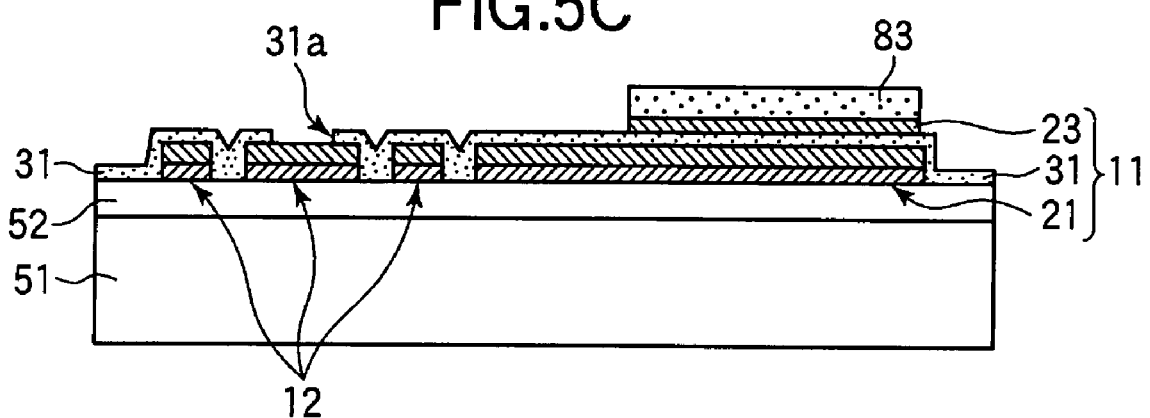

Then, as shown in FIG. 5C, the conductor 73 for forming the upper conductor except the portion under the photosensitive resin layer 83 is removed by dry etching or wet etching. Thus, the upper conductor (second conductor) 23 configured of the conductor 73 for forming the upper conductor under the photosensitive resin layer 83 is formed. By the process steps described above, the capacitor element (capacitative element) 11 configured of the lower conductor 21, the dielectric film 31 and the upper conductor 23 is formed.

Figure 6A:
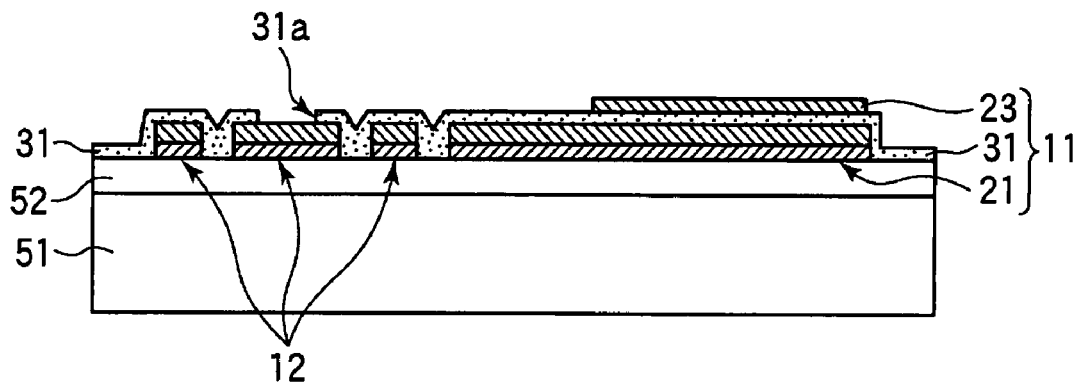
FIGS. 6A to 6C show cross sections depicting a method of fabricating the electronic component 1 according to the first embodiment of the invention (fifth one)
Figure 6B:
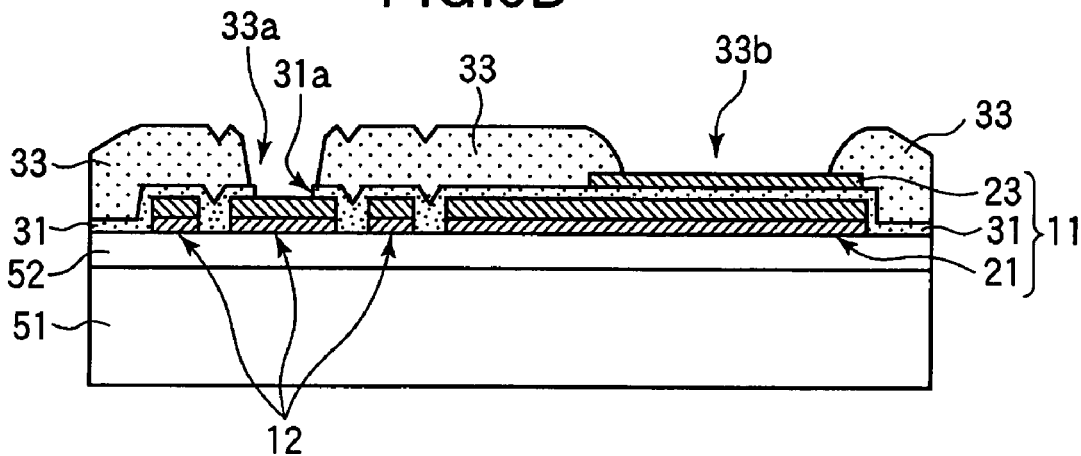

Subsequently, as shown in FIG. 6A, the photosensitive resin layer 83 on the upper conductor 23 is removed. Then, for example, a photosensitive resin for semiconductors having a film thickness of about 7 to 8 ($\mu$m) is applied to throughout the surface to form the insulating film 33. Subsequently, the insulating film 33 is pre baked. Then, as shown in FIG. 6B, the insulating film 33 is exposed and developed, and the via opening 33a is formed in the insulating film 33 in which the via opening 31a is exposed. In addition, the opening 33b is formed in the insulating film 33 on the upper conductor 23 at the same time in which the upper conductor 23 is partially exposed. Subsequently, the insulating film 33 is post baked. Post bake causes the insulating film 33 to be cured and shrunk, and the film thickness of the insulating film 33 is about 5 ($\mu$m). In addition, as shown in FIG. 6B, the insulating film 33 around the via opening 33a and the opening 33b are formed in a tapered shape by cure and shrinkage. Laser, plasma ashing or wet etching may be used for working the openings 33a and 33b and grooves in the insulating film 33.

Figure 6C:
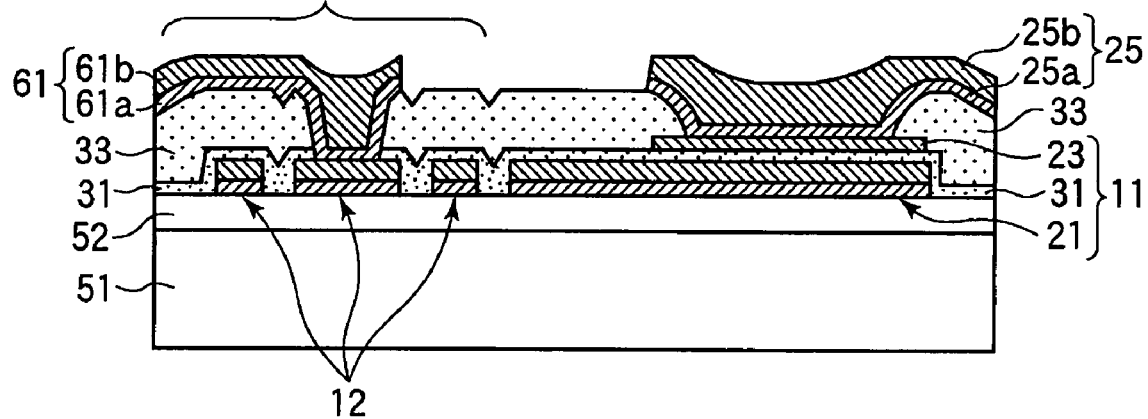

Then, as shown in FIG. 6C, the conductor 25 and the conductor 61 are formed by the same method of forming the lower conductor 21 and the coil conductor 12. Although the drawing is omitted, the description is made in more detail. For example, Ti having a film thickness of about 30 (nm) and Cu having a film thickness of about 100 (nm) are in turn laminated on throughout the surface by sputtering to form an underlying conductor. Subsequently, for example, a photosensitive resin having a thickness of about 8 (am) is applied to throughout the surface of the underlying conductor by spin coating to form a photosensitive resin layer.

Then, the photosensitive resin layer is exposed and developed, and an opening in the same shape as that of the conductor 25 and the conductor 61 is formed in the photosensitive resin layer.

Subsequently, a conductor of Cu having a thickness of about 8 ($\mu$m) is formed on the underlying conductor exposed in the opening by electrolytic plating to form the conductor 25b and the conductor 61b having a thickness of about 8 ($\mu$m). Then, the photosensitive resin layer is removed.

Subsequently, as shown in FIG. 6C, the underlying conductor exposed around and between the conductors 25b and 61b is removed by dry etching or wet etching to form the underlying conductor 25a configured of the underlying conductor under the conductor 25b and the underlying conductor 61a configured of the underlying conductor under the conductor 61b. Thus, the conductor (third conductor) 25 is formed in the layered structure in which the underlying conductor 25a and the conductor 25b are laminated on the upper conductor 23 in the opening 33b and on the insulating film 33, and the conductor 61 is formed in the layered structure in which the underlying conductor 61a and the conductor 61b are laminated in the via openings 31a and 33a and on the insulating film 33.

Figure 7:
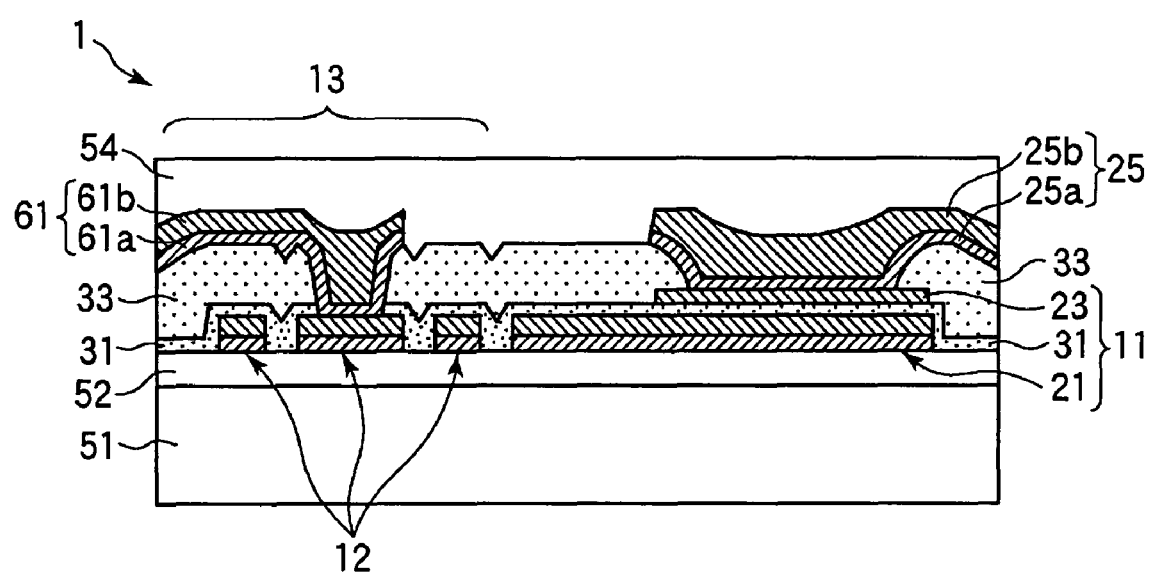
FIG. 7 shows a cross section depicting a method of fabricating the electronic component 1 according to the first embodiment of the invention (sixth one)

By the process steps described above, the inductor element 13 configured of the coil conductor 12 and the conductor 61 is formed. Then, as shown in FIG. 7, an alumina protective film 54 having a thickness of about 30 ($\mu$m) is formed throughout the surface.

Subsequently, the wafer is cut along a predetermined cutting line, and a plurality of the electronic components 1 formed on the wafer is separated into a chip shape for every device forming area. Then, although the drawing is omitted, external electrodes electrically connected to the conductor 25 and the conductor 61 exposed in the cut surface are formed on the cut surface. Before or after the external electrodes are formed, corners are chamfered as necessary to complete the electronic component 1.

In accordance with the method of fabricating the electronic component 1 according to the embodiment, as shown in FIGS. 6B and 6C, at the time when the conductor 25 and the conductor 61 are formed, the coil conductor 12, the lower conductor 21, the upper conductor 23 and the dielectric film 31 are covered with the insulating film 33. Thus, the insulating film 33 functions as the protective film at the time when the conductor 25 and the conductor 61 are formed, and the conductors 12, 21 and 23 and the dielectric film 31 do not suffer from damages caused by etching of the underlying conductor, for example. Therefore, different from the thin film capacitor 811 disclosed in Patent Reference 2, since the upper conductor 23 is not etched at the time when the conductor 25 and the conductor 61 are formed, the upper conductor 23 can be formed in a desired shape and dimensions, and the electrode area of the capacitor element 11 can be made highly accurately, whereby the capacitance value of the capacitor element 11 can be made highly precisely. In addition, since the side surfaces of the lower conductor 21 and the dielectric film 31 and so on are not etched at the time when the conductor 25 and the conductor 61 are formed, a short circuit between the lower conductor 21 and the upper conductor 23 can be prevented.

In addition, since the dielectric film 31 is formed to cover throughout the top and the side surface of the lower conductor 21 and the coil conductor 12 and functions as the protective film, electromigration does not occur even though an organic material is used for the insulating film 33. Therefore, the process steps of forming the conductor of Ni or Ti on the lower conductor 21 and the coil conductor 12 are eliminated. In addition, the lower conductor 21 and the coil conductor 12 of the capacitor element 11 are formed in the same process steps at the same time, and the conductor 25 and the conductor 61 are formed in the same process steps at the same time. Therefore, the number of the fabrication process steps can be reduced, and the electronic component 1 can be fabricated at low costs. In addition, since the insulating properties of the insulating film 33 can be secured, the yield of the electronic component 1 is enhanced, and it is intended to provide the electronic component 1 at low costs.

Electronic components according to exemplary modifications of the embodiment will be described with reference to FIGS. 8A to 11B. In the description below, components that exert the same function and operation as those of the first embodiment are designated the same numerals and signs, omitting the detailed descriptions.

Exemplary Modification 1

Figure 8A:
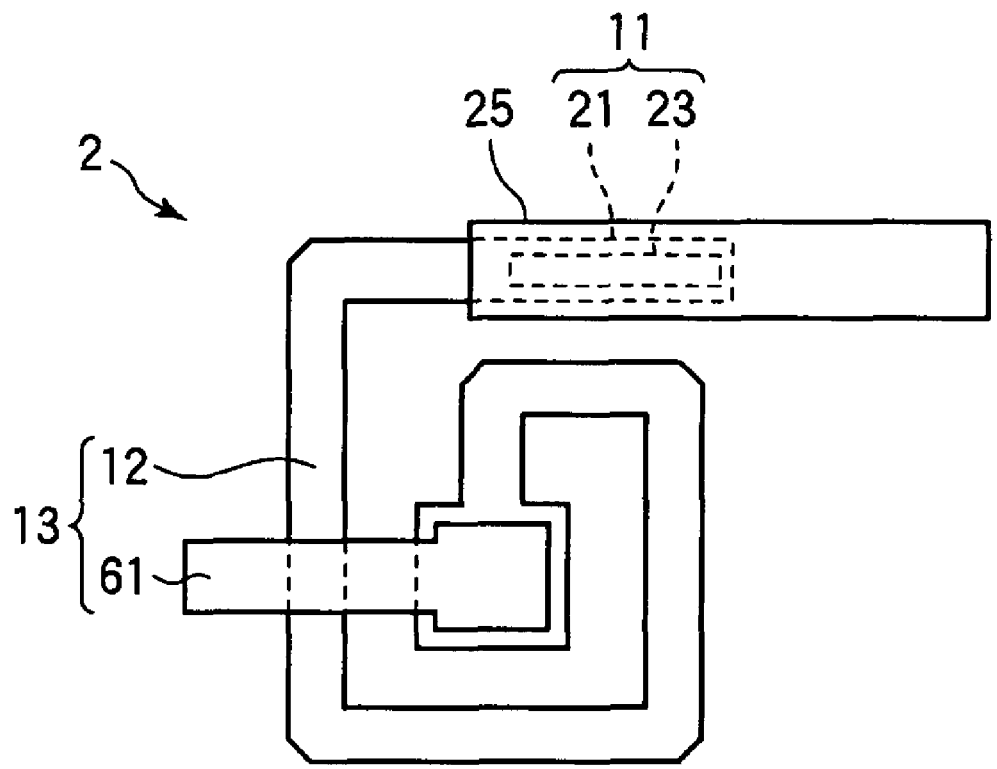
FIGS. 8A and 8B show diagrams depicting an exemplary modification of the electronic component 1 according to the first embodiment of the invention.
Figure 8B:
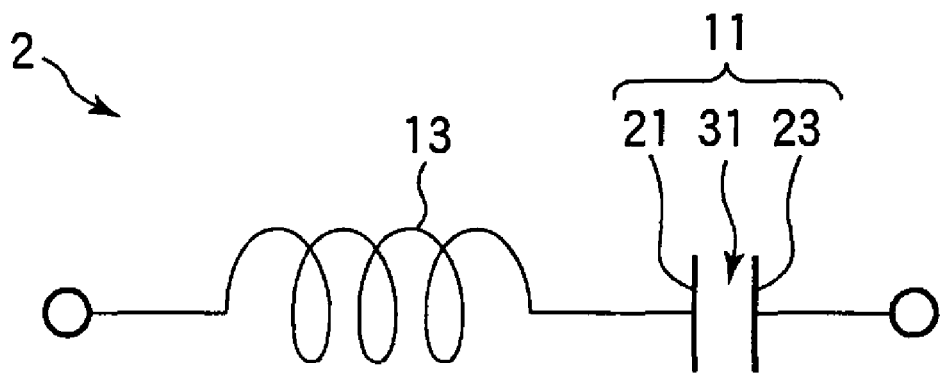

First, an electronic component 2 according to an exemplary modification 1 of the embodiment will be described with reference to FIGS. 8A and 8B. FIG. 8A shows a plan view depicting the electronic component 2 according to the exemplary modification showing only a conductor part, and FIG. 8B shows an equivalent circuit of the electronic component 2. As shown in FIG. 8A, in the electronic component 2, the conductor of the end part on the outer radius side of a coil conductor 12 in a spiral shape partially functions as a lower conductor 21 of a capacitor element 11. As shown in FIG. 8B, the capacitor element 11 is serially connected to an inductor element 13 to configure a series resonant circuit. A conductor 61 and a conductor 25 are current carrying terminals. The configuration of the electronic component 2 except the points above is the same as that of the electronic component 1, omitting the descriptions.

Exemplary Modification 2

Figure 9A:
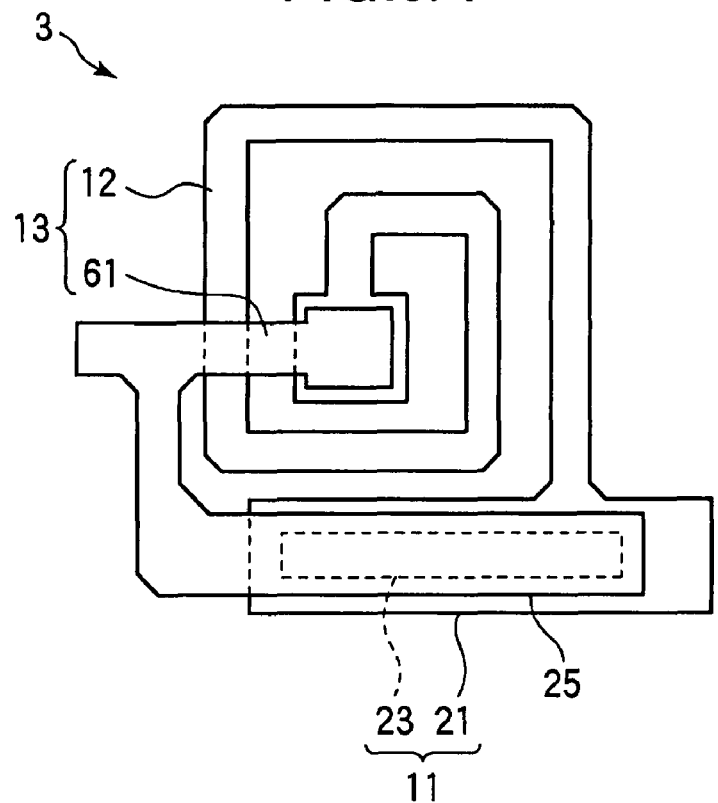
FIGS. 9A and 9B show diagrams depicting an exemplary modification of the electronic component 1 according to the first embodiment of the invention.
Figure 9B:
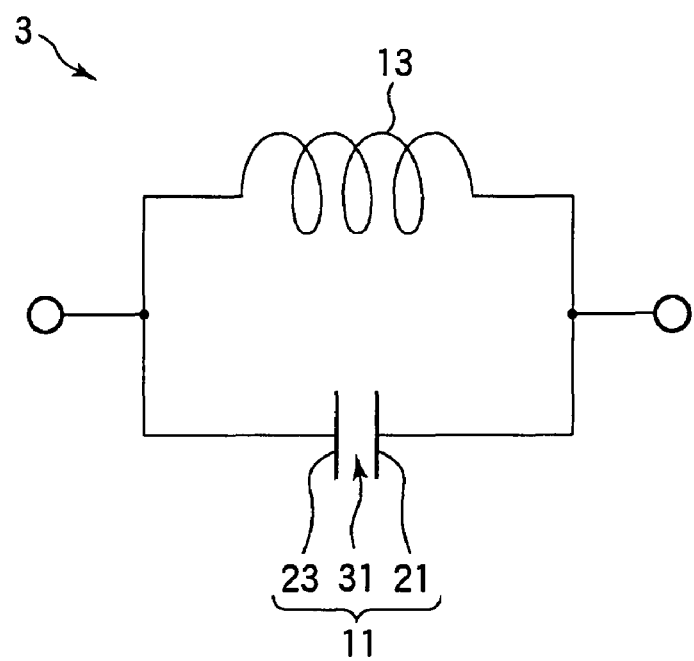

Subsequently, an electronic component 3 according to an exemplary modification 2 of the embodiment will be described with reference to FIGS. 9A and 9B. FIG. 9A shows a plan view depicting the electronic component 3 according to the exemplary modification, showing only a conductor part, and FIG. 9B shows an equivalent circuit diagram depicting the electronic component 3. As shown in FIG. 9A, an inductor element 13 has a coil conductor 12 in a spiral shape, and a rectangular conductor 61 which is connected at the end part on the inner radius side of the coil conductor 12 and laterally extended in the drawing. A capacitor element 11 has a rectangular lower conductor 21 which is formed in one piece with the coil conductor 12, connected at the end part on the outer radius side of the coil conductor 12 and laterally extended in the drawing, a dielectric film 31 which is formed on the lower conductor 21, and an upper conductor 23 which is formed on the dielectric film 31. To the upper conductor 23, an L-shaped conductor 25 is connected which is formed in one piece with a conductor 61 and arranged on the lower conductor 21 as faced thereto. As shown in FIG. 9B, the capacitor element 11 and the inductor element 13 are connected in parallel to configure a parallel resonant circuit. The conductor 25 is electrically connected to the conductor 61. The conductor 61 and the lower conductor 21 are current carrying terminals. The configuration of the electronic component 3 except the points above is the same as that of the electronic component 1, omitting the descriptions.

Exemplary Modification 3

Figure 10A:
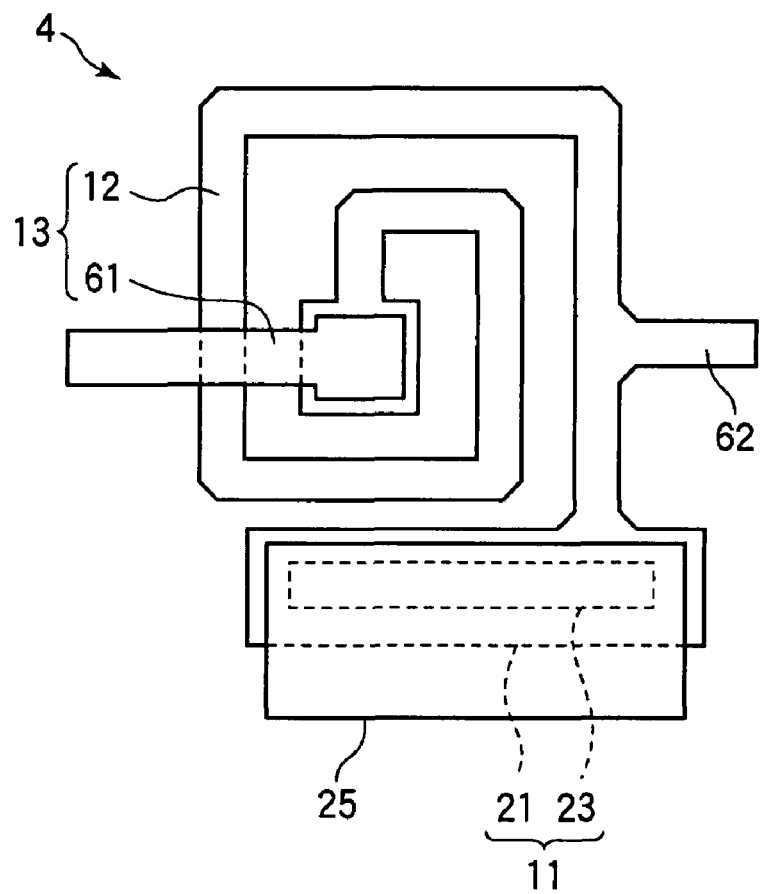
FIGS. 10A and 10B show diagrams depicting an exemplary modification of the electronic component 1 according to the first embodiment of the invention.
Figure 10B:
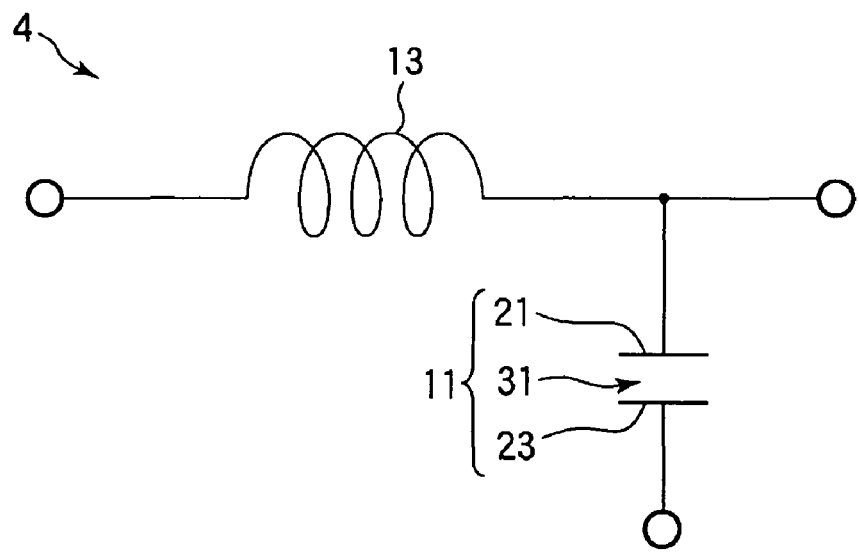

Then, an electronic component 4 according to an exemplary modification 3 of the embodiment will be described with reference to FIGS. 10A and 10B. FIG. 10A shows a plan view depicting the electronic component 4 according to the exemplary modification, showing only a conductor part, and FIG. 10B shows an equivalent circuit diagram depicting the electronic component 4. As shown in FIG. 10A, an inductor element 13 has a coil conductor 12 in a spiral shape, and a rectangular conductor 61 which is connected at the end part on the inner radius side of the coil conductor 12 and laterally extended in the drawing. A capacitor element 11 has a rectangular lower conductor 21 which is formed in one piece with the coil conductor 12, connected at the end part on the outer radius side of the coil conductor 12 and laterally extended in the drawing, a dielectric film 31 which is formed on the lower conductor 21, and an upper conductor 23 which is formed on the dielectric film 31. To the upper conductor 23, a rectangular conductor 25 is connected which is arranged on the lower conductor 21 as faced thereto. As shown in FIG. 10B, the inductor element 13 and the capacitor element 11 configure a low pass filter. The conductor 61 is a terminal on the input side. In addition, a lead conductor 62 which is lead out near the end part on the outer radius side of the coil conductor 12 is a terminal on the output side. The conductor 25 is a terminal for connecting ground. The configuration of the electronic component 4 except the points above is the same as that of the electronic component 1, omitting the descriptions.

Exemplary Modification 4

Figure 11A:
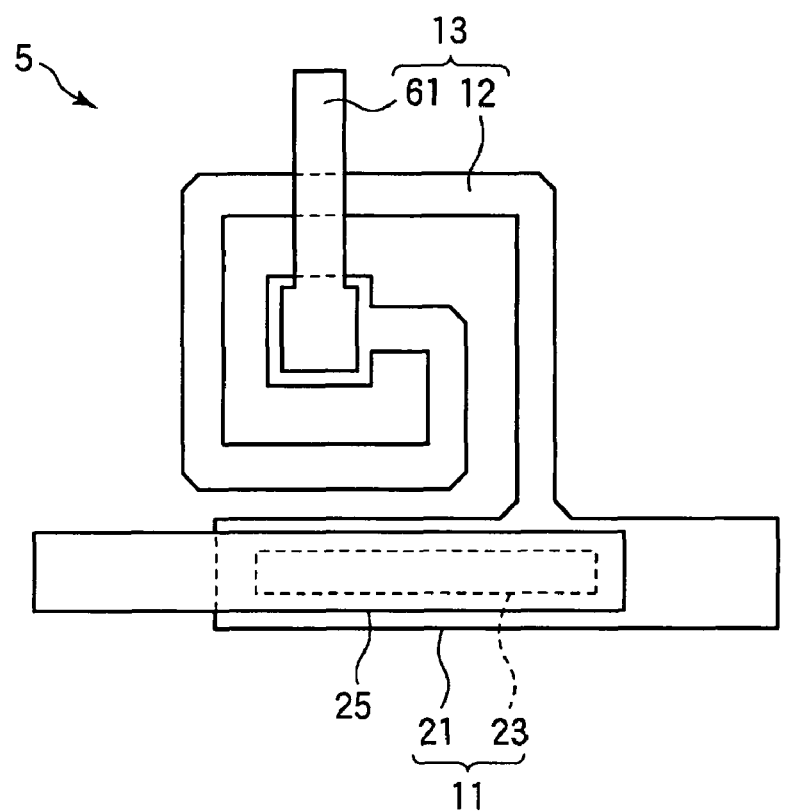
FIGS. 11A and 11B show diagrams depicting an exemplary modification of the electronic component 1 according to the first embodiment of the invention.
Figure 11B:
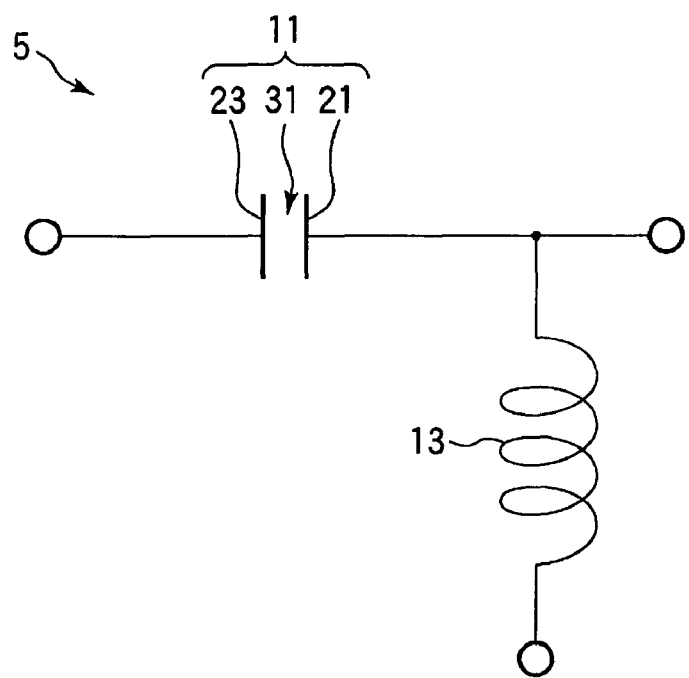

Next, an electronic component 5 according to an exemplary modification 4 of the embodiment will be described with reference to FIGS. 11A and 11B. FIG. 11A shows a plan view depicting the electronic component 5 according to the exemplary modification, showing only a conductor part, and FIG. 11B shows an equivalent circuit diagram depicting the electronic component 5. As shown in FIG. 11A, an inductor element 13 has a coil conductor 12 in a spiral shape, and a rectangular conductor 61 which is connected at the end part on the inner radius side of the coil conductor 12 and vertically extended in the drawing. A capacitor element 11 has a rectangular lower conductor 21 which is formed in one piece with the coil conductor 12, connected at the end part on the outer radius side of the coil conductor 12 and laterally extended in the drawing, a dielectric film 31 which is formed on the lower conductor 21, and an upper conductor 23 which is formed on the dielectric film 31. To the upper conductor 23, a rectangular conductor 25 is connected which is arranged on the lower conductor 21 as faced thereto. As shown in FIG. 11B, the inductor element 13 and the capacitor element 11 configure a high pass filter. The conductor 25 is a terminal on the input side, and the lower conductor 21 is a terminal on the output side. The conductor 61 is a terminal for connecting ground. The configuration of the electronic component 5 except the points above is the same as that of the electronic component 1, omitting the descriptions.

Second Embodiment

Figure 12:
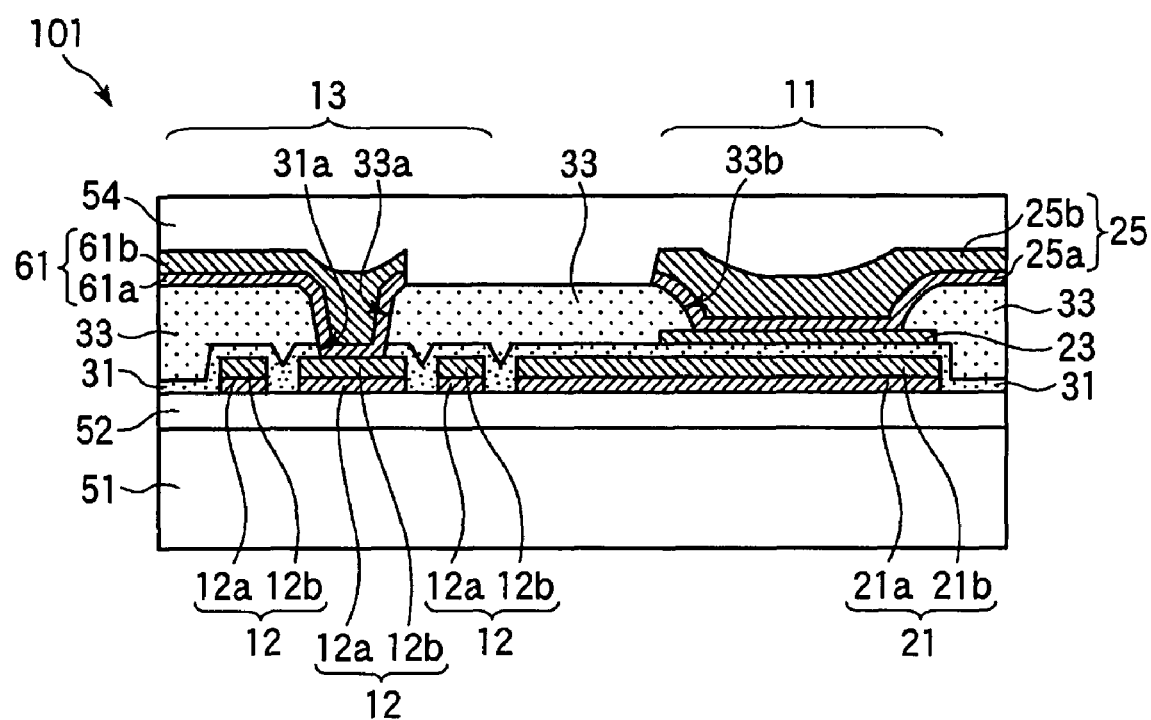
FIG. 12 shows a cross section depicting an electronic component 101 according to a second embodiment of the invention.
Figure 13A:
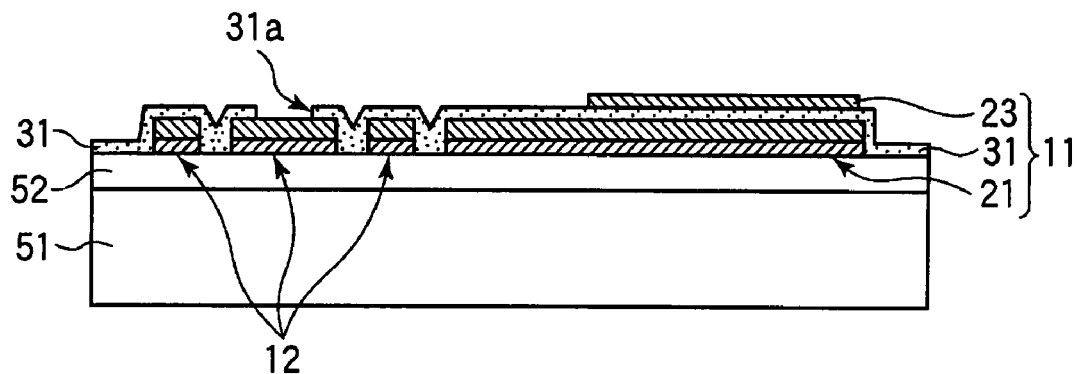
FIGS. 13A to 13C show cross section depicting a method of fabricating the electronic component 101 according to the second embodiment of the invention (first one)
Figure 13B:
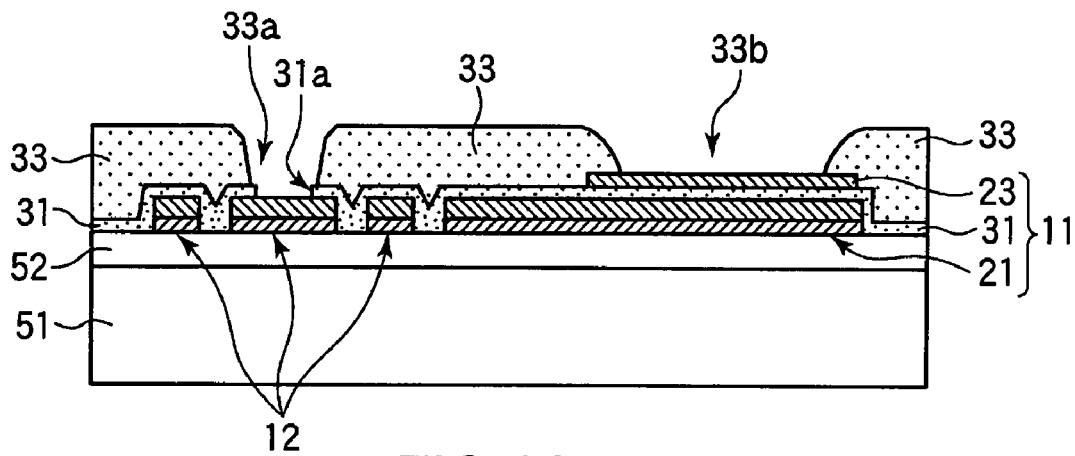

An electronic component and a method of fabricating the same according to a second embodiment of the invention will be described with reference to FIGS. 12 to 14. First, an electronic component 101 according to the embodiment will be described with reference to FIG. 12. FIG. 12 shows a cross section depicting the electronic component 101 according to the embodiment.

The electronic component 101 according to the embodiment is characterized in that the surface of an insulating film 33 is flat almost throughout the surface of a substrate 51 as compared with the electronic component 1 according to the first embodiment. The configuration of the electronic component 101 is the same as that of the electronic component 1 except that the insulating film 33 is flat almost throughout the surface of the substrate 51, omitting the descriptions.

In the electronic component 101 according to the embodiment, since the surface of the insulating film 33 is flat almost throughout the surface of the substrate 51 and the thickness distribution of the insulating film 33 is uniform, the distance between a lower conductor 21 and a conductor 25 which is formed on the insulating film 33 is constant almost throughout the surface of the substrate 51. Therefore, as compared with the electronic component 1 according to the first embodiment, electromagnetic coupling such as parasitic inductance and stray capacitance (parasitic capacitance) that occur between the lower conductor 21 and the conductor 25 which is formed on the insulating film 33 is more reduced. Accordingly, the capacitance value of a capacitor element 11 can be obtained more highly precisely. In addition, as compared with the electronic component 1, since ESR and ESL can be more reduced, the electric characteristics of the capacitor element 11 are improved.

In addition, as compared with the electronic component 1, since the thickness distribution of the insulating film 33 is uniform, insulation resistance between the lower conductor 21 and the conductor 25 can be maintained much higher, and the breakdown limit of the withstand voltage value and the insulating properties of the electronic component 101 are more improved.

In addition, since the surface of the insulating film 33 is flat almost throughout the surface of the substrate 51, the distance between the coil conductor 12 and a conductor 61 which is formed on the insulating film 33 is constant almost throughout the surface of the substrate 51. Therefore, as compared with the electronic component 1, stray capacitance that occurs between the coil conductor 12 and the conductor 61 which is formed on the insulating film 33 is more reduced. In addition, since the surface of the insulating film 33 is flat almost throughout the surface of the substrate 51, as compared with the electronic component 1, the electronic component 101 can be more easily formed in a super multilayer form. Moreover, the electronic component 101 according to the embodiment can obtain the same advantages as those of the electronic component 1 according to the first embodiment.

A method of fabricating the electronic component 101 according to the embodiment will be described with reference to FIGS. 13A to 14. Although a large number of the electronic components 101 are formed on a wafer at the same time, FIGS. 13A to 14 show the device forming area of a single electronic component 101. FIGS. 13A to 14 show cross sections depicting the fabrication process steps of the electronic component 101 according to the embodiment.

First, as shown in FIG. 13A, by the same fabricating method of the electronic component 1 according to the first embodiment, a coil conductor 12, a lower conductor (first conductor) 21 and a dielectric film 31 are formed on a planarized layer 52 of a substrate 51, a via opening 31a is formed in the dielectric film 31, and an upper conductor (second conductor) 23 is formed on the dielectric film 31 (see FIGS. 2A to 6A).

Then, for example, a photosensitive resin for semiconductors is applied to throughout the surface to form an insulating film 33 having a film thickness of about 7 to 8 (μm). Subsequently, the insulating film 33 is pre baked. Then, the insulating film 33 is exposed and developed, and a via opening 33a is formed in the insulating film 33 in which the via opening 31a is exposed. Moreover, the opening 33b is formed in the insulating film 33 on the upper conductor 23 at the same time in which the upper conductor 23 is partially exposed. Subsequently, the insulating film 33 is post baked. Then, as shown in FIG. 13B, the surface of the insulating film 33 is polished by CMP.

Figure 13C:
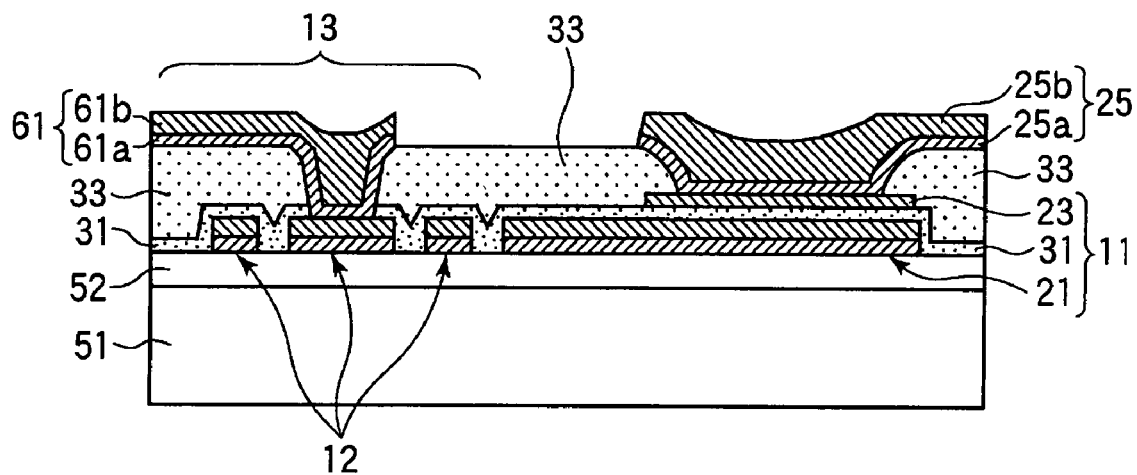
Figure 14:
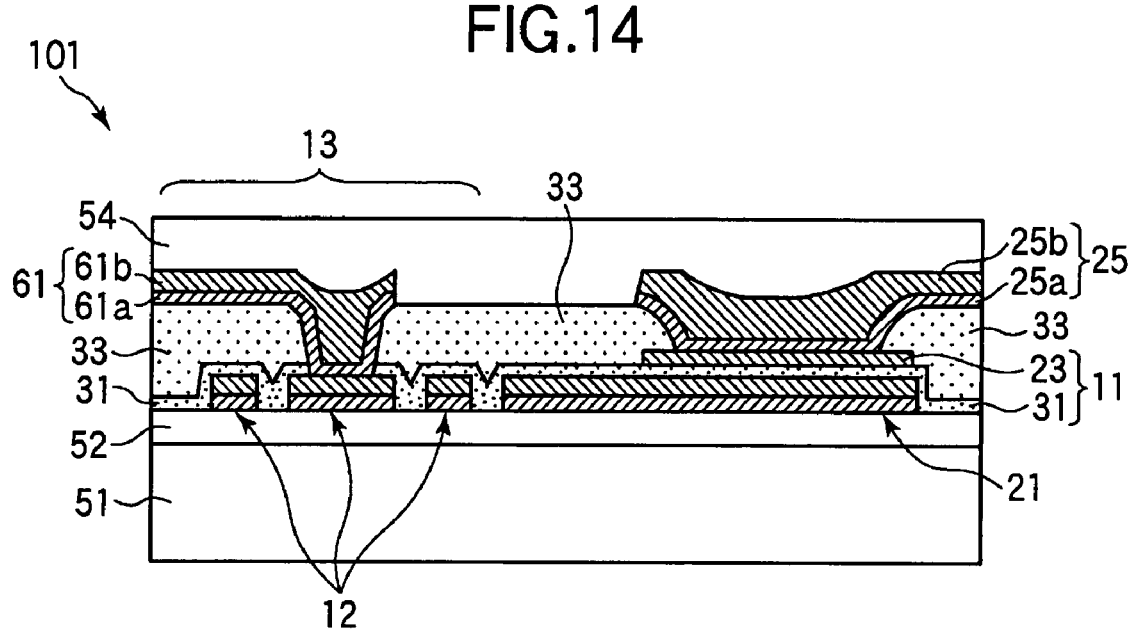
FIG. 14 shows a cross section depicting a method of fabricating the electronic component 101 according to the second embodiment of the invention (second one)

Subsequently, as shown in FIG. 13C, the conductor 25 and the conductor 61 are formed by the same fabricating method of the electronic component 1 according to the first embodiment (see FIG. 6C). Then, as shown in FIG. 14, the alumina protective film 54 having a thickness of about 30 (μm) is formed throughout the surface.

Subsequently, the wafer is cut along a predetermined cutting line, a plurality of the electronic components 101 which is formed on the wafer is separated into a chip shape for every device forming area. Although the drawing is omitted, external electrodes electrically connected to the conductor 25 and the conductor 61 exposed in the cut surface are then formed on the cut surface. Before or after the external electrodes are formed, corners are chamfered as necessary to complete the electronic component 101. In accordance with the method of fabricating the electronic component 101 according to the embodiment, the same advantages as those of the method of fabricating the electronic component 1 according to the first embodiment can be obtained.

Third Embodiment

Figure 15:
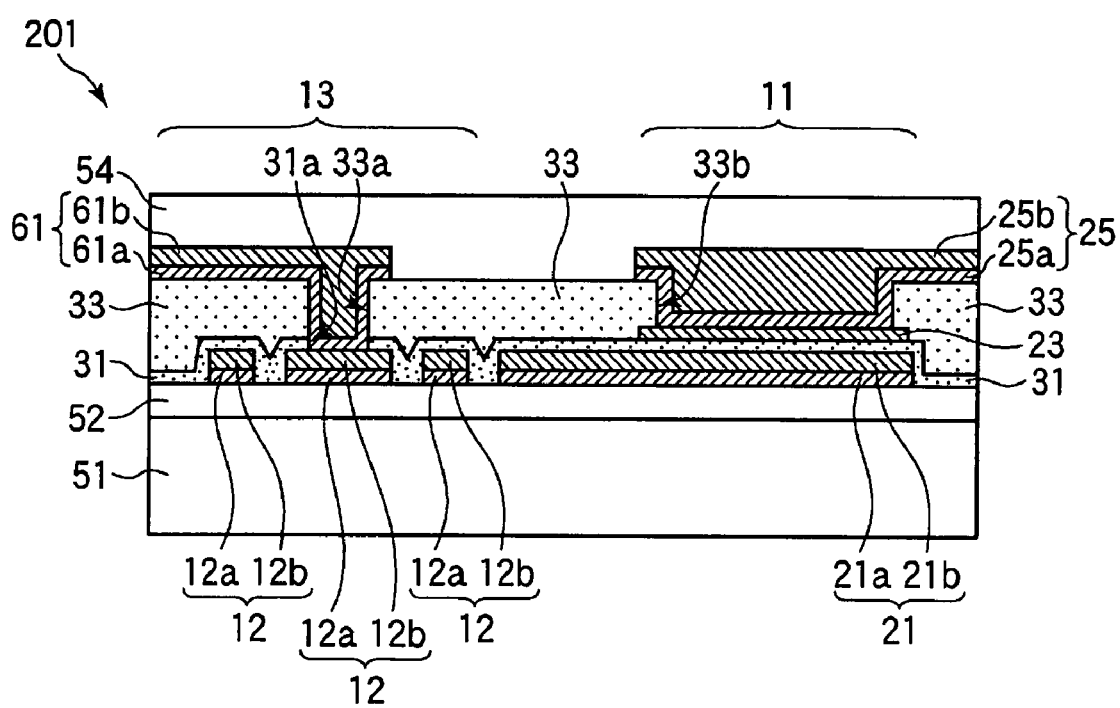
FIG. 15 shows a cross section depicting the electronic component 201 according to a third embodiment of the invention.

An electronic component and a method of fabricating the same according to a third embodiment of the invention will be described with reference to FIG. 15. FIG. 15 shows a cross section depicting an electronic component 201 according to the embodiment. In addition, in FIG. 15 and the drawings after that, the tapered shape of an insulating film 33 around openings 33a and 33b is omitted.

The electronic component 201 according to the embodiment is characterized in that the surfaces of conductors 25 and 61 are flat almost throughout the surface of a substrate 51 as compared with the electronic component 101 according to the second embodiment. The configuration of the electronic component 201 is the same as that of the electronic component 101 except that the surfaces of the conductors 25 and 61 are flat almost throughout the surface of the substrate 51, omitting the descriptions.

In the electronic component 201 according to the embodiment, since the surfaces of the conductors 25 and 61 are flat almost throughout the surface of the substrate 51, as compared with the electronic components 1 and 101, the electronic component 201 can be more easily formed in a super multilayer form. For example, a dielectric film 31, an upper conductor 23 and the conductor 25 are alternately laminated on a conductor 25, whereby a capacitor element 11 of high capacitance can be obtained.

In addition, the area of the upper conductor to be formed on the conductor 25 may be formed larger than the area of the upper conductor 23, and the electrode area of the capacitor element to be laminated on the capacitor element 11 may be formed larger than the electrode area of the capacitor element 11. As described above, in the capacitor element in which a plurality of capacitor elements is laminated, each of the electrode areas of the capacitor elements can be formed larger than the capacitor element in the lower layer. Therefore, a plurality of the capacitor elements is further laminated on the capacitor element 11, whereby a layered capacitor element of higher capacitance can be obtained. In addition, in the capacitor element in which a plurality of capacitor elements is laminated, the electrode area of the capacitor element in each layer can be laid out freely. In addition, the electronic component 201 according to the embodiment can obtain the same advantages as those of the electronic component 101 according to the second embodiment.

A method of fabricating the electronic component 201 according to the embodiment will be described briefly. The method of fabricating the electronic component 201 is the same as the method of fabricating the electronic component 101 shown in FIGS. 13A to 14 except the process steps forming the conductor 25 and the conductor 61.

Although the drawing is omitted, the process steps forming the conductor 25 and the conductor 61 will be described. For example, Ti having a film thickness of about 30 nm and Cu having a film thickness of about 100 nm are in turn laminated on throughout the surface by sputtering to form an underlying conductor. Then, for example, a photosensitive resin having a thickness of about 8 μm is applied to throughout the surface of the underlying conductor by spin coating to form a photosensitive resin layer.

Subsequently, the photosensitive resin layer is exposed and developed, and an opening in the same shape as that of the conductor 25 and the conductor 61 is formed in the photosensitive resin layer.

Then, a conductor of Cu having a thickness of 9 to 10 (μm) is formed on the underlying conductor exposed in the opening by electrolytic plating, and the surface of the conductor is polished by CMP polishing to form a conductor 25b and a conductor 61b having a thickness of about 8 (μm). Subsequently, the photosensitive resin layer is developed and removed.

Then, the underlying conductor exposed around and between the conductors 25b and 61b is removed by dry etching or wet etching to form an underlying conductor 25a configured of the underlying conductor under the conductor 25b and an underlying conductor 61a configured of the underlying conductor under the conductor 61b. Thus, the conductor (third conductor) 25 is formed in the layered structure in which the underlying conductor 25a and the conductor 25b are laminated, and the conductor 61 is formed in the layered structure in which the underlying conductor 61a and the conductor 61b are laminated. In accordance with the method of fabricating the electronic component 201 according to the embodiment, the same advantages as those of the method of fabricating the electronic component 1 according to the first embodiment can be obtained.

Fourth Embodiment

Figure 16:
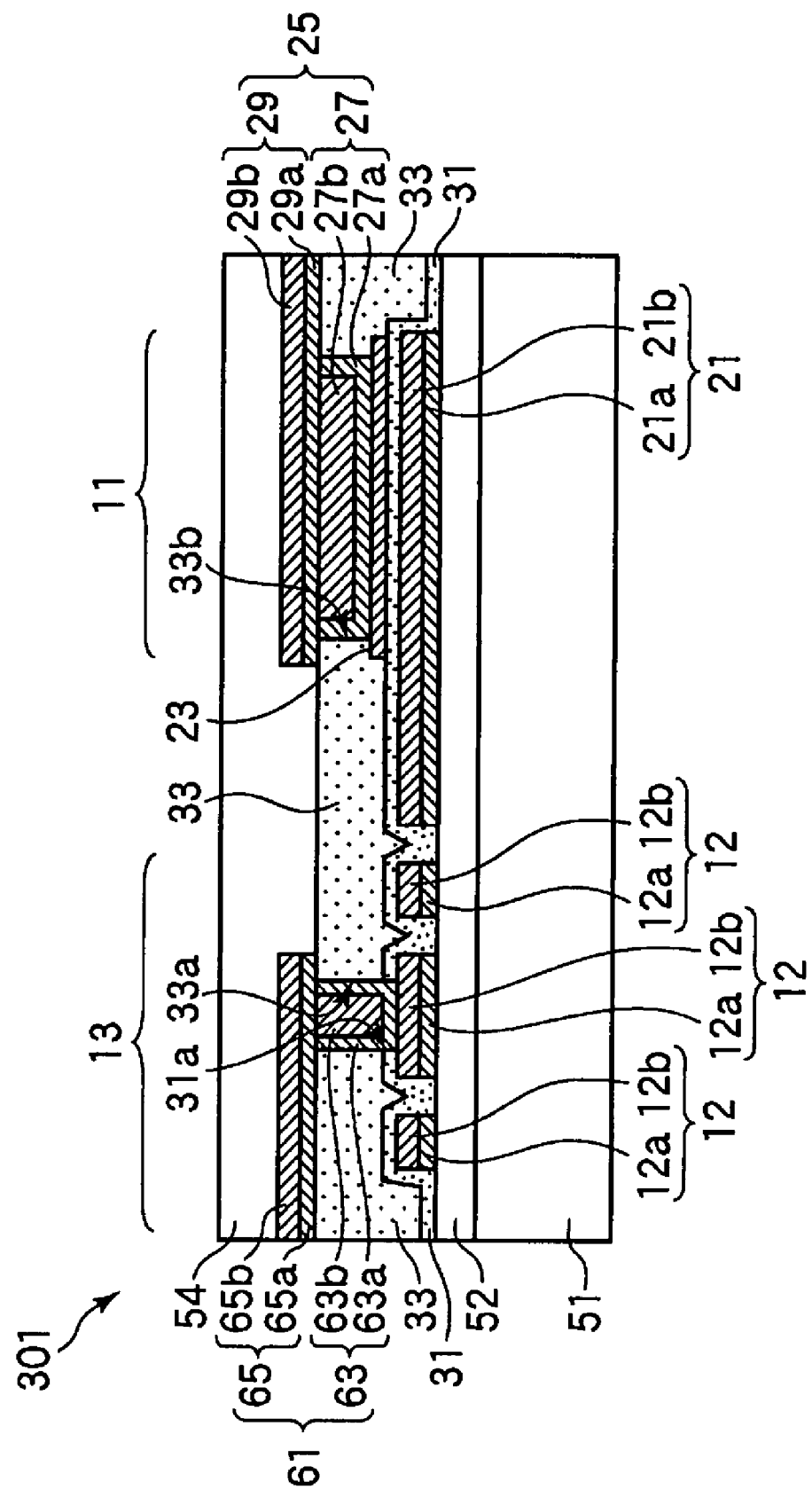
FIG. 16 shows a cross section depicting an electronic component 301 according to a fourth embodiment of the invention.

An electronic component according to a fourth embodiment of the invention will be described with reference to FIG. 16. FIG. 16 shows a cross section depicting an electronic component 301 according to the embodiment.

The electronic component 301 according to the embodiment is characterized in that a conductor 25 is configured of two layers, a column shaped conductor 27 which is formed in an opening 33b and a conductor 29 which is formed on an insulating film 33 from the upper part of the opening 33b to the rim part on the short side of the electronic component 1, and a conductor 61 is configured of two layers, a via conductor 63 which is formed in via openings 31a and 33a and a conductor 65 which is formed in a slim rectangular shape from the upper part of the via opening 33a to the rim part on the short side of the electronic component 301 as compared with the electronic component 201 according to the second embodiment.

Underlying conductors 27a and 63a of the column shaped conductor 27 and the via conductor 63 are formed on the bottom and the side part of each of the conductors. On the underlying conductors 27a and 63a, conductors 27b and 63b are formed. The conductor 29 is configured of an underlying conductor 29a which is formed on the column shaped conductor 27 and the insulating film 33 and an conductor 29b which is formed on the underlying conductor 29a. The conductor 65 is configured of an underlying conductor 65a which is formed on the via conductor 63 and the insulating film 33 and a conductor 65b which is formed on the underlying conductor 65a.

The configuration of the electronic component 301 is the same as that of the electronic component 201 except the points described above, omitting the descriptions. The electronic component 301 according to the embodiment can obtain the same advantages as those of the electronic component 201 according to the third embodiment.

Fifth Embodiment

Figure 17:
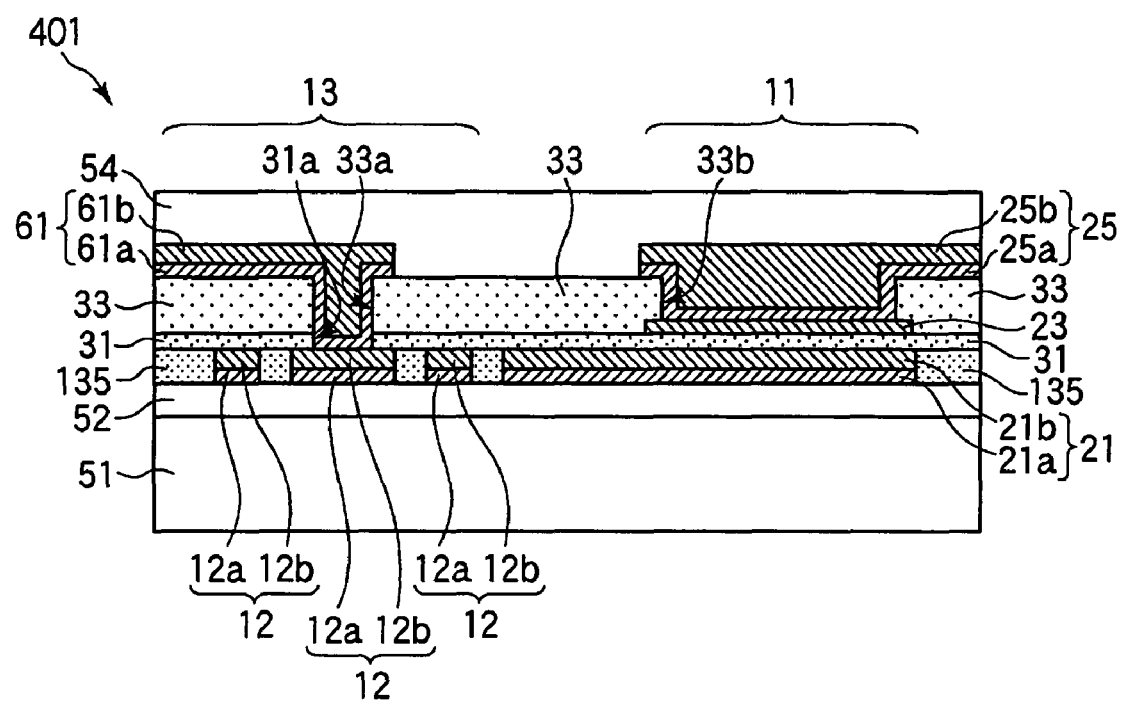
FIG. 17 shows a cross section depicting the electronic component 401 according to a fifth the embodiment of the invention.

An electronic component and a method of fabricating the same according to a fifth embodiment of the invention will be described with reference to FIGS. 17 to 22C. FIG. 17 shows a cross section depicting an electronic component 401 according to the embodiment.

The electronic component 401 according to the embodiment is characterized in that a dielectric film 31 is flat almost throughout the substrate surface of a substrate 51 as compared with the electronic component 201 according to the third embodiment. An insulating film 135 is formed around and in a space between a lower conductor 21 and a coil conductor 12.

For example, the insulating film 135 is formed of a photosensitive resin such as photosensitive polyimide. The film thickness of the insulating film 135 is almost equal to the thickness of the lower conductor 21 and the coil conductor 12, and the surfaces of the lower conductor 21, the coil conductor 12 and the insulating film 135 are formed smoothly. The dielectric film 31 is formed flat over almost throughout the surfaces of the lower conductor 21, the coil conductor 12 and the insulating film 135. The configuration of the electronic component 401 is the same as that of the electronic component 201 except that the surfaces of the lower conductor 21, the coil conductor 12 and the insulating film 135 are formed flat and that the dielectric film 31 is flat almost throughout the substrate surface of the substrate 51, omitting the descriptions.

In the electronic component 401 according to the embodiment, the insulating film 135 is formed in the same layer as the lower conductor 21 and the coil conductor 12 to have a flat surface. The dielectric film 31 is formed on the flat surface. Therefore, even though the dielectric film 31 is made thin, the film thickness of the dielectric film 31 is flat even at the end part of the lower conductor 21, and the insulating properties to the upper conductor 23 and the lower conductor 21 can be obtained. Accordingly, as compared with the electronic component 201 according to the third embodiment, the electronic component 401 can improve the breakdown limit of the withstand voltage value of the electronic component 1. Moreover, the electronic component 401 according to the embodiment can obtain the same advantages as those of the electronic component 201 according to the third embodiment.

A method of fabricating the electronic component 401 according to the embodiment will be described with reference to FIGS. 18A to 22C. Although a plurality of the electronic components 401 is formed on a wafer at the same time, FIG. 18A to 22C show the device forming area of a single electronic component 401. FIGS. 18A to 22C show cross sections depicting the fabrication process steps of the electronic component 401 according to the embodiment.

Figure 18A:
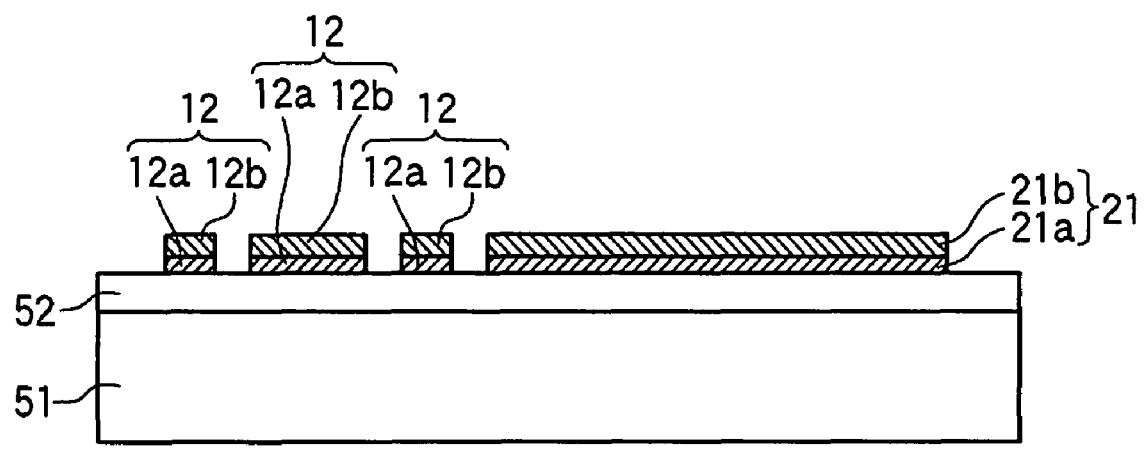
FIGS. 18A and 18B show cross sections depicting a method of fabricating the electronic component 401 according to the fifth embodiment of the invention (first one)

First, as shown in FIG. 18A, the coil conductor 12 and the lower conductor (first conductor) 21 are formed on a planarized layer 52 of the substrate 51 by the same method of fabricating the electronic component 1 according to the first embodiment (see FIGS. 2A to 3B).

Figure 18B:
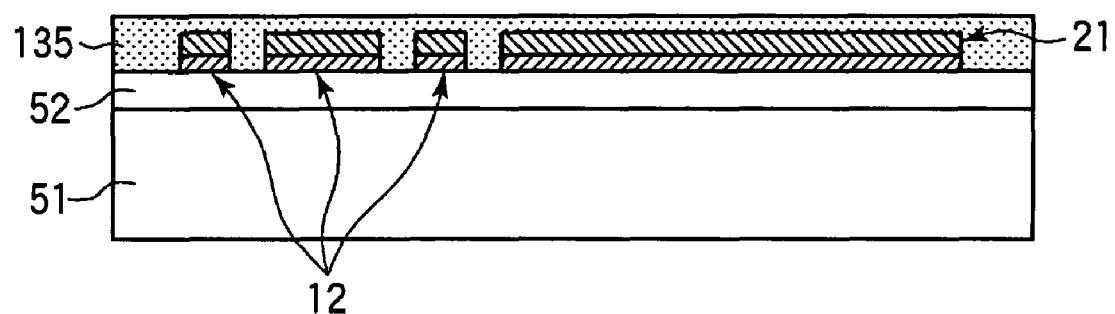
Figure 19A:
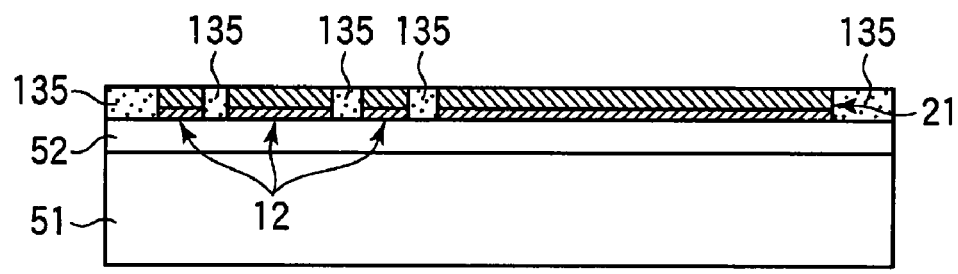
FIGS. 19A to 19C show cross sections depicting a method of fabricating the electronic component 401 according to the fifth embodiment of the invention (second one)

Then, as shown in FIG. 18B, for example, a photosensitive resin such as polyimide is applied to throughout the surface to form the insulating film 135. Subsequently, the insulating film 135 is post baked. Then, as shown in FIG. 19A, the surface of the insulating film 135 is polished by CMP until the surfaces of the lower conductor 21 and the coil conductor 12 are exposed, and the lower conductor 21, the coil conductor 12 and the insulating film 135 are formed to have a thickness of about 8 μm. In this manner, the surfaces of the lower conductor 21, the coil conductor 12 and the insulating film 135 are planarized.

Figure 19B:
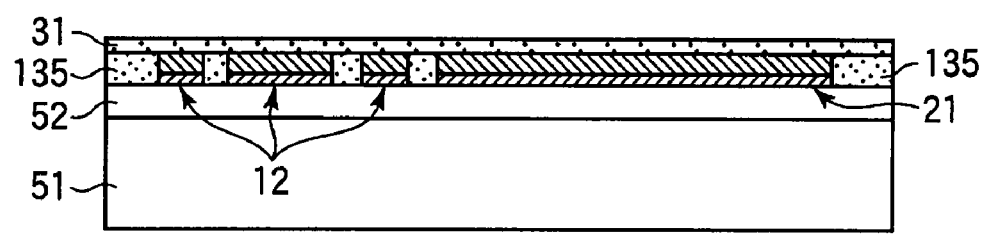

Subsequently, as shown in FIG. 19B, the dielectric film 31 having a thickness of about 0.1 μm is formed throughout the surface. For the material for forming the dielectric film 31, for example, alumina, silicon nitride ($Si_4N_3$), silicon dioxide ($SiO_2$), tantalum oxide ($Ta_2O_5$), aluminium nitride (AlN) or magnesium oxide (MgO) are used. Since the surfaces of the lower conductor 21, the coil conductor 12 and the insulating film 135 are flat, the dielectric film 31 is formed flat to cover throughout the top of the lower conductor 21, the coil conductor 12 and the insulating film 135.

Figure 19C:
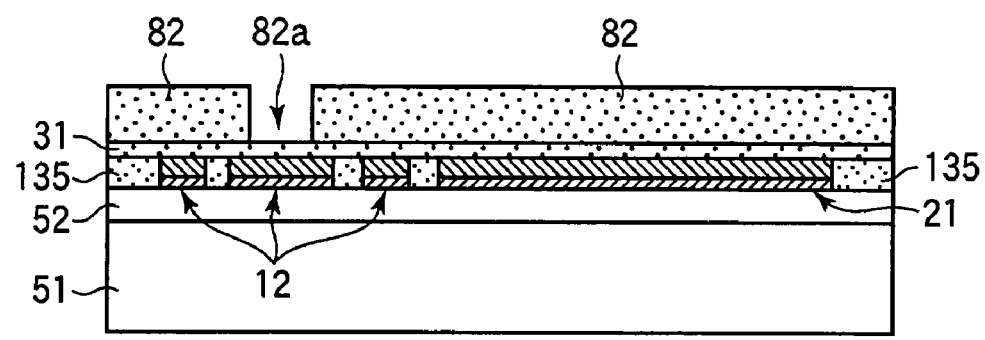

Then, a photosensitive resin is applied to throughout the surface of the dielectric film 31 to form a photosensitive resin layer 82. Subsequently, as shown in FIG. 19C, the photosensitive resin layer 82 is exposed and developed, and an opening 82a is formed in the photosensitive resin layer 82 on the end part on the inner radius side of the coil conductor 12. After that, the photosensitive resin layer 82 is post baked (heat treated).

Figure 20A:
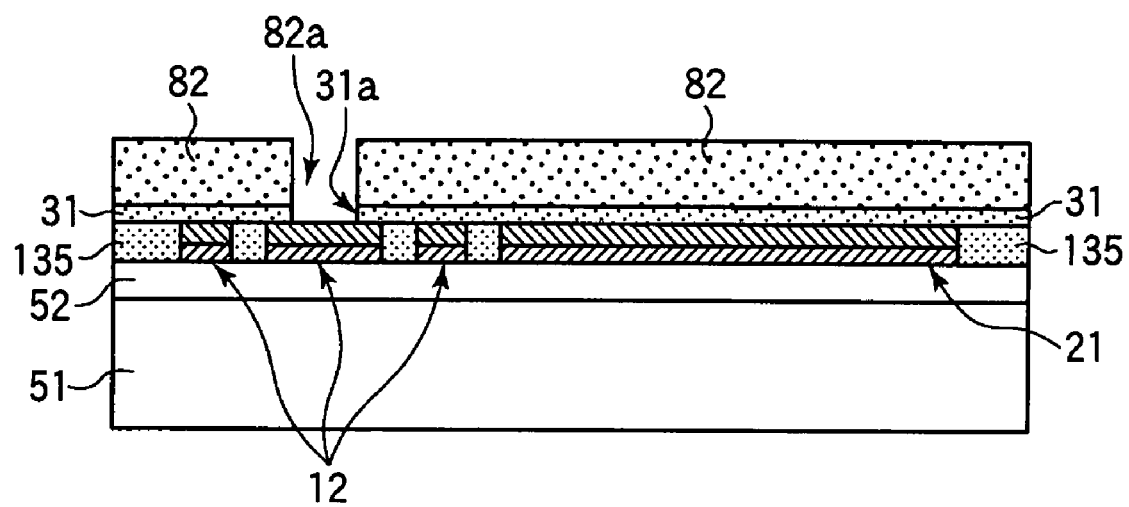
FIGS. 20A to 20C show cross sections depicting a method of fabricating the electronic component 401 according to the fifth embodiment of the invention (third one)
Figure 20B:
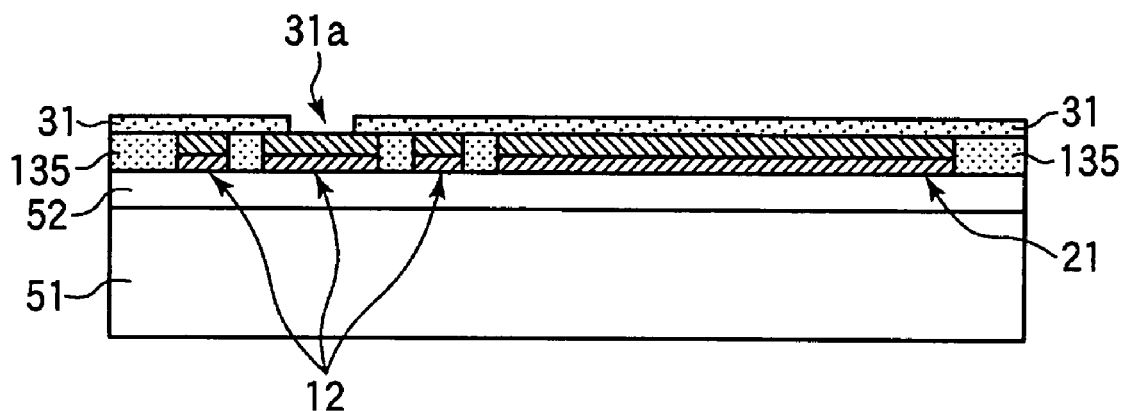

Then, as shown in FIG. 20A, the dielectric film 31 exposed in the opening 82a is removed by ashing to form a via opening 31a in the dielectric film 31 in which the coil conductor 12 is exposed. At this time, as necessary, the dielectric film 31 on the wafer cutting line (chip cutting surface), described later, may be removed at the same time. The dielectric film 31 is separated into pieces, and the film stress owed by the dielectric film 31 can be spread. After that, as shown in FIG. 20B, the photosensitive resin layer 82 is removed.

Figure 20C:
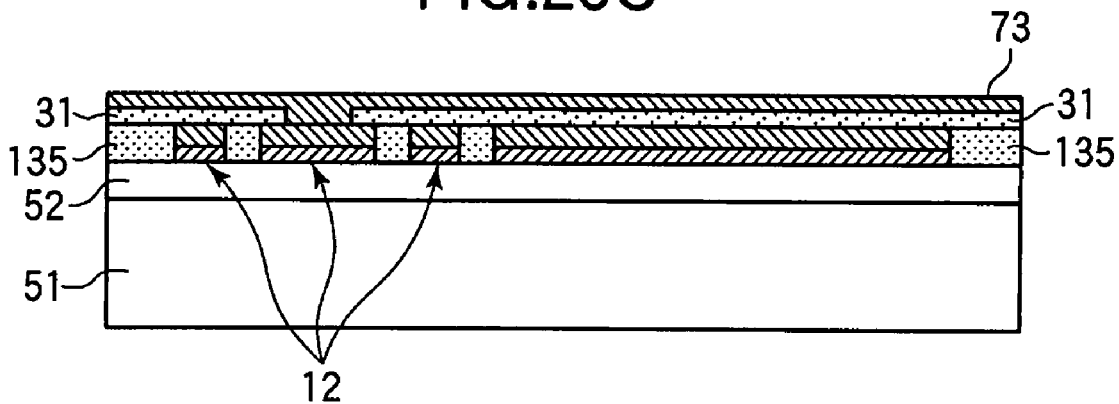

Subsequently, as shown in FIG. 20C, for example, titanium (Ti) having a film thickness of about 30 (nm) and copper (Cu) having a film thickness of about 100 (nm) are in turn laminated on throughout the surface by sputtering to form a conductor 73 for forming the upper conductor. The conductor 73 for forming the upper conductor may be formed by a film deposition process such as vapor deposition using a vacuum deposition apparatus.

Figure 21A:
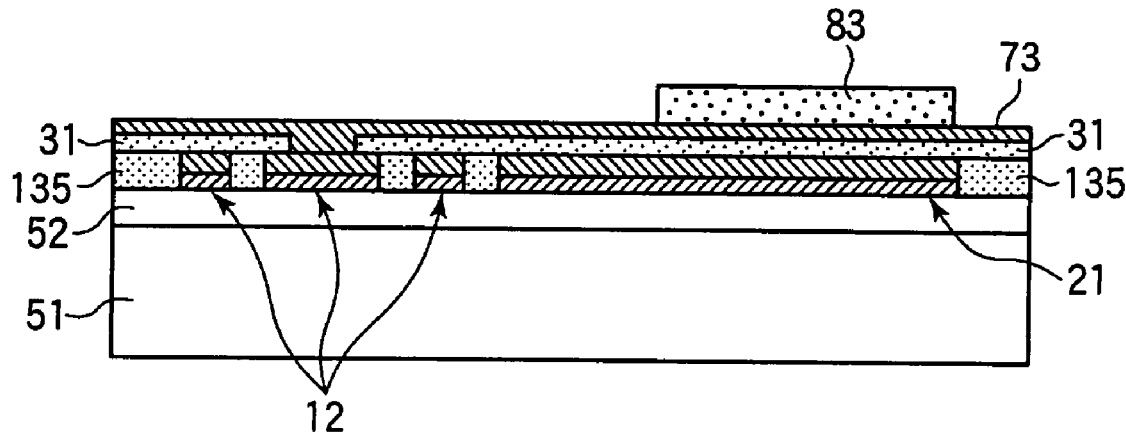
FIGS. 21A to 21C show cross sections depicting a method of fabricating the electronic component 401 according to the fifth embodiment of the invention (fourth one)

Then, for example, a photosensitive resin having a thickness of about 3 (μm) is applied to throughout the surface of the conductor 73 for forming the upper conductor by spin coating to form a photosensitive resin layer 83. Subsequently, as shown in FIG. 21A, the photosensitive resin layer 83 is exposed and developed, and the photosensitive resin layer 83 is left only on the portion to be the upper conductor 23 for the conductor 73 for forming the upper conductor.

Figure 21B:
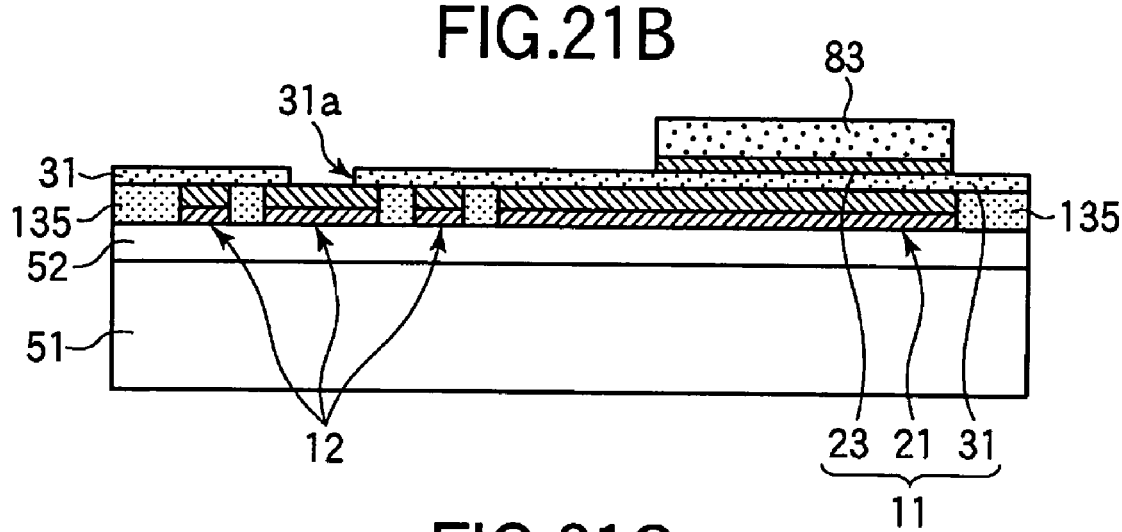

Then, as shown in FIG. 21B, the conductor 73 for forming the upper conductor except the portion under the photosensitive resin layer 83 is removed by dry etching or wet etching. Thus, the upper conductor (second conductor) 23 configured of the conductor 73 for forming the upper conductor under the photosensitive resin layer 83 is formed. By the process steps described above, the capacitor element (capacitive element) 11 is formed which is configured of the lower conductor 21, the dielectric film 31 and the upper conductor 23.

Figure 21C:
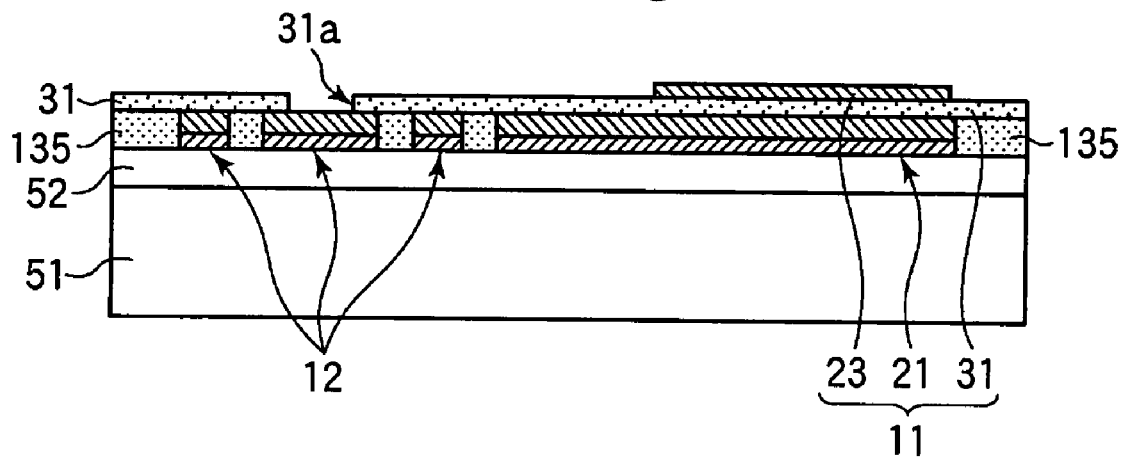
Figure 22A:
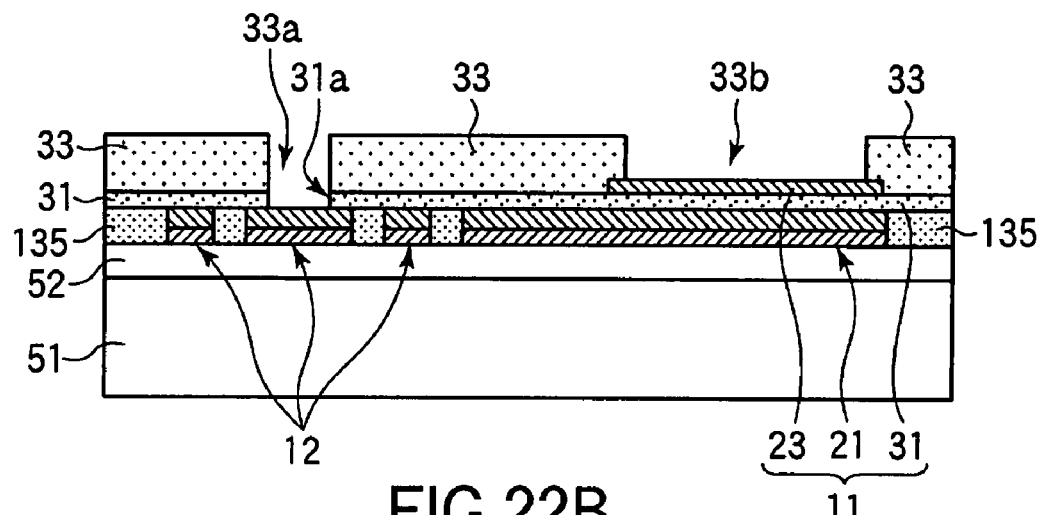
FIGS. 22A to 22C show cross sections depicting a method of fabricating the electronic component 401 according to the fifth embodiment of the invention (fifth one)

Subsequently, as shown in FIG. 21C, the photosensitive resin layer 83 on the upper conductor 23 is removed. Then, for example, a photosensitive resin for semiconductors is applied to throughout the surface to form an insulating film 33 having a film thickness of about 7 to 8 (μm). Subsequently, the insulating film 33 is pre baked. Then, as shown in FIG. 22A, the insulating film 33 is exposed and developed, and a via opening 33a is formed in the insulating film 33 in which the via opening 31a is exposed. Moreover, the opening 33b is formed in the insulating film 33 on the upper conductor 23 at the same time in which the upper conductor 23 is partially exposed. Subsequently, the insulating film 33 is post baked. Then, the surface of the insulating film 33 is polished by CMP polishing.

Figure 22B:
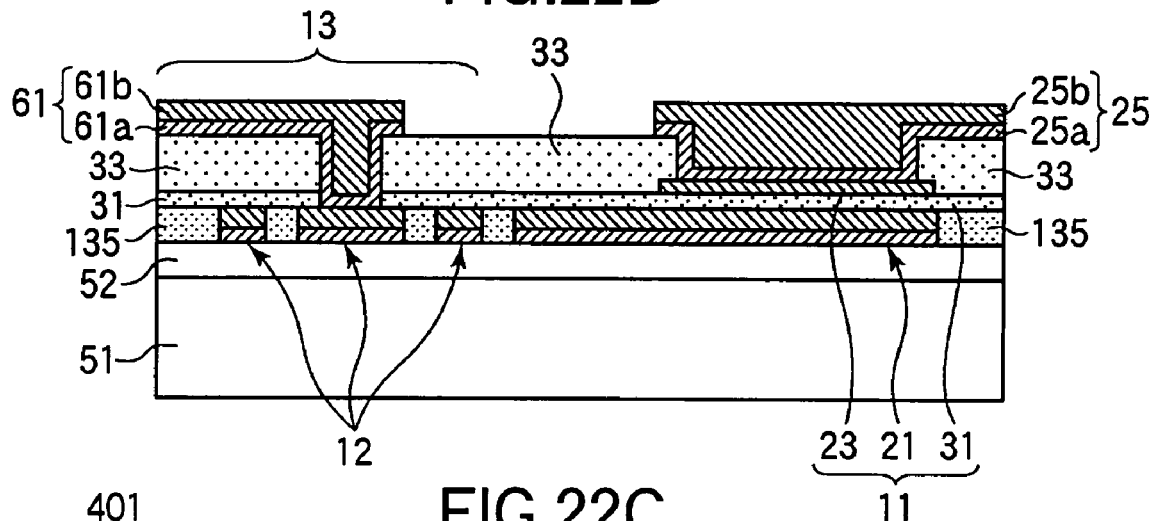

Subsequently, as shown in FIG. 22B, the conductor 25 and the conductor 61 are formed by the same method of forming the lower conductor 21 and the coil conductor 12. Although the drawing is omitted, the description is made in more detail. For example, Ti having a film thickness of about 30 (nm) and Cu having a film thickness of about 100 (nm) are in turn laminated on throughout the surface by sputtering to form an underlying conductor. Then, for example, a photosensitive resin having a thickness of about 8 (μm) is applied to throughout the surface of the underlying conductor by spin coating to form a photosensitive resin layer.

Subsequently, the photosensitive resin layer is exposed and developed, and an opening in the same shape as that of the conductor 25 and the conductor 61 is formed in the photosensitive resin layer.

Then, a conductor of Cu having a thickness of 9 to 10 (μm) is formed on the underlying conductor exposed in the opening by electrolytic plating, and the surface of the conductor is then polished by CMP polishing to form a conductor 25b and the conductor 61b having a thickness of about 8 (μm) Subsequently, the photosensitive resin layer is removed.

Then, as shown in FIG. 22B, the underlying conductor exposed around and between the conductors 25b and 61b is removed by dry etching or wet etching to form the underlying conductor 25a which is configured of the underlying conductor under the conductor 25b and the underlying conductor 61a configured of the underlying conductor under the conductor 61b. Thus, the conductor (the third conductor) 25 is formed in the layered structure in which the underlying conductor 25a and the conductor 25b are laminated on the upper conductor 23 and the insulating film 33 in the opening 33b, and the conductor 61 is formed in the layered structure in which the underlying conductor 61a and the conductor 61b are laminated in the via openings 31a and 33a and on the insulating film 33.

Figure 22C:
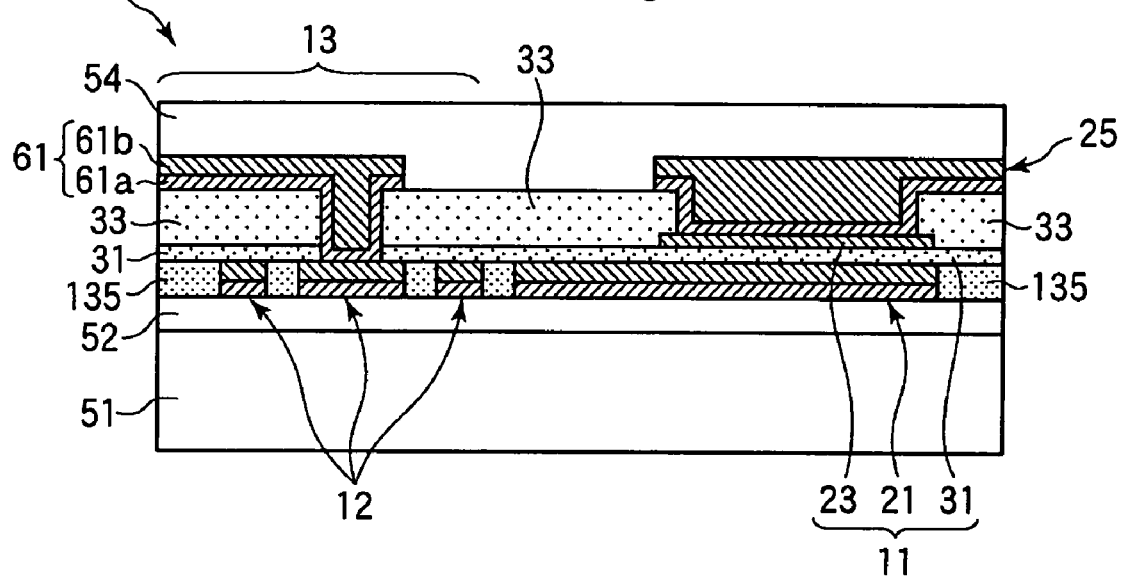

By the process steps described above, the inductor element 13 configured of the coil conductor 12 and the conductor 61 is formed. Subsequently, as shown in FIG. 22C, the alumina protective film 54 having a thickness of about 30 (μm) is formed throughout the surface.

After that, the wafer is cut along a predetermined cutting line, and a plurality of the electronic components 401 which is formed on the wafer is separated into a chip shape for every device forming area. Then, although the drawing is omitted, external electrodes electrically connected to the conductor 25 and the conductor 61 exposed in the cut surface are formed on the cut surface. Before or after the external electrodes are formed, corners are chamfered as necessary to complete the electronic component 401. In accordance with the method of fabricating the electronic component 401 according to the embodiment, the same advantages as those of the method of fabricating the electronic component 1 according to the first embodiment can be obtained.

Sixth Embodiment

Figure 23:
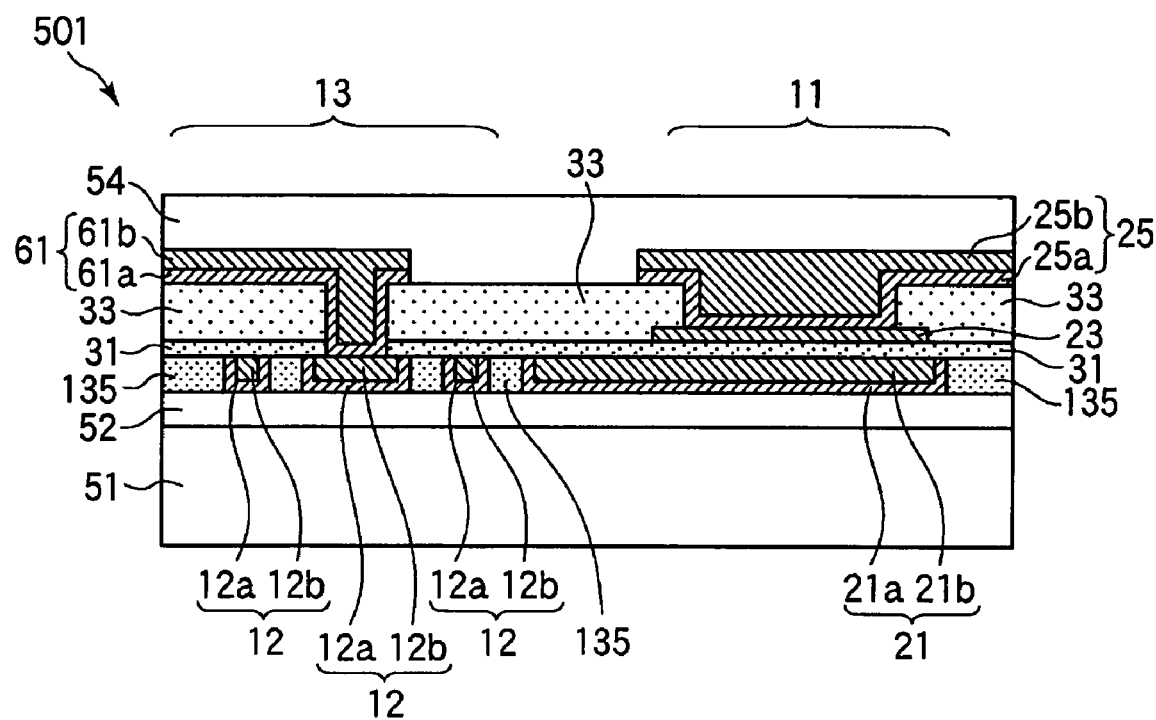
FIG. 23 shows a cross section depicting an electronic component 501 according to a sixth embodiment of the invention.

An electronic component and a method of fabricating the same according to a sixth embodiment of the invention will be described with reference to FIGS. 23 to 28C. FIG. 23 shows a cross section depicting an electronic component 501 according to the embodiment.

The electronic component 501 according to the embodiment is characterized in that conductors 12, 21, 25 and 61 are formed by damascene as compared with the coil conductor 12, the lower conductor 21 and the conductors 25 and 61 of the electronic component 401 according to the fifth embodiment are formed by the semi-additive process (deposition). Underlying conductors 12a and 21a of the coil conductor 12 and the lower conductor 21 are formed on the bottom and the side part of each of the conductors. The configuration of the electronic component 501 is the same as that of the electronic component 401 except that the conductors 12, 21, 25 and 61 are formed by damascene in the structure in which the underlying conductors 12a and 21a are provided on the side parts of the coil conductor 12 and the lower conductor 21, omitting the detailed descriptions. The electronic component 501 according to the embodiment can obtain the same advantages as those of the electronic component 401 according to the fifth embodiment.

A method of fabricating the electronic component 501 according to the embodiment will be described with reference to FIGS. 24A to 28C. Although a plurality of the electronic components 501 is formed on a wafer at the same time, FIGS. 24A to 28C show the device forming area of a single electronic component 501. FIGS. 24A to 28C show cross sections depicting the fabrication process steps of the electronic component 501 according to the embodiment.

In the embodiment, a planarized substrate 51 is used as a substrate. First, the surface of alumina formed on throughout the surface of the substrate 51 formed of alumina ($Al_2O_3$) is polished by CMP (chemical-mechanical polishing) to form a planarized layer 52.

Figure 24A:
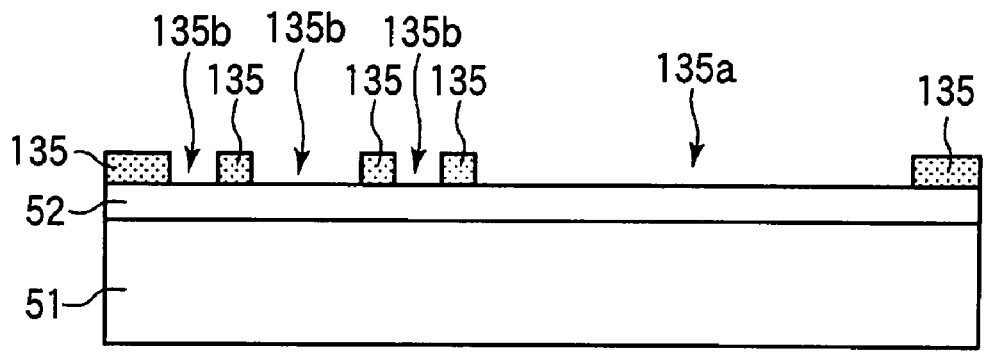
FIGS. 24A to 24C show cross sections depicting a method of fabricating the electronic component 501 according to the sixth embodiment of the invention (first one)

Subsequently, for example, a photosensitive resin such as polyimide is applied to throughout the surface to form an insulating film 135. Then, the insulating film 135 is pre baked. Then, as shown in FIG. 24A, the insulating film 135 is exposed and developed, and an opening 135a in a rectangular shape and an opening 135b in a spiral shape are formed in the insulating film 135 when the substrate 51 is seen in the normal direction thereof. The end part on the outer radius side of the opening 135b is connected to the opening 135a. Subsequently, the insulating film 135 is post baked.

Figure 24B:
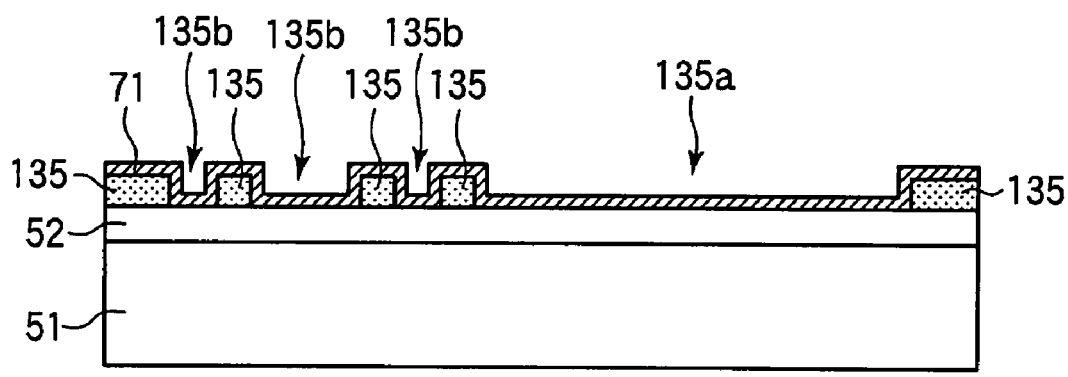

Then, as shown in FIG. 24B, for example, titanium (Ti) having a film thickness of about 30 nm and copper (Cu) having a film thickness of about 100 nm are in turn laminated on throughout the surface by sputtering to form an underlying conductor 71. The underlying conductor 71 is also formed on the side part and the bottom of the openings 135a and 135b.

Figure 24C:
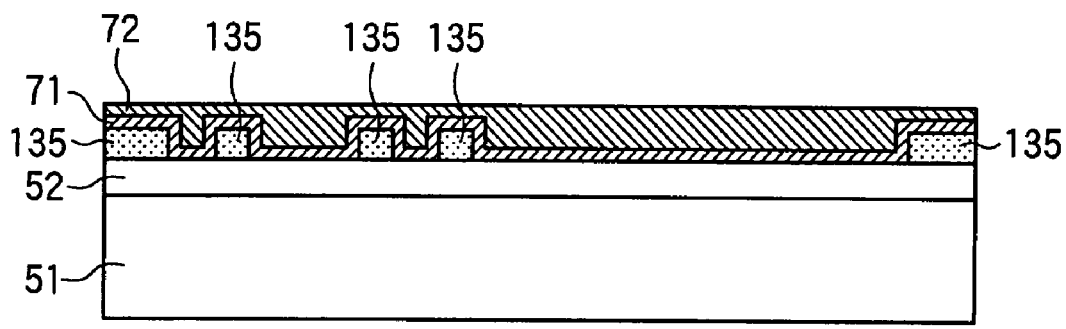
Figure 25A:
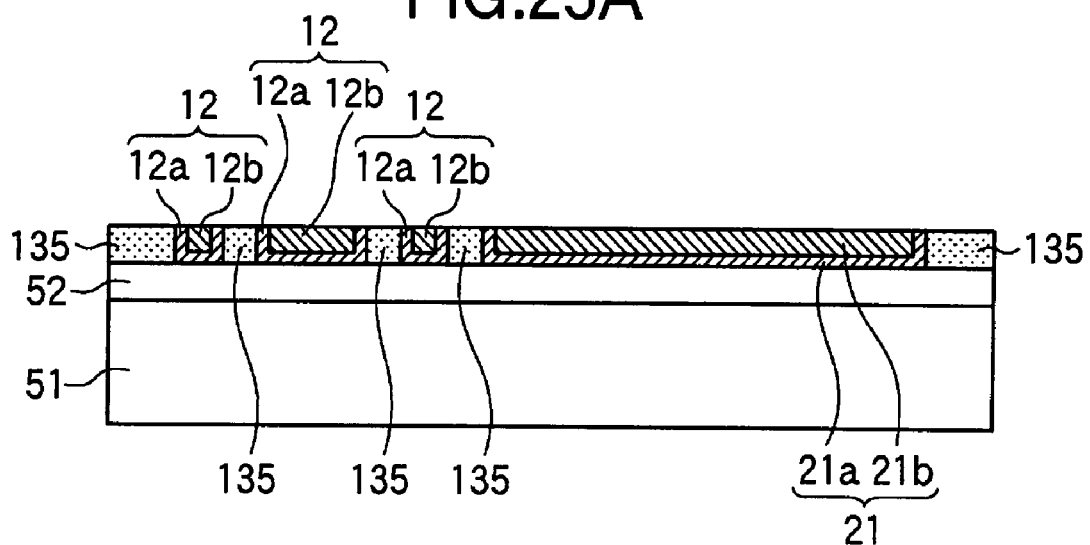
FIGS. 25A to 25C show cross sections depicting a method of fabricating the electronic component 501 according to the sixth embodiment of the invention (second one)

Subsequently, as shown in FIG. 24C, a conductor 72 of Cu having a thickness of 9 to 10 μm is formed on the underlying conductor 71 by electrolytic plating. Then, as shown in FIG. 25A, all the surface is polished by CMP polishing until the insulating film 135 is exposed to form a conductor pattern to form a lower conductor (first conductor) 21 having a thickness of about 8 μm in the opening 135a, and the coil conductor 12 having the same thickness is formed in the opening 135b at the same time. The lower conductor 21 is configured of an underlying conductor 21a formed of the underlying conductor 71 and a conductor 21b formed of the conductor 72. The coil conductor 12 is configured of an underlying conductor 12a formed of the underlying conductor 71 and a conductor 12b formed of the conductor 72.

The conductor 25 and the conductor 61, described later, are formed by the same method of the coil conductor 12 and the lower conductor 21. In addition, the wiring layer for the coil conductor 12 and the conductor 61, described later, may be the wiring layer for any one of the wiring layers of the lower conductor 21 and the upper conductor 23, which can be arranged freely in consideration of the ease of the wiring design and the electric characteristics and shape of the inductor element 13.

Figure 25B:
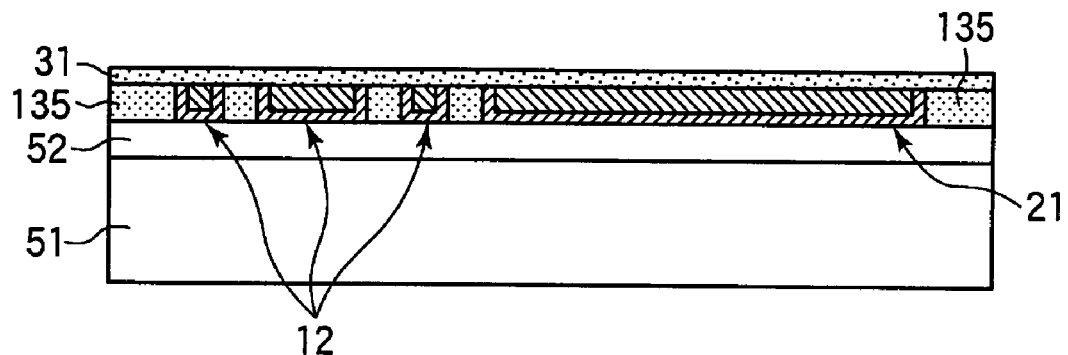

Subsequently, as shown in FIG. 25B, a dielectric film 31 having a thickness of about 0.1 μm is formed throughout the surface. For the material for forming the dielectric film 31, for example, alumina, silicon nitride ($Si_4N_3$), silicon dioxide ($SiO_2$), tantalum oxide ($Ta_2O_5$), aluminium nitride (AlN) or magnesium oxide (MgO) are used. Since the surfaces of the lower conductor 21, the coil conductor 12 and the insulating film 135 are flat, the dielectric film 31 is formed flat to cover throughout the top of the lower conductor 21, the coil conductor 12 and the insulating film 135.

Figure 25C:
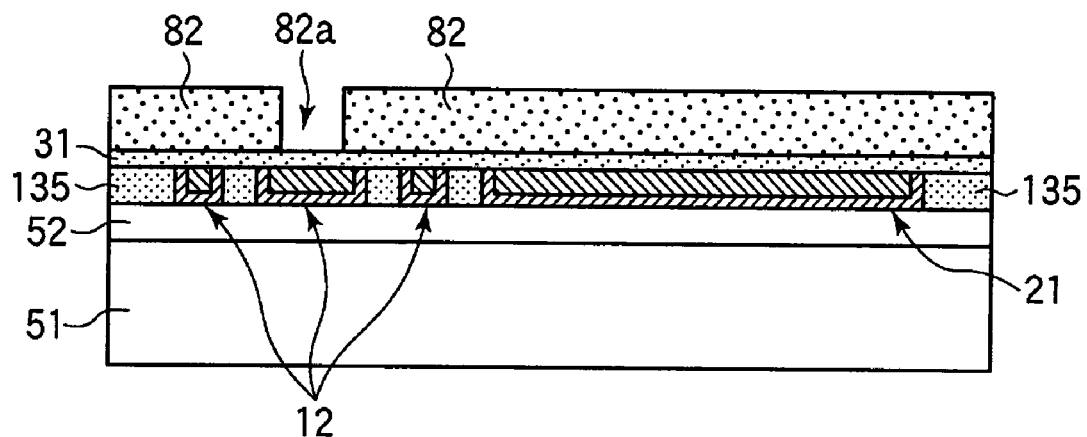

Then, a photosensitive resin is applied to throughout the surface of the dielectric film 31 to form a photosensitive resin layer 82. Subsequently, as shown in FIG. 25C, the photosensitive resin layer 82 is exposed and developed, and an opening 82a is formed in the photosensitive resin layer 82 on the end part on the inner radius side of the coil conductor 12. Then, the photosensitive resin layer 82 is post baked (heat treated).

Figure 26A:
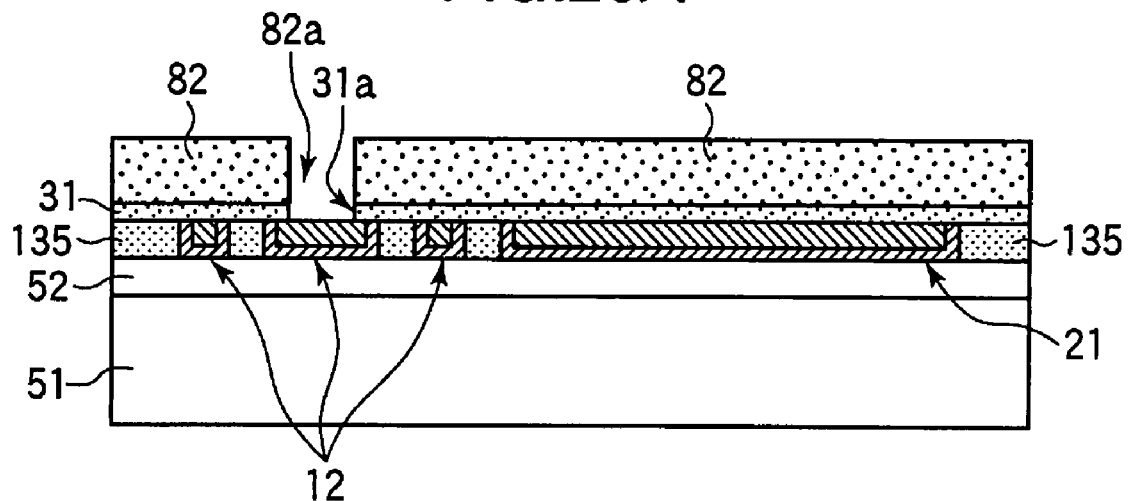
FIGS. 26A to 26C show cross sections depicting a method of fabricating the electronic component 501 according to the sixth embodiment of the invention (third one)
Figure 26B:
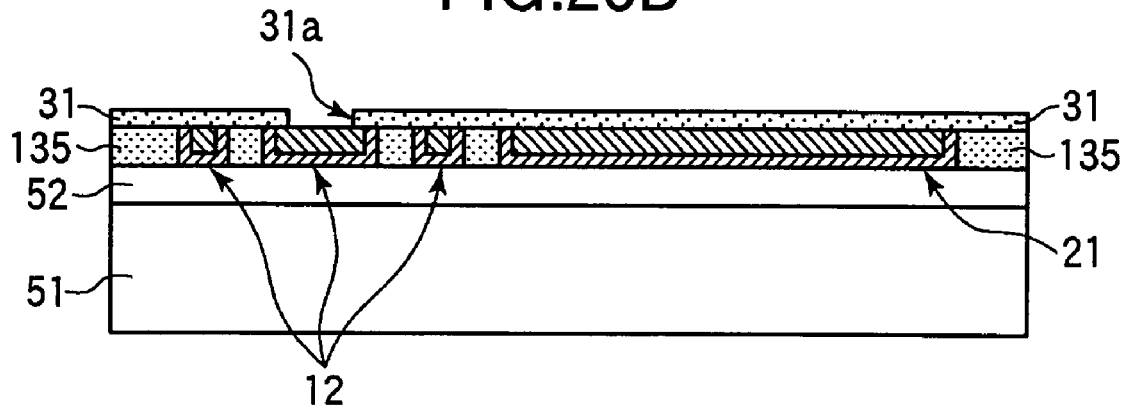

Then, as shown in FIG. 26A, the dielectric film 31 exposed in the opening 82a is removed by ashing to form a via opening 31a in the dielectric film 31 in which the coil conductor 12 is exposed. At this time, as necessary, the dielectric film 31 on the wafer cutting line (chip cutting line), described later, may be removed at the same time. When the dielectric film 31 is separated into pieces, the film stress owed by the dielectric film 31 can be spread. Subsequently, as shown in FIG. 26B, the photosensitive resin layer 82 is removed.

Figure 26C:
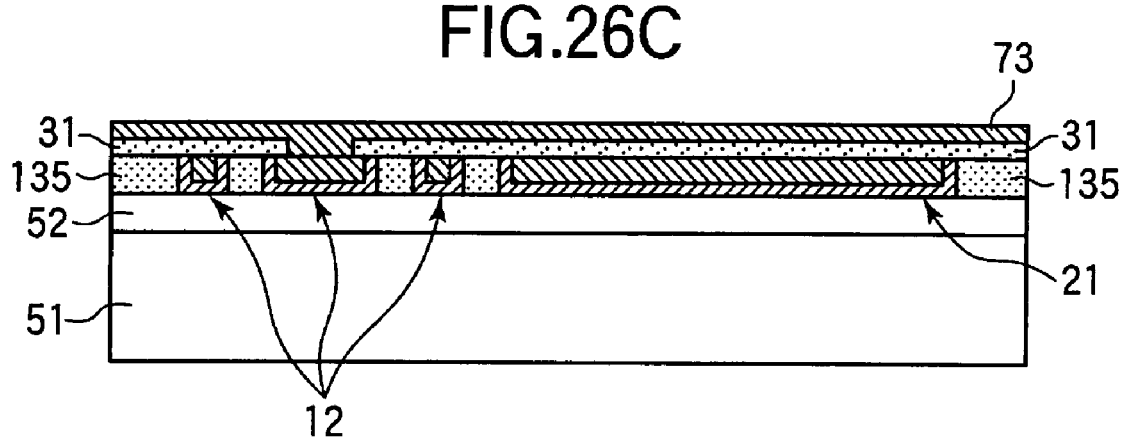

Then, as shown in FIG. 26C, for example, titanium (Ti) having a film thickness of about 30 (nm) and copper (Cu) having a film thickness of about 100 (nm) are in turn laminated on throughout the surface by sputtering to form a conductor 73 for forming the upper conductor. The conductor 73 for forming the upper conductor may be formed by a film deposition process such as vapor deposition using a vacuum deposition apparatus.

Figure 27A:
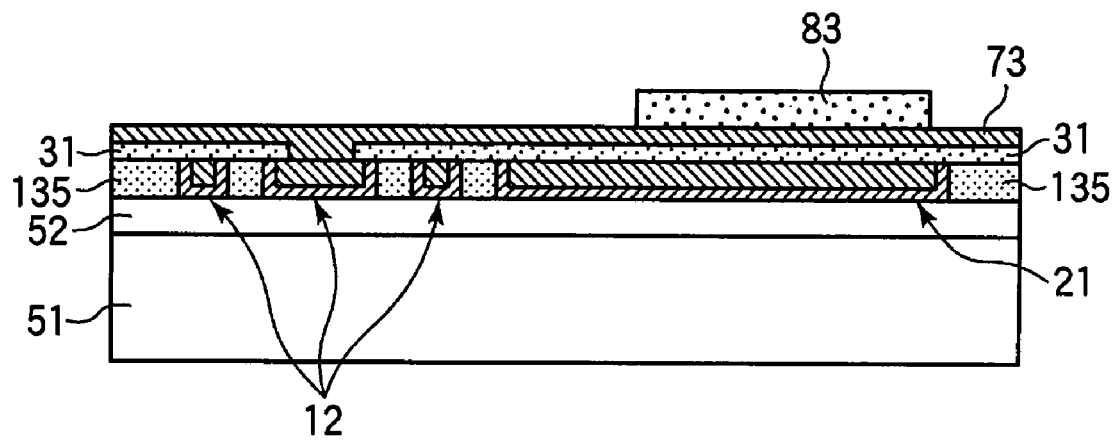
FIGS. 27A to 27C show cross sections depicting a method of fabricating the electronic component 501 according to the sixth embodiment of the invention (fourth one)

Subsequently, for example, a photosensitive resin having a thickness of about 3 (μm) is applied to throughout the surface of the conductor 73 for forming the upper conductor by spin coating to form a photosensitive resin layer 83. Then, as shown in FIG. 27A, the photosensitive resin layer 83 is exposed and developed, and the photosensitive resin layer 83 is left only on the portion to be the upper conductor 23 for the conductor 73 for forming the upper conductor.

Figure 27B:
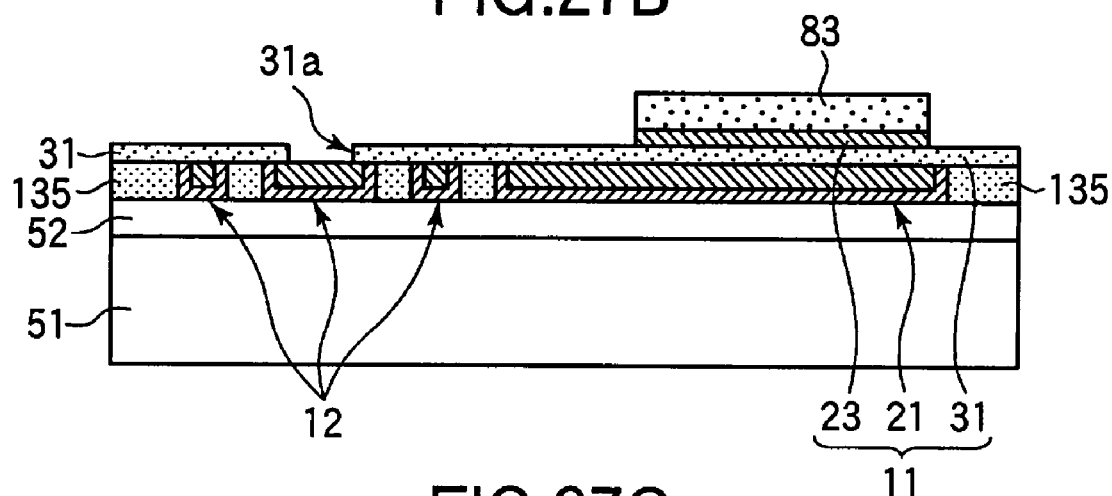

Subsequently, as shown in FIG. 27B, the conductor 73 for forming the upper conductor except the portion under the photosensitive resin layer 83 is removed by dry etching or wet etching. Thus, the upper conductor (second conductor) 23 configured of the conductor 73 for forming the upper conductor under the photosensitive resin layer 83 is formed. By the process steps described above, the capacitor element (capacitative element) 11 configured of the lower conductor 21, the dielectric film 31 and the upper conductor 23 is formed.

Figure 27C:
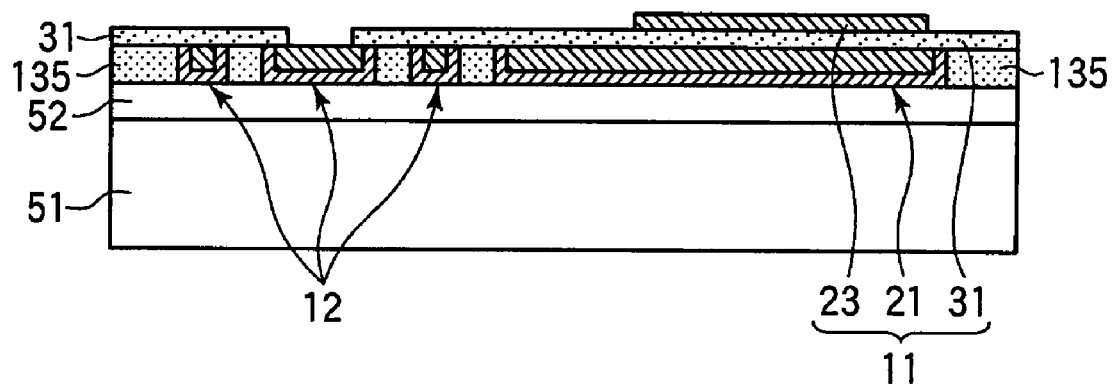
Figure 28A:
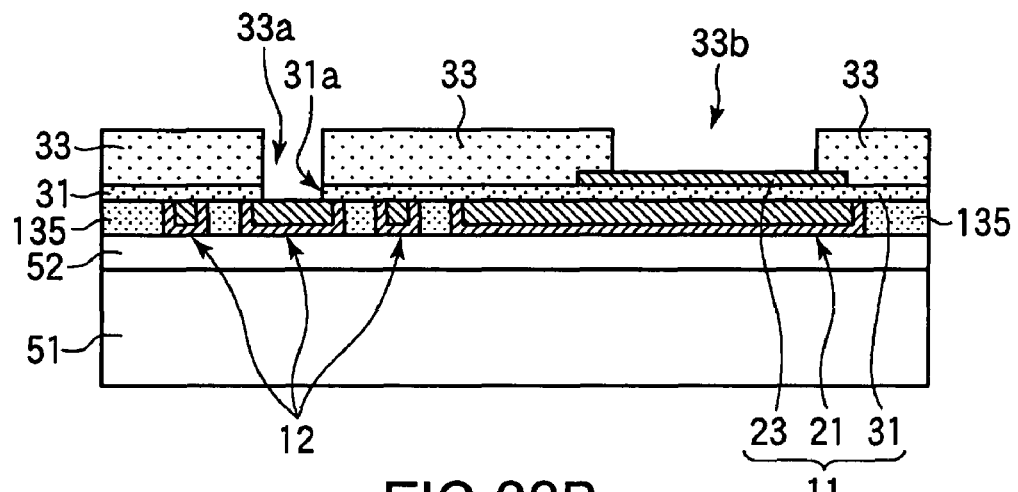
FIGS. 28A to 28C show cross sections depicting a method of fabricating the electronic component 501 according to the sixth embodiment of the invention (fifth one)

Then, as shown in FIG. 27C, the photosensitive resin layer 83 on the upper conductor 23 is removed. Subsequently, for example, a photosensitive resin for semiconductors is applied to throughout the surface to form an insulating film 33 having a film thickness of about 7 to 8 (μm). Then, the insulating film 33 is pre baked. Subsequently, as shown in FIG. 28A, the insulating film 33 is exposed and developed, and a via opening 33a is formed in the insulating film 33 in which the via opening 31a is exposed. Moreover, the opening 33b is formed in the insulating film 33 on the upper conductor 23 at the same time in which the upper conductor 23 is partially exposed. Then, the insulating film 33 is post baked. Subsequently, the surface of the insulating film 33 is polished by CMP polishing. For processing the opening 33b of the insulating film 33 and groves, laser, plasma ashing or wet etching may be used.

Figure 28B:
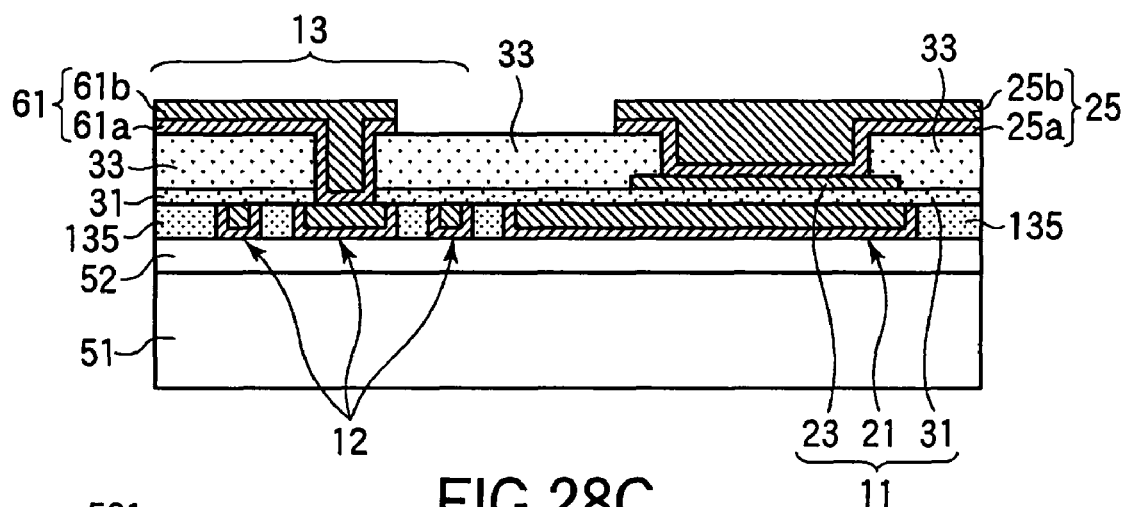

Then, as shown in FIG. 28B, the conductor 25 and the conductor 61 are formed by the same method of forming the lower conductor 21 and the coil conductor 12. Although the drawing is omitted, the description is made in more detail. For example, a photosensitive resin having a thickness of about 8 μm is applied to throughout the surface by spin coating to form a photosensitive resin layer. Then, the photosensitive resin layer is exposed and developed, and an opening in the same shape as that of the conductor 25 and the conductor 61 is formed in the photosensitive resin layer. Subsequently, for example, Ti having a film thickness of about 30 nm and Cu having a film thickness of about 100 nm are in turn laminated on throughout the surface by sputtering to form an underlying conductor.

Then, a conductor of Cu having a thickness of 9 to 10 μm is formed on the underlying conductor by electrolytic plating. Subsequently, the entire surface is polished by CMP polishing until the photosensitive resin layer is exposed to form a conductor pattern, and a conductor 25 and a conductor 61 having a thickness of about 8 μm are formed. The conductor 25 is configured of an underlying conductor 25*a* and a conductor 25*b* which is formed on the underlying conductor 25*a*. The conductor 61 is configured of an underlying conductor 61*a* and a conductor 61*b* which is formed on the underlying conductor 61*a*. By the process steps described above, the inductor element 13 configured of the coil conductor 12 and the conductor 61 is formed. Then, the photosensitive resin layer is removed.

Figure 28C:
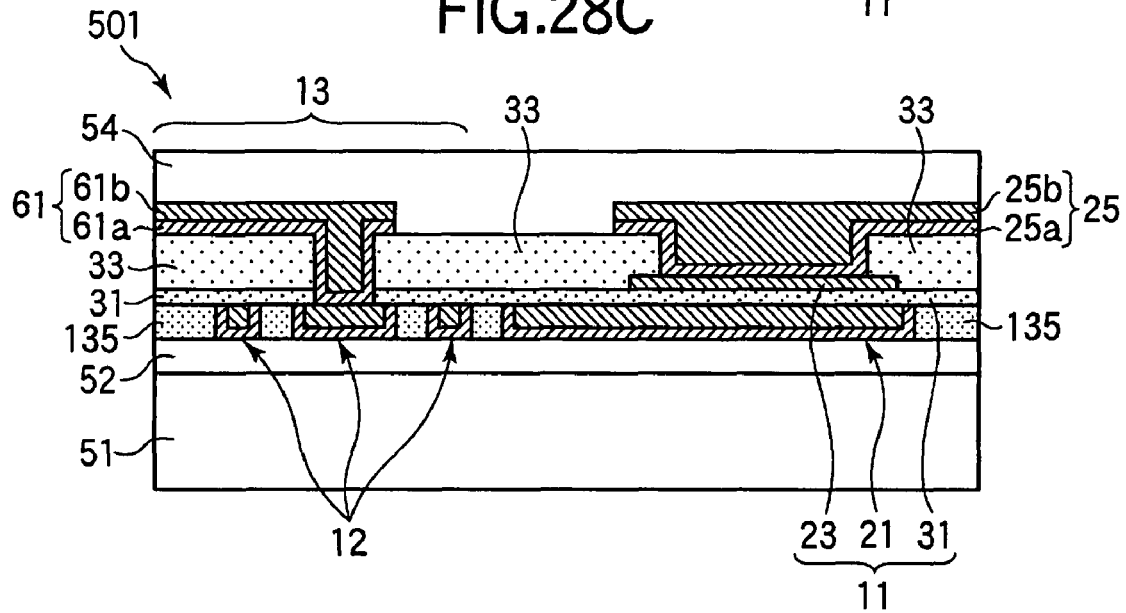

Subsequently, as shown in FIG. 28C, the alumina protective film 54 having a thickness of about 30 (μm) is formed throughout the surface. Then, the wafer is cut along a predetermined cutting line, and a plurality of the electronic components 501 which is formed on the wafer is separated into a chip shape for every device forming area. Subsequently, although the drawing is omitted, external electrodes electrically connected to the conductor 25 and the conductor 61 exposed in the cut surface are formed on the cut surface. Before or after the external electrodes are formed, corners are chamfered as necessary to complete the electronic component 501. In accordance with the method of fabricating the electronic component 501 according to the embodiment, the same advantages as those of the method of fabricating the electronic component 1 according to the first embodiment can be obtained.

Seventh Embodiment

An electronic component according to the seventh embodiment of the invention will be described with reference to FIG. 29. FIG. 29 shows a cross section depicting an electronic component 601 according to the embodiment.

The electronic component 601 according to the embodiment is characterized in that a conductor 25 is configured of two layers, a column shaped conductor 27 which is formed in an opening 33*b* and a conductor 29 which is formed on an insulating film 33 from the upper part of the opening 33*b* to the rim part on the short side of an electronic component 1, and a conductor 61 is configured of two layers, a via conductor 63 which is formed in the via openings 31*a* and 33*a* and a conductor 65 which is formed in a slim rectangular shape from the upper part of the via opening 33*a* to the rim part on the short side of the electronic component 1 as compared with the electronic component 401 according to the fifth embodiment.

Underlying conductors 27*a* and 63*a* of the column shaped conductor 27 and the via conductor 63 are formed on the bottom and the side part of each of the conductors. Conductors 27*b* and 63*b* are formed on the underlying conductors 27*a* and 63*a*. The conductor 29 is configured of an underlying conductor 29*a* which is formed on the column shaped conductor 27 and the insulating film 33 and a conductor 29*b* which is formed on the underlying conductor 29*a*. The conductor 65 is configured of an underlying conductor 65*a* which is formed on the via conductor 63 and the insulating film 33 and a conductor 65*b* which is formed on the underlying conductor 65*a*.

The configuration of the electronic component 601 is the same as that of the electronic component 401 except the points described above, omitting the descriptions. The electronic component 601 according to the embodiment can obtain the same advantages as those of the electronic component 401 according to the fifth embodiment.

Eighth Embodiment

Figure 30:
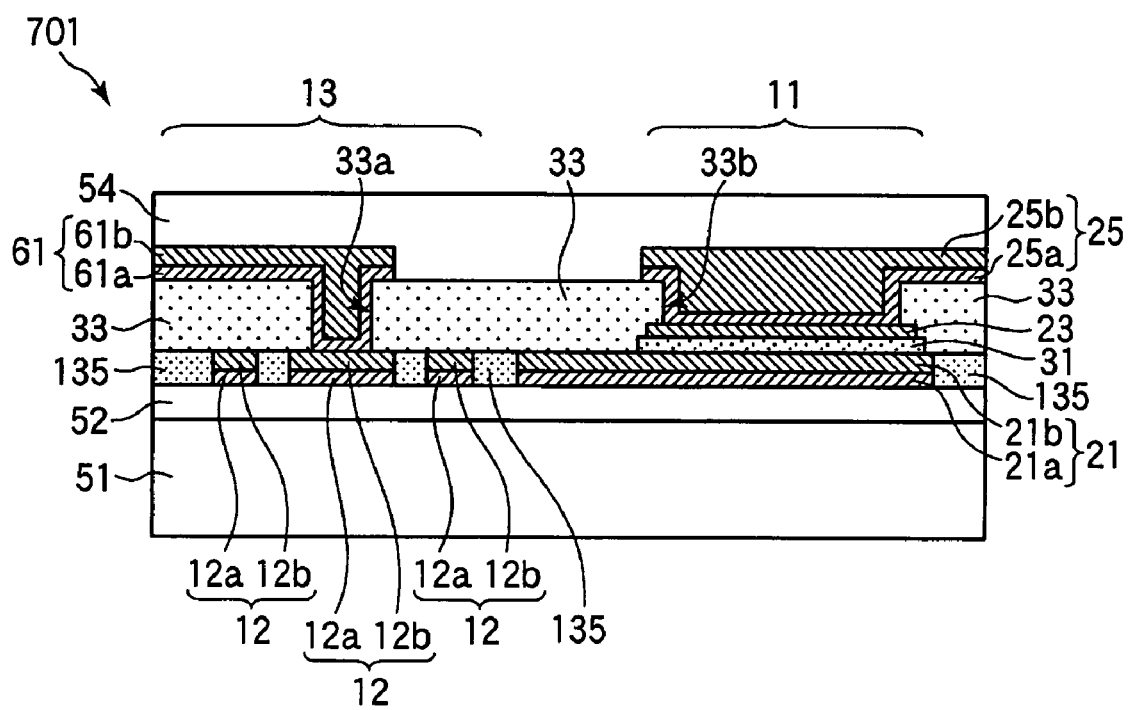
FIG. 30 shows a cross section depicting an electronic component 701 according to an eighth embodiment of the invention.

An electronic component and a method of fabricating the same according to the eighth embodiment of the invention will be described with reference to FIGS. 30 to 34B. FIG. 30 shows a cross section depicting an electronic component 701 according to the embodiment.

The electronic component 701 according to the embodiment is characterized in that a dielectric film 31 is formed only on a lower conductor 21 as compared with the electronic component 401 according to the fifth embodiment. The dielectric film 31 is formed only on the portion in which the lower conductor 21 and an upper conductor 23 are faced to each other and the portion therearound when the substrate 51 is seen in the normal direction of the substrate surface. The configuration of the electronic component 701 is the same as that of the electronic component 401 according to the fifth embodiment except that the dielectric film 31 is formed only on the lower conductor 21, omitting the detailed descriptions.

In the electronic component 701 according to the embodiment, the dielectric film 31 is formed only on the lower conductor 21. Thus, as compared with the electronic component 401, the electronic component 701 can suppress internal stress and the variations in the dimensions of the electronic component 701 to temperature. Therefore, the fluctuations in the constant such as the capacitance value of the capacitor element 11 due to temperature change can be suppressed. Accordingly, as compared with the electronic component 401 according to the fifth embodiment, the electronic component 701 can improve the temperature characteristics of the capacitor element 11, and can obtain the capacitance value of the capacitor element 11 more highly accurately. Furthermore, the electronic component 701 according to the embodiment can obtain the same advantages as those of the electronic component 401.

A method of fabricating the electronic component 701 according to the embodiment will be described with reference to FIGS. 31A to 34B. Although a plurality of the electronic components 701 is formed on a wafer at the same time, FIGS. 31A to 34B show the device forming area of a single electronic component 701. FIGS. 31A to 34B show cross sections depicting the fabrication process steps of the electronic component 701 according to the embodiment.

Figure 31A:
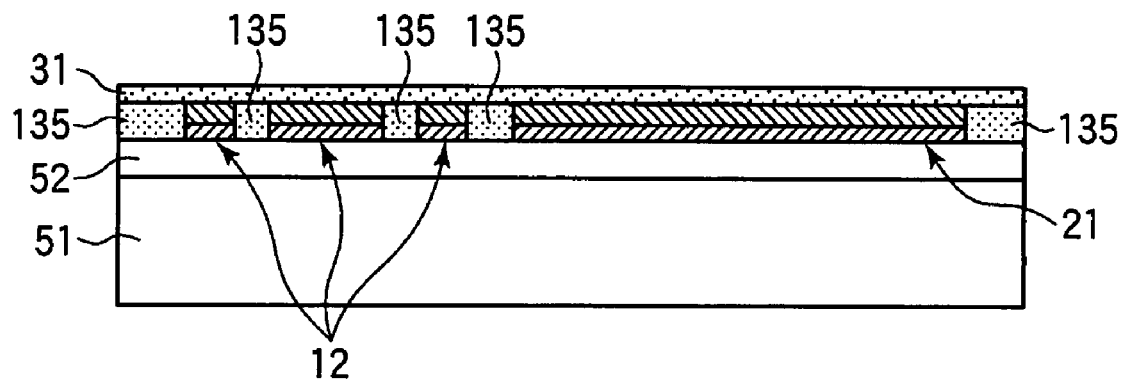
FIGS. 31A to 31C show cross sections depicting a method of fabricating the electronic component 701 according to the eighth embodiment of the invention (first one)

First, as shown in FIG. 31A, a coil conductor 12, a lower conductor (first conductor) 21 and an insulating film 135 are formed on a planarized layer 52 of a substrate 51 to form a dielectric film 31 throughout the surface by the same method of fabricating the electronic component 401 according to the fifth embodiment (see FIGS. 2A to 3B and FIGS. 18A to 19B).

Figure 31B:
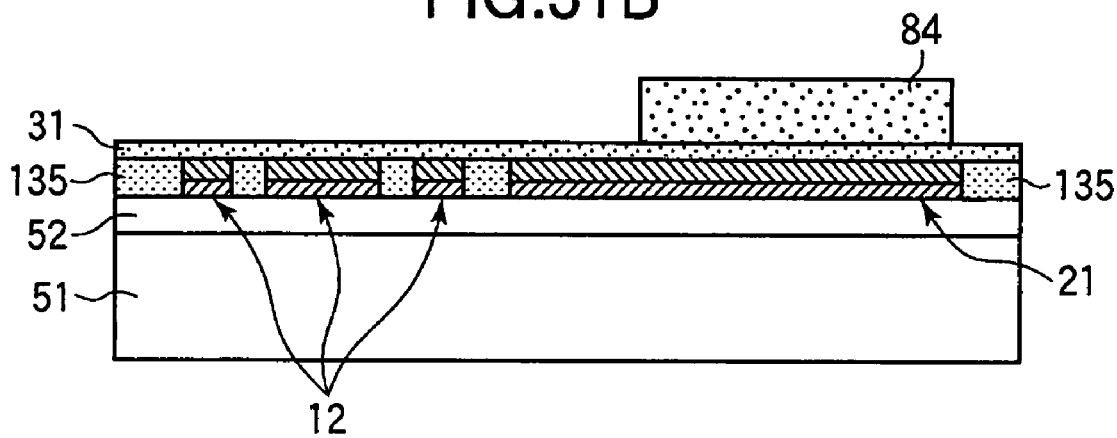
Figure 31C:
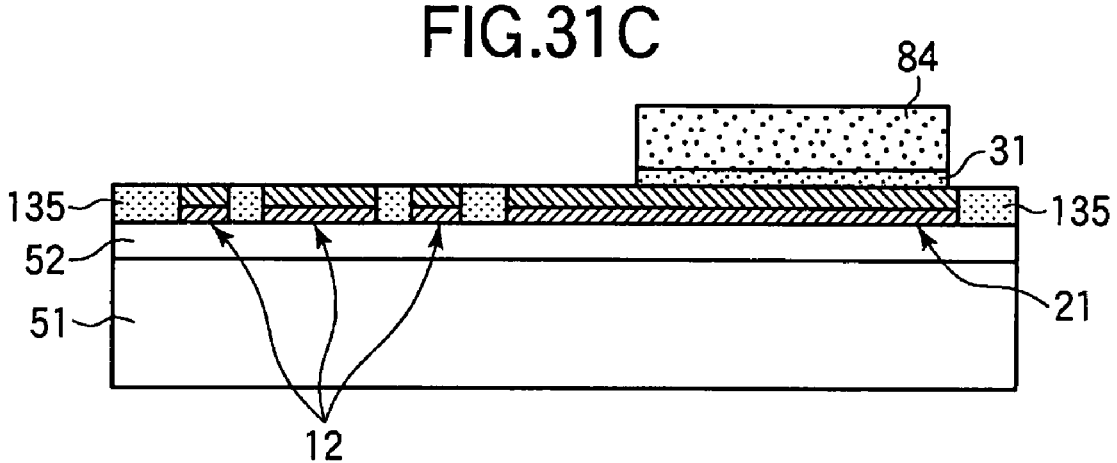
Figure 32A:
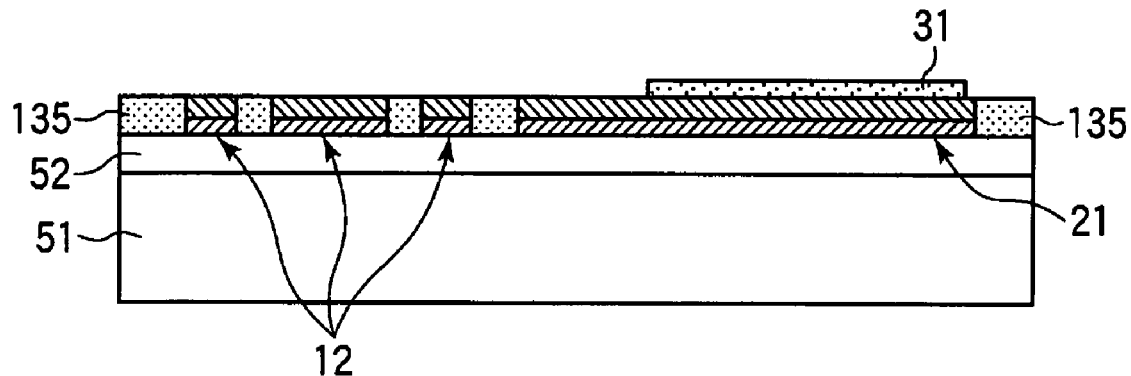
FIGS. 32A to 32C show cross sections depicting a method of fabricating the electronic component 701 according to the eighth embodiment of the invention (second one)

Then, a photosensitive resin is applied to throughout the surface of the dielectric film 31 to form a photosensitive resin layer 84. Then, as shown in FIG. 31B, the photosensitive resin layer 84 is exposed and developed, and the photosensitive resin layer 84 is left only on the dielectric film 31 to be the electrode part of the lower conductor 21 and the portion therearound. Subsequently, as shown in FIG. 31C, the dielectric film 31 except the portion under the photosensitive resin layer 84 is removed by ashing. Thus, the dielectric film 31 is formed only on the portion to be the electrode part of the lower conductor 21 and the portion therearound. Then, as shown in FIG. 32A, the photosensitive resin layer 84 is removed.

Figure 32B:
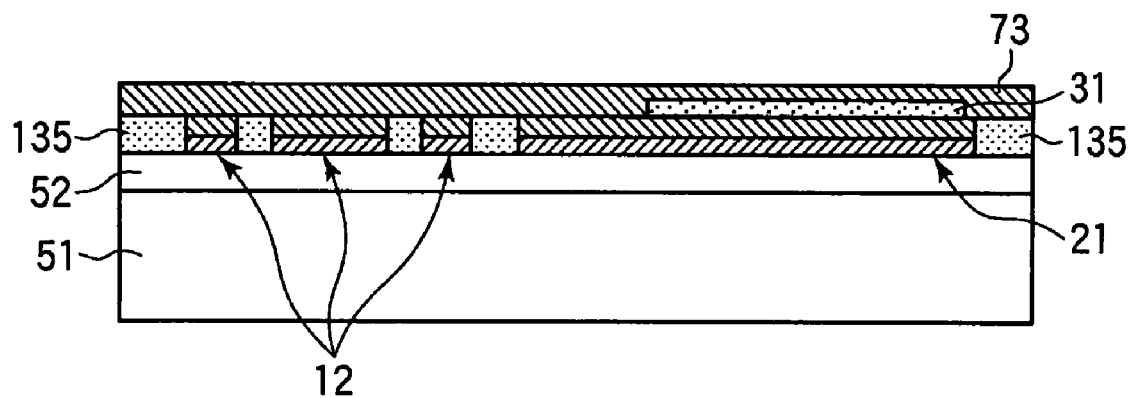

Subsequently, as shown in FIG. 32B, for example, titanium (Ti) having a film thickness of about 30 (nm) and copper (Cu) having a film thickness of about 100 (nm) are in turn laminated on throughout the surface by sputtering to form a conductor 73 for forming the upper conductor. The conductor 73 for forming the upper conductor may be formed by a film deposition process such as vapor deposition using a vacuum deposition apparatus.

Figure 32C:
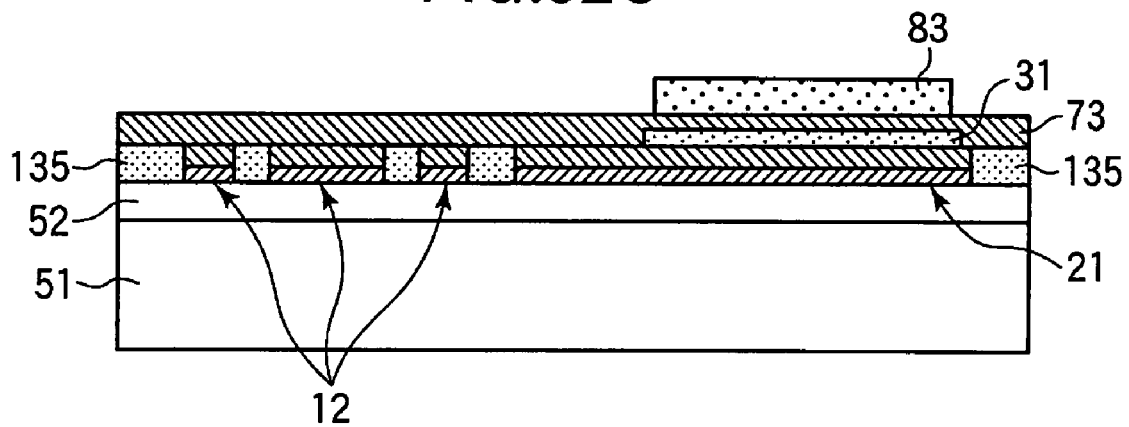

Then, for example, a photosensitive resin having a thickness of about 3 (μm) is applied to throughout the surface of the conductor 73 for forming the upper conductor by spin coating to form a photosensitive resin layer 83. Subsequently, as shown in FIG. 32C, the photosensitive resin layer 83 is exposed and developed, and the photosensitive resin layer 83 is left only on the conductor 73 for forming the upper conductor on the dielectric film 31 (the portion to be the upper conductor 23).

Figure 33A:
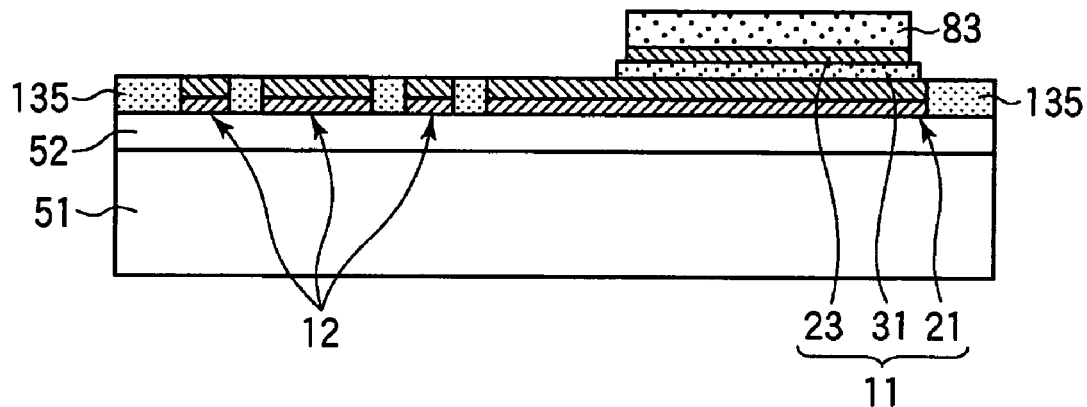
FIGS. 33A to 33C show cross sections depicting a method of fabricating the electronic component 701 according to the eighth embodiment of the invention (third one)

Then, as shown in FIG. 33A, the conductor 73 for forming the upper conductor except the portion under the photosensitive resin layer 83 is removed by dry etching or wet etching. Thus, the upper conductor (second conductor) 23 configured of the conductor 73 for forming the upper conductor under the photosensitive resin layer 83 is formed. By the process steps described above, the capacitor element (capacitative element) 11 configured of the lower conductor 21, the dielectric film 31 and the upper conductor 23 is formed.

Figure 33B:
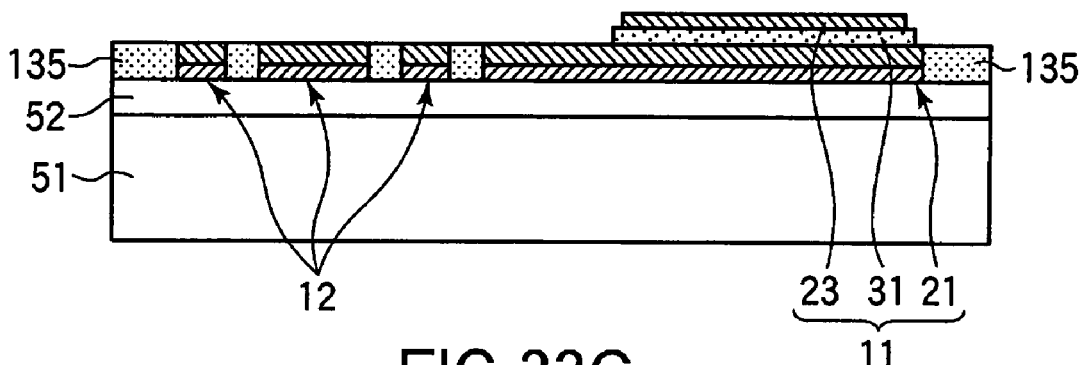
Figure 33C:
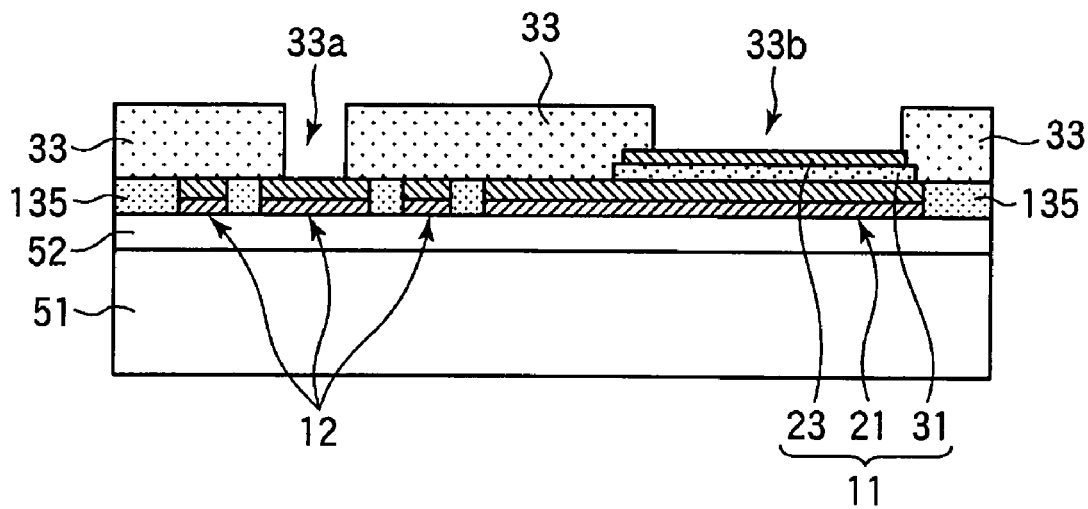

After that, as shown in FIG. 33B, the photosensitive resin layer 83 on the upper conductor 23 is removed. Then, for example, a photosensitive resin for semiconductors is applied to throughout the surface to form an insulating film 33 having a film thickness of about 7 to 8 (μm). Subsequently, the insulating film 33 is pre baked. Then, as shown in FIG. 33C, the insulating film 33 is exposed and developed, and a via opening 33a is formed in the insulating film 33 in which the end part on the inner radius side of the coil conductor 12 is exposed. Moreover, the opening 33b is formed in the insulating film 33 on the upper conductor 23 at the same time in which the upper conductor 23 is partially exposed. Subsequently, the insulating film 33 is post baked. Then, the surface of the insulating film 33 is polished by CMP polishing.

Figure 34A:
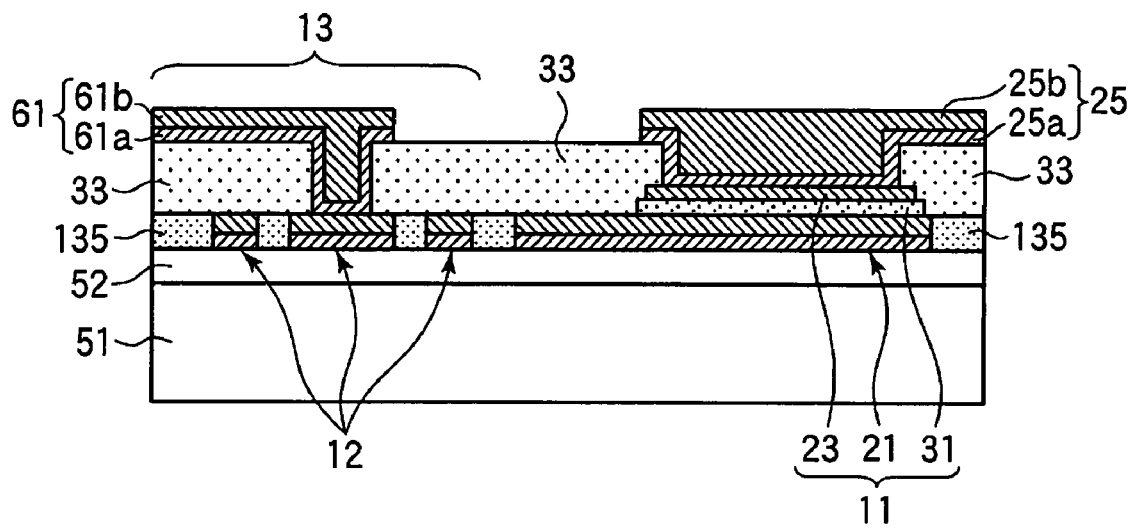
FIGS. 34A and 34B show cross sections depicting a method of fabricating the electronic component 701 according to the eighth embodiment of the invention (fourth one)

Subsequently, as shown in FIG. 34A, the conductor 25 and the conductor 61 are formed by the same method of forming the lower conductor 21 and the coil conductor 12. Although the drawing is omitted, the description is made in more detail, for example, Ti having a film thickness of about 30 (nm) and Cu having a film thickness of about 100 (nm) are in turn laminated on throughout the surface by sputtering to form an underlying conductor. Then, for example, a photosensitive resin having a thickness of about 8 (μm) is applied to throughout the surface of the underlying conductor by spin coating to form a photosensitive resin layer.

Subsequently, the photosensitive resin layer is exposed and developed, and an opening in the same shape as that of the conductor 25 and the conductor 61 is formed in the photosensitive resin layer.

Then, a conductor of Cu having a thickness of 9 to 10 (μm) is formed on the underlying conductor exposed in the opening by electrolytic plating, and the surface of the conductor is then polished by CMP polishing to form a conductor 25b and the conductor 61b having a thickness of about 8 (μm). Subsequently, the photosensitive resin layer is removed.

Then, as shown in FIG. 34A, the underlying conductor exposed around and between the conductors 25b and 61b is removed by dry etching or wet etching to form the underlying conductor 25a which is configured of the underlying conductor under the conductor 25b and the underlying conductor 61a configured of the underlying conductor under the conductor 61b. Thus, the conductor (third conductor) 25 is formed in the layered structure in which the underlying conductor 25a and the conductor 25b are laminated on the upper conductor 23 in the opening 33b and on the insulating film 33, and the conductor 61 is formed in the layered structure in which the underlying conductor 61a and the conductor 61b are laminated in the via opening 33a and on the insulating film 33.

Figure 34B:
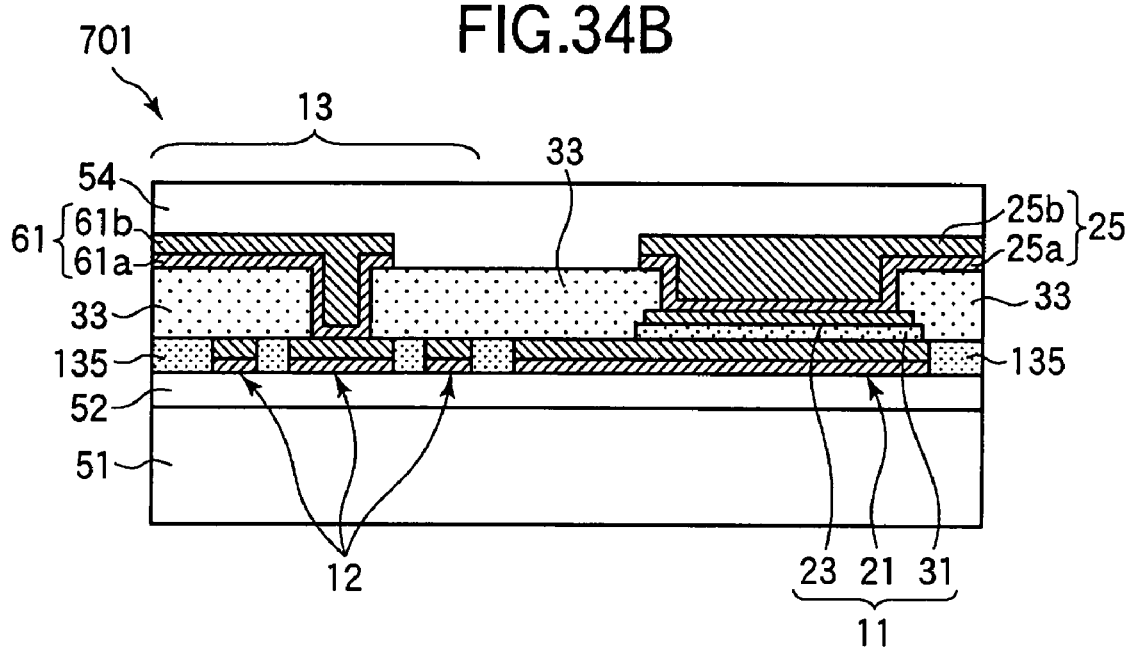
Figure 35A:
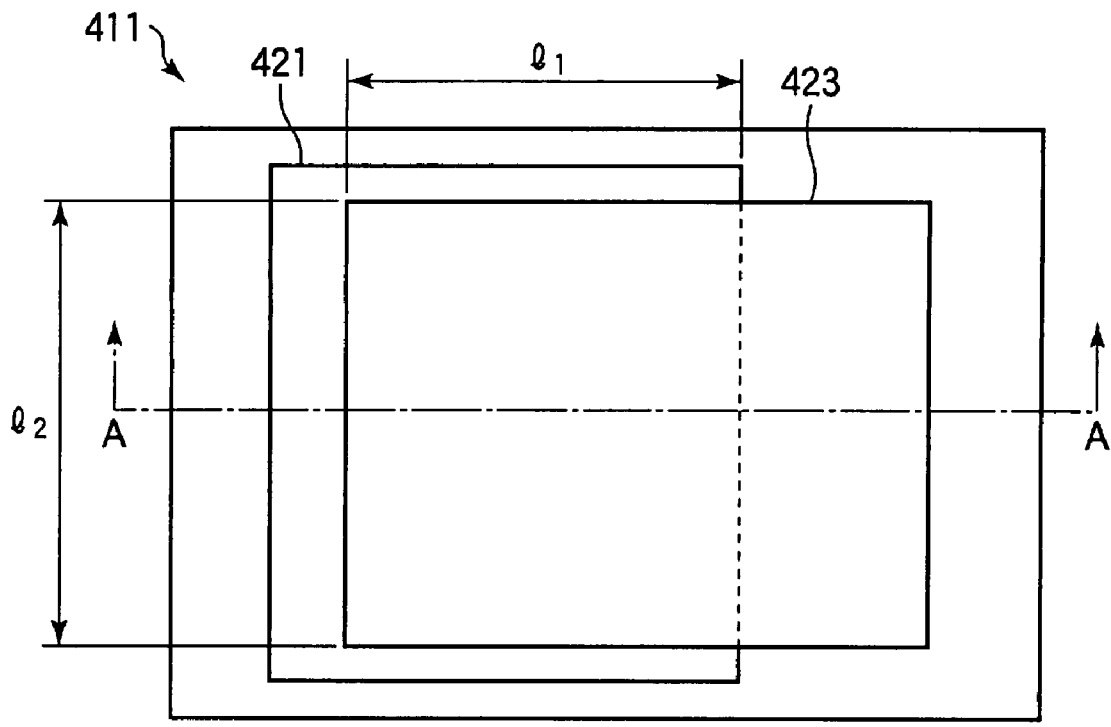
FIGS. 35A and 35B show diagrams depicting the capacitor element 411 before.
Figure 35B:
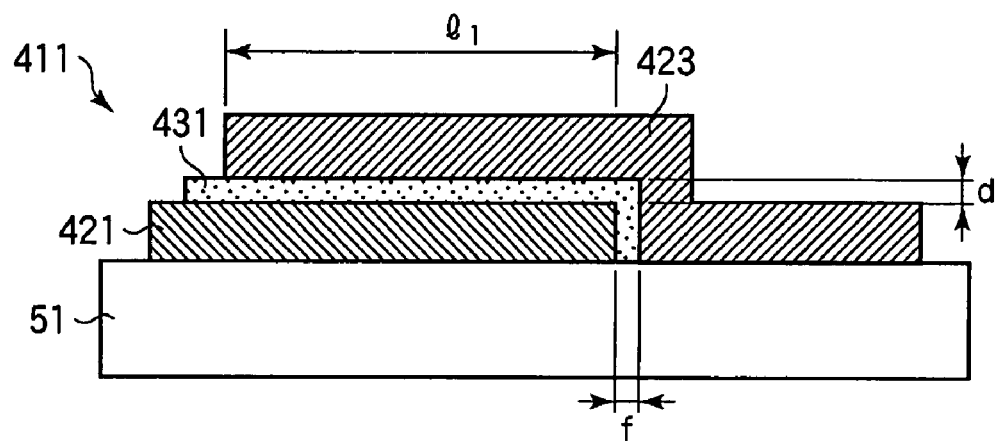
Figure 36:
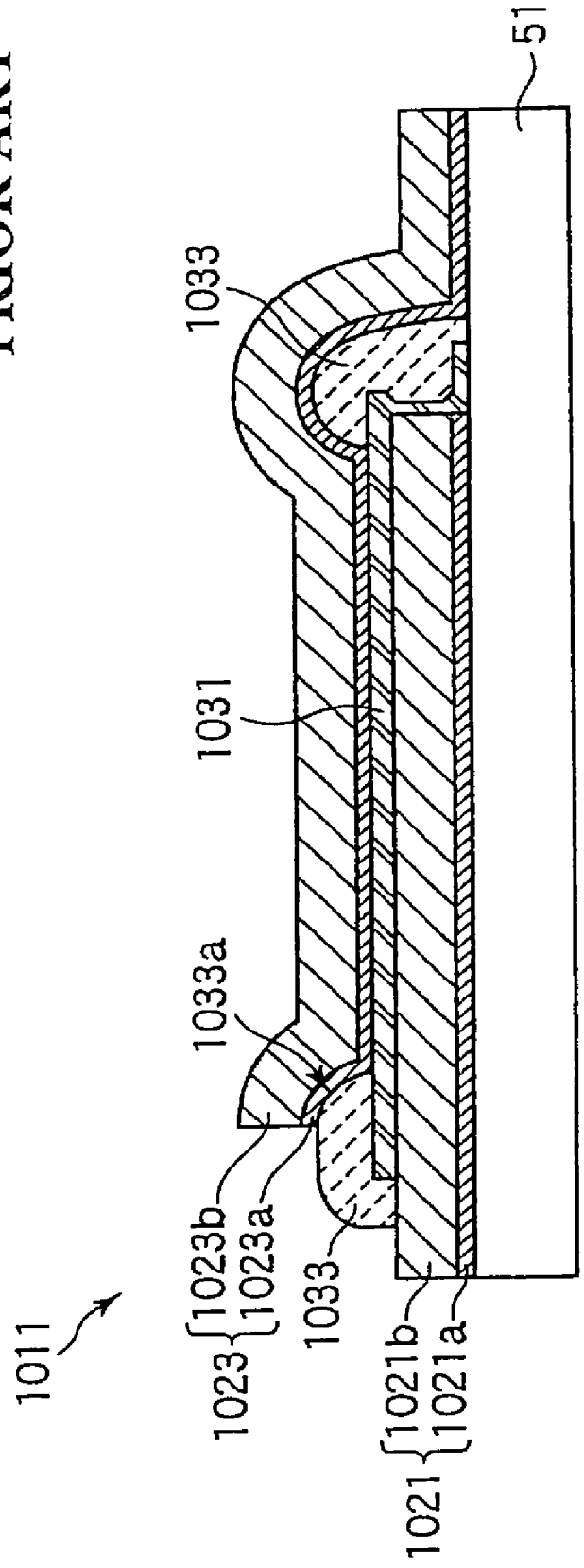
FIG. 36 shows a cross section depicting the thin film capacitor element 1011 disclosed in Patent Reference 1.

By the process steps described above, the inductor element 13 configured of the coil conductor 12 and the conductor 61 is formed. Subsequently, as shown in FIG. 34B, the alumina protective film 54 having a thickness of about 30 (μm) is formed throughout the surface.

Then, the wafer is cut along a predetermined cutting line, and a plurality of the electronic components 701 which is formed on the wafer is separated into a chip shape for every device forming area. Subsequently, although the drawing is omitted, external electrodes electrically connected to the conductor 25 and the conductor 61 exposed in the cut surface are formed on the cut surface. Then, corners are chamfered as necessary to complete the electronic component 701. In accordance with the method of fabricating the electronic component 701 according to the embodiment, the same advantages as those of the method of fabricating the electronic component 1 according to the first embodiment can be obtained.

The invention can be modified variously not limited to the embodiments.

In the embodiments, the electronic component containing only the capacitor element 11 and the inductor element 13 is taken as an example as the electronic component, but the invention is not limited thereto. For example, the invention can be adapted to an RC composite electronic component in which a resistance element is formed instead of the inductor element 13. In addition, the invention can be also adapted to an RLC composite electronic component having a resistance element in addition to the capacitor element 11 and the inductor element 13. In addition, the invention can be also adapted to electronic components containing an active component such as a transistor and a diode, not limited to the electronic component containing only a passive component as long as components are the electronic component containing the capacitor element 11. Moreover, the invention can be also adapted to circuits in which digital and analog elements are mixed as long as components are the electronic component containing the capacitor element 11. Moreover, a desired function can be achieved by a desired circuit in which any of LCR elements are combined in plural elements in order to obtain the desired function. Of course, such a circuit configuration may be efficient that a distributed constant circuit is combined, not limited to lumped constant, and they may be combined with semiconductor devices.

In addition, the material of the substrate 51 may be semiconductor materials or low temperature co-fired ceramics (LTCC). In addition, the electronic component 1 may be configured inside a circuit board.

In the first to eighth embodiments, the electronic component 1 having the capacitor element 11 in a single layer is taken and described as an example, but the invention is not limited thereto. For example, the invention can be also adapted to the electronic component 1 having a layered capacitor element in which the conductor and the dielectric film 31 are in turn laminated repeatedly. When a layered capacitor element is formed, the capacitor elements 11 of the electronic component according to the first to eighth embodiments can be combined properly. For example, such schemes may be performed in which the capacitor elements 11 according to the same embodiment are repeatedly laminated, the capacitor element 11 according to one embodiment has the capacitor element 11 according to another embodiment laminated thereon repeatedly, or the capacitor elements 11 according to two embodiments are alternately laminated.

In the embodiments, the electronic component in a rectangular sectional shape of each of the conductors is taken as an example, but the sectional shape of each of the conductors may be a trapezoid, or an inverted trapezoid.

In the embodiments, the electronic component is taken as an example in which the conductor 25 has the column shaped conductor part formed in the opening 33b and the lead conductor part which is formed on the insulating film 33 in order to connect the upper conductor 23 to the external electrode (not shown), but the invention is not limited thereto. For example, the invention can be also adapted to a electronic component in which the conductor 25 is configured only of a lead conductor part and the column shaped conductor part is formed on the lower conductor 21. In the electronic component, an upper conductor (second conductor) 23 which is thinner than the column shaped conductor part is formed on the column shaped conductor part (third conductor), a dielectric film 31 is formed on the upper conductor 23, and a lead conductor (first conductor) 25 configured only of the lead conductor part is formed on the dielectric film 31. The conductor 25 is formed thicker than the upper conductor 23. In the electronic component, the capacitor element (capacitative element) is configured of the upper conductor 23, the dielectric film 31 and the lead conductor part. In the electronic component, the insulating film 33 is formed around the lower conductor 21 and the column shaped conductor part. In addition, in the electronic component, the upper conductor 23 is formed to cover the column shaped conductor part when the substrate surface of a substrate 51 is seen in the normal direction.

In the electronic component, since the upper conductor 23 is formed thinner, the upper conductor 23 in a highly accurate shape can be obtained. Thus, the area accuracy of the upper conductor 23 faced to the conductor 25 is highly accurate, and the electrode area of the capacitor element can be formed highly precisely. Therefore, the capacitance value of the capacitor element can be obtained highly precisely. In addition, when the insulating film 33 is thickened, the parasitic inductance and the parasitic capacitance that occur between the lower conductor 21 and the conductor 25 are decreased. Accordingly, the accuracy of the capacitance value of the capacitor element 11 can be enhanced.

What is claimed is:

1. An electronic component comprising:
    a first conductor which is formed on a substrate;
    a dielectric film which is formed on the first conductor, wherein the dielectric film is formed over almost throughout an upper surface of the substrate so as to cover the first conductor;
    a second conductor which is formed on the dielectric film disposed on the first conductor and thinner than the first conductor, wherein a capacitative element is configured of the first conductor, the second conductor and the dielectric film; and
    an inductor element having a coil conductor formed in one piece with the first conductor and formed in a same layer as the first conductor and formed under the dielectric film, wherein
    an end part of the coil conductor functions as the first conductor and the inductor element configures one of a resonant circuit and a filter circuit with the capacitative element, and
    the dielectric film is formed to cover throughout a top and a side surface of the first conductor, and a top and a side surface of the coil conductor.

2. The electronic component according to claim 1, wherein an electrode area of the capacitative element is defined by an area of the second conductor.

3. The electronic component according to claim 1, wherein $t1>t2$ and $x \leqq t2$, where a thickness of the first conductor is $t1$, a thickness of the second conductor is $t2$, and a particle diameter of the second conductor is $x$.

4. The electronic component according to claim 1, wherein an entire surface of the second conductor is flat.

5. The electronic component according to claim 1, further comprising an insulating film which is formed on the second conductor.

6. The electronic component according to claim 5, wherein an opening is formed in a part of the insulating film on the second conductor in which a surface of the second conductor is exposed.

7. The electronic component according to claim 6, further comprising a third conductor which is formed in the opening and is thicker than the second conductor.

8. The electronic component according to claim 7, wherein the third conductor is extended over the insulating film.

9. The electronic component according to claim 8, wherein the first conductor and the third conductor are formed in different layers.

10. The electronic component according to claim 5, wherein a surface of the insulating film is flat.

11. The electronic component according to claim 5, wherein the insulating film is formed on almost throughout a surface of the substrate.

12. The electronic component according to claim 11, further comprising:
    a fourth conductor which is formed in a same layer as the first conductor; and
    a fifth conductor which is faced to the fourth conductor through the insulating film.

13. The electronic component according to claim 5, wherein a film thickness of the dielectric film is thinner than a film thickness of the insulating film.

14. The electronic component according to claim 5, wherein a dielectric constant of the dielectric film is higher or equal to a dielectric constant of the insulating film.

15. An electronic component comprising:
    a first conductor which is formed on a substrate;
    a dielectric film which is formed on the first conductor;
    a second conductor which is formed on the dielectric film and thinner than the first conductor; and
    an inductor element having a coil conductor formed in one piece with the first conductor and formed in a same layer as the first conductor, wherein
    a capacitative element is configured of the first conductor, the second conductor and the dielectric film,
    the dielectric film is formed only on the first conductor, and
    an end part of the coil conductor functions as the first conductor and the inductor element configures one of a resonant circuit and a filter circuit with the capacitative element.

16. A method of fabricating the electronic component of claim 1, comprising the steps of:
    forming the first conductor on the substrate;
    forming the dielectric film on the first conductor;
    forming the second conductor which is thinner than the first conductor on the dielectric film, wherein the capacitative element is configured of the first conductor, the second conductor and the dielectric film;
    forming an insulating film on the second conductor;
    forming an opening in the insulating film in which a surface of the second conductor is exposed; and
    forming a third conductor which is thicker than the second conductor in the opening.

* * * * *